United States Patent
Ujihara et al.

(10) Patent No.: US 12,365,823 B2
(45) Date of Patent: Jul. 22, 2025

(54) ALN CRYSTAL PREPARATION METHOD, ALN CRYSTALS, AND ORGANIC COMPOUND INCLUDING ALN CRYSTALS

(71) Applicant: NATIONAL UNIVERSITY CORPORATION NAGOYA UNIVERSITY, Nagoya (JP)

(72) Inventors: Toru Ujihara, Nagoya (JP); Yukihisa Takeuchi, Nagoya (JP); Mingyu Chen, Nagoya (JP); Masashi Nagaya, Nagoya (JP)

(73) Assignee: NATIONAL UNIVERSITY CORPORATION NAGOYA UNIVERSITY, Nagoya (JP)

( * ) Notice: Subject to any disclaimer, the term of this patent is extended or adjusted under 35 U.S.C. 154(b) by 658 days.

(21) Appl. No.: 16/886,153

(22) Filed: May 28, 2020

(65) Prior Publication Data

US 2021/0009885 A1    Jan. 14, 2021

Related U.S. Application Data

(62) Division of application No. 15/314,789, filed as application No. PCT/JP2015/064605 on May 21, 2015, now abandoned.

(30) Foreign Application Priority Data

| | | |
|---|---|---|
| May 30, 2014 | (JP) | 2014-112691 |
| Sep. 5, 2014 | (JP) | 2014-181289 |

(51) Int. Cl.
C09K 5/14 (2006.01)
C01B 21/072 (2006.01)
(Continued)

(52) U.S. Cl.
CPC .............. C09K 5/14 (2013.01); C01B 21/072 (2013.01); C01B 21/0722 (2013.01);
(Continued)

(58) Field of Classification Search
None
See application file for complete search history.

(56) References Cited

U.S. PATENT DOCUMENTS

2008/0008642 A1* 1/2008 Mori .................. C30B 9/00
117/6

FOREIGN PATENT DOCUMENTS

| | | |
|---|---|---|
| EP | 0749940 A1 | 12/1996 |
| EP | 0691943 B1 | 12/1997 |

(Continued)

OTHER PUBLICATIONS

Duh et al.; High-Temperature MgO—C—Al Refractories-Metal Reactions in High-Aluminum-Content Alloy Steels; J. Mater. Res., vol. 18, No. 8, Aug. 2003.*

(Continued)

*Primary Examiner* — Guinever S Gregorio
(74) *Attorney, Agent, or Firm* — KARCESKI IP LAW, PLLC

(57) ABSTRACT

A method for producing AlN crystals includes using at least one element, excluding Si, that satisfies a condition under which the element forms a compound with neither Al nor N or a condition under which the element forms a compound with any of Al and N provided that the standard free energy of formation of the compound is larger than that of AlN; melting a composition containing at least Al and the element; and reacting the Al vapor with nitrogen gas at a predetermined reaction temperature to produce AlN crystals.

16 Claims, 63 Drawing Sheets

Presence or absence of compound formation between Al and X and presence or absence of compound formation between N and X

| Element X | Temperature K | Presence or absence of compound formation with Al (Standard free energy of formation of formed compound kJ/mol) | Presence or absence of compound formation with N (Standard free energy of formation of formed compound kJ/mol) |
|---|---|---|---|
| Co | 1700 | Formed(-81,305) | Not formed |
| Cr | 1700 | Not formed | Formed(-5,174) |
| Cu | 1700 | Not formed | Not formed |
| Fe | 1700 | Not formed | Not formed |
| Ga | 1700 | Not formed | Not formed |
| Ge | 1700 | Not formed | Not formed |
| Li | 1700 | Not formed | Not formed |
| Mg | 1700 | Not formed | Formed(-7,552) |
| Mn | 1700 | Not formed | Not formed |
| Si | 1700 | Not formed | Formed(-182,365) |
| Sn | 1700 | Not formed | Not formed |
| Sr | 1700 | Not formed | Not formed |
| V | 1700 | Formed | Formed(-75,091) |
| Ti | 1700 | Formed(-53,401) | Formed(-177,347) |
| Ni | 1700 | Formed(-91,478) | Not formed |
| Ai | 1700 | | Formed(-129,591) |

(51) Int. Cl.
  *C30B 25/00*   (2006.01)
  *C30B 29/38*   (2006.01)
  *C30B 29/62*   (2006.01)

(52) U.S. Cl.
  CPC ............ *C30B 25/005* (2013.01); *C30B 29/38* (2013.01); *C30B 29/62* (2013.01); *C01P 2002/72* (2013.01); *C01P 2004/01* (2013.01); *C01P 2004/03* (2013.01); *C01P 2004/04* (2013.01); *C01P 2004/16* (2013.01); *C01P 2006/32* (2013.01)

(56) References Cited

FOREIGN PATENT DOCUMENTS

| | | |
|---|---|---|
| JP | S62283900 A | 12/1987 |
| JP | H04321505 A | 11/1992 |
| JP | H06321511 A | 11/1994 |
| JP | H07144920 A | 6/1995 |
| JP | H07277897 A | 10/1995 |
| JP | H08508460 A | 9/1996 |
| JP | H09118598 A | 5/1997 |
| JP | 2003119099 A | 4/2003 |
| JP | 2008115068 A | 5/2008 |
| JP | 2014073951 A | 4/2014 |

OTHER PUBLICATIONS

Greil et al.; Nitridation Reactions of Molten Al-(Mg, Si) alloys; Journal of Materials Science; 26, 669-677; 1991.*
Google TRanslation JPS62283900A; Oct. 2024.*
European Office Action dated Jun. 7, 2018, for European Patent Application No. 15800171.9.
European Office Action dated May 27, 2019, for European Patent Application No. 15800171.9.
Extended European Search Report dated Sep. 28, 2017, for European Patent Application No. 15800171.9.
Haber et al., Morphologically Selective Synthesis of Nanocrystalline Aluminum Nitride, Chem. Mater., 10, 4062-4071, 1998.
International Search Report dated Aug. 18, 2015, for International Patent Application No. PCT/JP2015/064605.
Kim et al., Aluminum Nitride Whisker Formation during Combustion Synthesis; J. Am. Ceram. Soc., 83, g, 1117-1121, 2000.
Yamada et al., "Effective Thermal Conductivity of Dispersed Materials," Warme und Stoffubertragung 13, 1980, pp. 27-37.
Zhongqi SHI, et al., "Combustion systhesis of AlN nanowhiskers with different metallic catalysts," Materials Letters, vol. 128 (Apr. 30, 2014), pp. 156-159.

* cited by examiner

| Element X | Temperature K | Presence or absence of compound formation with Al (Standard free energy of formation of formed compound kJ/mol) | Presence or absence of compound formation with N (Standard free energy of formation of formed compound kJ/mol) |
|---|---|---|---|
| Co | 1700 | Formed(-81.906) | Not formed |
| Cr | 1700 | Not formed | Formed(-5.174) |
| Cu | 1700 | Not formed | Not formed |
| Fe | 1700 | Not formed | Not formed |
| Ga | 1700 | Not formed | Not formed |
| Ge | 1700 | Not formed | Not formed |
| Li | 1700 | Not formed | Not formed |
| Mg | 1700 | Not formed | Formed(-7.552) |
| Mn | 1700 | Not formed | Not formed |
| Si | 1700 | Not formed | Formed(-182.865) |
| Sn | 1700 | Not formed | Not formed |
| Sr | 1700 | Formed | Not formed |
| V | 1700 | Formed(-53.401) | Formed(-75.091) |
| Ti | 1700 | Formed(-91.478) | Formed(-177.847) |
| Ni | 1700 | | Not formed |
| Al | 1700 | | Formed(-129.591) |

FIG. 4

| Element X | Temperature K | Presence or absence of compound formation with Al (Standard free energy of formation of formed compound kJ/mol) | Presence or absence of compound formation with N (Standard free energy of formation of formed compound kJ/mol) |
|---|---|---|---|
| Co | 1800 | Formed(-78.293) | Not formed |
| Cr | 1800 | Not formed | Not formed |
| Cu | 1800 | Not formed | Not formed |
| Fe | 1800 | Not formed | Not formed |
| Ga | 1800 | Not formed | Not formed |
| Ge | 1800 | Not formed | Not formed |
| Li | 1800 | Not formed | Not formed |
| Mg | 1800 | Not formed | Not formed |
| Mn | 1800 | Not formed | Not formed |
| Si | 1800 | Not formed | Formed(-141.839) |
| Sn | 1800 | Not formed | Not formed |
| Sr | 1800 | Not formed | Not formed |
| V | 1800 | Formed | Formed(-67.192) |
| Ti | 1800 | Not formed | Formed(-168.605) |
| Ni | 1800 | Formed(-88.623) | Not formed |
| Al | 1800 | | Formed(-117.869) |

FIG. 5

| Element X | Temperature K | Presence or absence of compound formation with Al (Standard free energy of formation of formed compound kJ/mol) | Presence or absence of compound formation with N (Standard free energy of formation of formed compound kJ/mol) |
|---|---|---|---|
| Co | 1900 | Formed(−73.999) | Not formed |
| Cr | 1900 | Not formed | Not formed |
| Cu | 1900 | Not formed | Not formed |
| Fe | 1900 | Not formed | Not formed |
| Ga | 1900 | Not formed | Not formed |
| Ge | 1900 | Not formed | Not formed |
| Li | 1900 | Not formed | Not formed |
| Mg | 1900 | Not formed | Not formed |
| Mn | 1900 | Not formed | Not formed |
| Si | 1900 | Not formed | Formed(−100.986) |
| Sn | 1900 | Not formed | Not formed |
| Sr | 1900 | Not formed | Not formed |
| V | 1900 | Formed | Formed(−59.312) |
| Ti | 1900 | Not formed | Formed(−153.388) |
| Ni | 1900 | Formed(−85.601) | Not formed |
| Al | 1900 | | Formed(−106.151) |

FIG. 6

Presence or absence of compound formation between Al and X and presence or absence of compound formation between N and X

| Element X | Temperature K | Presence or absence of compound formation with Al (Standard free energy of formation of formed compound kJ/mol) | Presence or absence of compound formation with N (Standard free energy of formation of formed compound kJ/mol) |
|---|---|---|---|
| Co | 2000 | Not formed | Not formed |
| Cr | 2000 | Not formed | Not formed |
| Cu | 2000 | Not formed | Not formed |
| Fe | 2000 | Not formed | Not formed |
| Ga | 2000 | Not formed | Not formed |
| Ge | 2000 | Not formed | Not formed |
| Li | 2000 | Not formed | Not formed |
| Mg | 2000 | Not formed | Not formed |
| Mn | 2000 | Not formed | Not formed |
| Si | 2000 | Not formed | Formed(−60.299) |
| Sn | 2000 | Not formed | Not formed |
| Sr | 2000 | Not formed | Not formed |
| V | 2000 | Not formed | Formed(−51.444) |
| Ti | 2000 | Not formed | Formed(−149.747) |
| Ni | 2000 | Not formed | Not formed |
| Al | 2000 | | Formed(−94.436) |

FIG. 7

Steps for producing Al–Fe alloy

Start

Step 1
In order to achieve a desired molar ratio, the respective weights of the metals are measured, and a crucible is charged with these elements.

Step 2
The crucible is loaded in a high-frequency heating furnace, and the inside of the high-frequency heating furnace is vacuumed.

Step 3
Ar gas is introduced to the inside of the high-frequency heating furnace.

Step 4
The high-frequency heating furnace is heated to a temperature of approximately 1700 °C over approximately 0.5 to 2 hours, kept at the temperature of approximately 1700 °C for approximately 0.5 to 2 hours, and then cooled to room temperature.

Step 5
The Al–Fe alloy is taken out of the high-frequency heating furnace, and oxide on a surface is removed.

Step 6
The Al–Fe alloy thus free from the oxide is cut into a desired thickness.

Finish

| Element | Mass concentration [%] | Atomic concentration [%] |
|---|---|---|
| C | 4.79 | 7.96 |
| N | 43.23 | 61.60 |
| O | 1.51 | 1.88 |
| Al | 36.70 | 27.15 |
| Pt | 13.78 | 1.41 |
| Total | 100.00 | 100.00 |

| Element | Mass concentration [%] | Atomic concentration [%] |
|---|---|---|
| C | 4.91 | 8.17 |
| N | 43.31 | 61.73 |
| O | 1.21 | 1.51 |
| Al | 36.72 | 27.17 |
| Pt | 13.84 | 1.42 |
| Total | 100.00 | 100.00 |

Al(60at%)-Fe(40at%)、1450℃、2h

Al(60at%)-Fe(40at%)、1450℃、2h

ALN CRYSTAL PREPARATION METHOD, ALN CRYSTALS, AND ORGANIC COMPOUND INCLUDING ALN CRYSTALS

CROSS-REFERENCE TO RELATED APPLICATION(S)

This is a divisional patent application of U.S. patent application Ser. No. 15/314,789, filed on Nov. 29, 2016. U.S. patent application Ser. No. 15/314,789 is a National Stage Entry into the United States Patent and Trademark Office from International PCT Patent Application No. PCT/JP2015/064605, having an international filing date of May 21, 2015, which claims priority to both Japanese Patent Application No. 2014-112691, filed May 30, 2014, and Japanese Patent Application No. 2014-181289, filed Sep. 5, 2014, the entire contents of all of which are incorporated herein by reference.

FIELD OF THE INVENTION

The present invention relates to a method for producing AlN crystals, AlN crystals and an organic compound comprising AlN crystals.

DESCRIPTION OF RELATED ART

AlN whiskers (needle- or rod-shaped single crystals), which are one type of AlN (aluminum nitride) crystal, have the properties of being excellent in thermal conductivity and insulation. As for a method for producing the AlN whiskers, Japanese Patent Application Publication No. 62-283900 ("the '900 Publication") discloses a method which involves mixing a fine alumina powder with a solution of a transition metal compound, then evaporatively removing the solvent by heat treatment, homogeneously mixing carbon black with the heat-treated fine alumina powder to prepare a mixture, and reacting the prepared mixture with nitrogen gas at a predetermined reaction temperature. Also, Japanese Patent Application Publication No. 2014-73951 ("the '951 Publication") discloses a method which involves using an alloy having Al—Si—Ti composition, melting the alloy, and reacting the Al vapor with nitrogen gas at a predetermined reaction temperature.

SUMMARY OF THE INVENTION

A problem of the method of the '900 Publication is a poor yield (production efficiency) of AlN whiskers because particulate AlN is produced in addition to the AlN whiskers. The method of the '951 Publication can promote the growth of AlN whiskers and suppress the production of particulate AlN. However, an element that constitutes the composition with Al is limited to Si and Ti. Therefore, a problem of this method is a restricted condition for producing AN whiskers.

The present invention has been made in light of these situations, and an object of the present invention is to provide a method for producing AlN crystals which can produce the AlN crystals by using an element other than Si and Ti while suppressing the production of particulate AlN, AlN crystals and an organic compound comprising AlN crystals.

The method for producing AlN crystals comprises: using at least one element, excluding Si, that satisfies a condition under which the element forms a compound with neither Al nor N or a condition under which the element forms a compound with any of Al and N provided that the standard free energy of formation of the compound is larger than that of AlN; melting a composition containing at least Al and the element; and reacting the Al vapor with nitrogen gas at a predetermined reaction temperature to produce AlN crystals.

The method for producing AlN crystals comprises using, as the element, an element that satisfies a condition under which the interaction energy with Al becomes negative and also satisfies a condition under which the absolute value of this interaction energy is larger than the interaction energy between Al and Ge.

According to the method for producing AlN crystals, at least one element, excluding Si, that satisfies a condition under which the element forms a compound with neither Al nor N or a condition under which the element forms a compound with any of Al and N provided that the standard free energy of formation of the compound is larger than that of AlN is used as an element that constitutes the alloy with Al. Furthermore, a composition containing at least Al and the element is melted, and the Al vapor is reacted with nitrogen gas at a predetermined reaction temperature to produce AlN crystals.

Use of at least one element that satisfies a condition under which the element forms a compound with neither Al nor N or a condition under which the element forms a compound with any of Al and N provided that the standard free energy of formation of the compound is larger than that of AlN can promote the growth of the AlN crystals while suppressing the production of particulate AlN, because neither a compound of Al and the element nor a compound of N and the element is formed or because the standard free energy of formation of such a compound, even if formed, is larger than that of AlN (the compound is thermodynamically more unstable than AlN). As a result, the element that constitutes the composition with Al for the AlN crystal production is not limited to Si and Ti, and the AlN crystals can be produced using an element other than Si and Ti.

The AlN crystals are allowed to grow from a solution according to a solution method by melting the composition containing at least Al and the element. Therefore, the grown AlN crystals can achieve high thermal conductivity and high insulation without containing fine particles. In the case of allowing AlN whiskers to grow as the AlN crystals, for example, the method disclosed in Japanese Patent Application Publication No. 6-321511 or Japanese Patent Application Publication No. 7-144920 involves forming fine particles by heat-melting the alloy with arc current so that the shape of the fine particles becomes a needle or rod shape to produce the AlN whiskers. This method, however, cannot avoid the inclusion (coexistence) of fine particles that have not assumed a needle or rod shape. As a result, the fine particles are contained in the AlN whiskers. By contrast, the method, as in the present invention, which involves allowing the AlN crystals to grow from a solution according to a solution method, can allow the AlN crystals to grow without containing such fine particles.

The method for producing AlN crystals employs, as the element, an element that satisfies a condition under which the interaction energy with Al becomes negative and also satisfies a condition under which the absolute value of this interaction energy is larger than the interaction energy between Al and Ge. The element satisfying the condition under which the interaction energy with Al becomes negative has a propensity to be easily adsorbed onto Al on the AlN surface. When the AlN crystals are AlN whiskers, the AlN whisker grown in the <0001> direction has two end faces, one of which is covered with N (N-face) and the other of which is covered with Al (Al-face). It is generally known about the growth of AlN by a sublimation method that the stable growth of the AlN crystal is promoted at the N-face, whereas the growth of the AlN crystal is inhibited at the Al-face, for example, due to the formation of facets such as (10-11). In short, when the AlN crystals are AlN whiskers, the growth of the AlN whisker at the Al-face is inhibited when the element satisfying the condition under which the interaction energy with Al becomes negative is adsorbed on the Al-face of the AlN whisker. As a result, the growth of the AlN whisker at the N-face, which permits stable growth, can be promoted so that the AlN whisker grows stably toward the direction of the N-face to produce AlN whiskers having flat surface (surface with very few irregularities) in the axial direction (growth direction).

BRIEF DESCRIPTION OF THE DRAWINGS

FIG. 4 is a diagram showing the presence or absence of compound formation with Al and the presence or absence of compound formation with N (part 1).

FIG. 5 is a diagram showing the presence or absence of compound formation with Al and the presence or absence of compound formation with N (part 2).

FIG. 6 is a diagram showing the presence or absence of compound formation with Al and the presence or absence of compound formation with N (part 3).

FIG. 7 is a diagram showing the presence or absence of compound formation with Al and the presence or absence of compound formation with N (part 4).

FIG. 9 is a diagram showing steps for producing an Al—Fe alloy.

DETAILED DESCRIPTION OF EMBODIMENT(S) OF THE INVENTION

Figure 1:
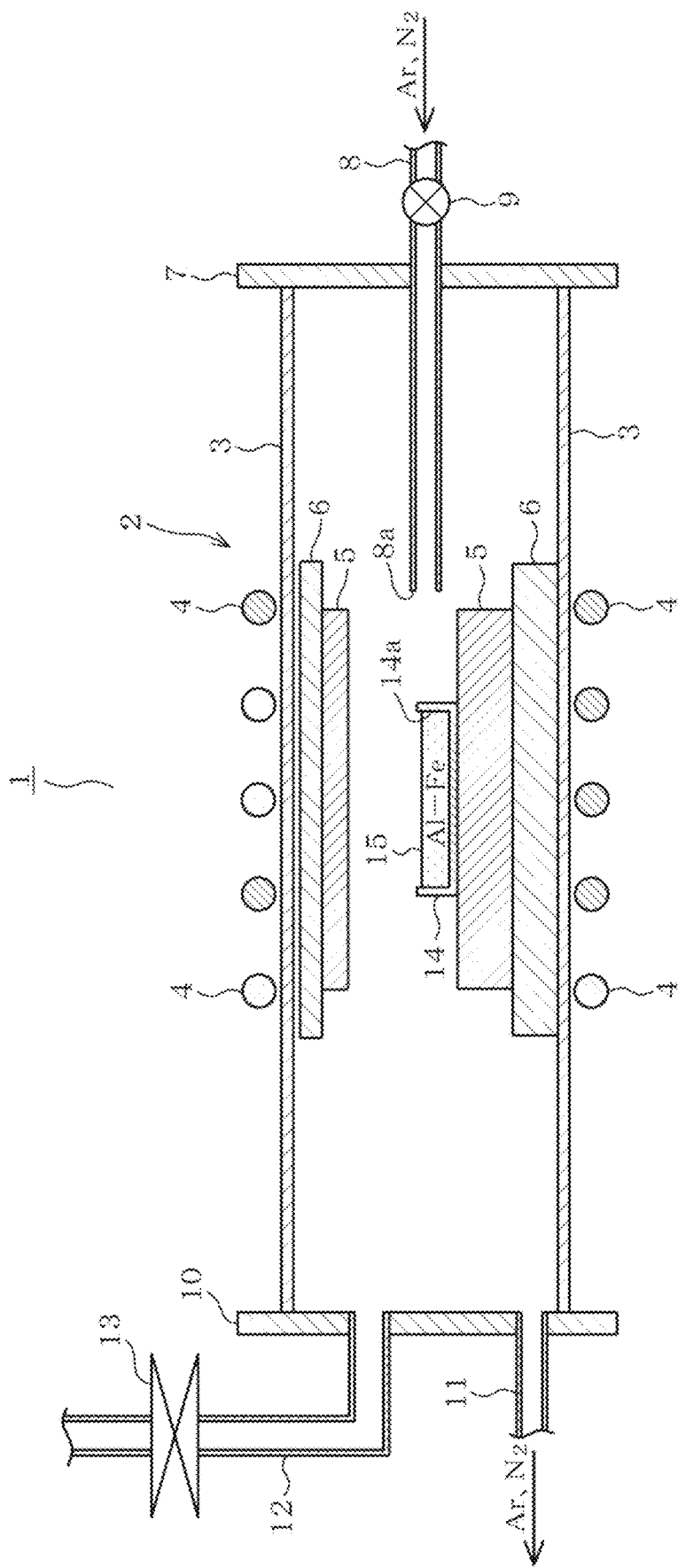
FIG. 1 shows one embodiment of the present invention and is a diagram showing an AlN whisker production apparatus (part 1).

Hereinafter, a method for producing AlN whiskers, which is one type of AlN crystal, through growth by a solution method according to one embodiment of the present invention will be described with reference to the drawings. The AlN whiskers are single crystals grown outward from the crystal surface in a needle or rod shape and are also called AlN whisker fibers, AlN fibers or AlN fillers. As shown in FIG. 1, an AlN whisker production apparatus 1 is a horizontal high-frequency heating furnace 2 and has a cylindrical quartz tube (core tube) 3 and a high-frequency coil (induction coil) 4 for heating which is disposed around the quartz tube 3. A carbon heater 5 and an insulator 6 which separates the quartz tube 3 from the carbon heater 5 are disposed in the inside of the quartz tube 3. Alternatively, a SiC heater, a molybdenum disilicide heater, a tungsten heater or the like may be used instead of the carbon heater 5.

A lid member 7 is attached on one end side of the quartz tube 3 (on the right side in FIG. 1). The lid member 7 is connected with a pipe 8 for introducing argon (Ar) gas or nitrogen ($N_2$) gas to the inside of the quartz tube 3. A regulating valve 9 is provided at some midpoint of the pipe 8. The flow rate of argon gas or nitrogen gas to be introduced to the inside of the quartz tube 3 is adjusted by adjusting the degree of opening of the regulating valve 9. A tip 8a of the pipe 8 is connected near a site where an alumina board 14 mentioned later is disposed.

A lid member 10 is attached on the other end side of the quartz tube 3 (on the left side in FIG. 1). The lid member 10 is connected with a pipe 11 for discharging argon gas or nitrogen gas from the inside of the quartz tube 3 and also connected with a pipe 12 for vacuuming the inside of the quartz tube 3. A pump (rotary pump, diffusion pump or turbo pump) (not shown) for vacuuming is provided on the tip side of the pipe 12, while a regulating valve 13 is provided in at some midpoint thereof. The inside of the quartz tube 3 is vacuumed by driving the pump and thereby adjusting the degree of opening of the regulating valve 13.

Figure 2:
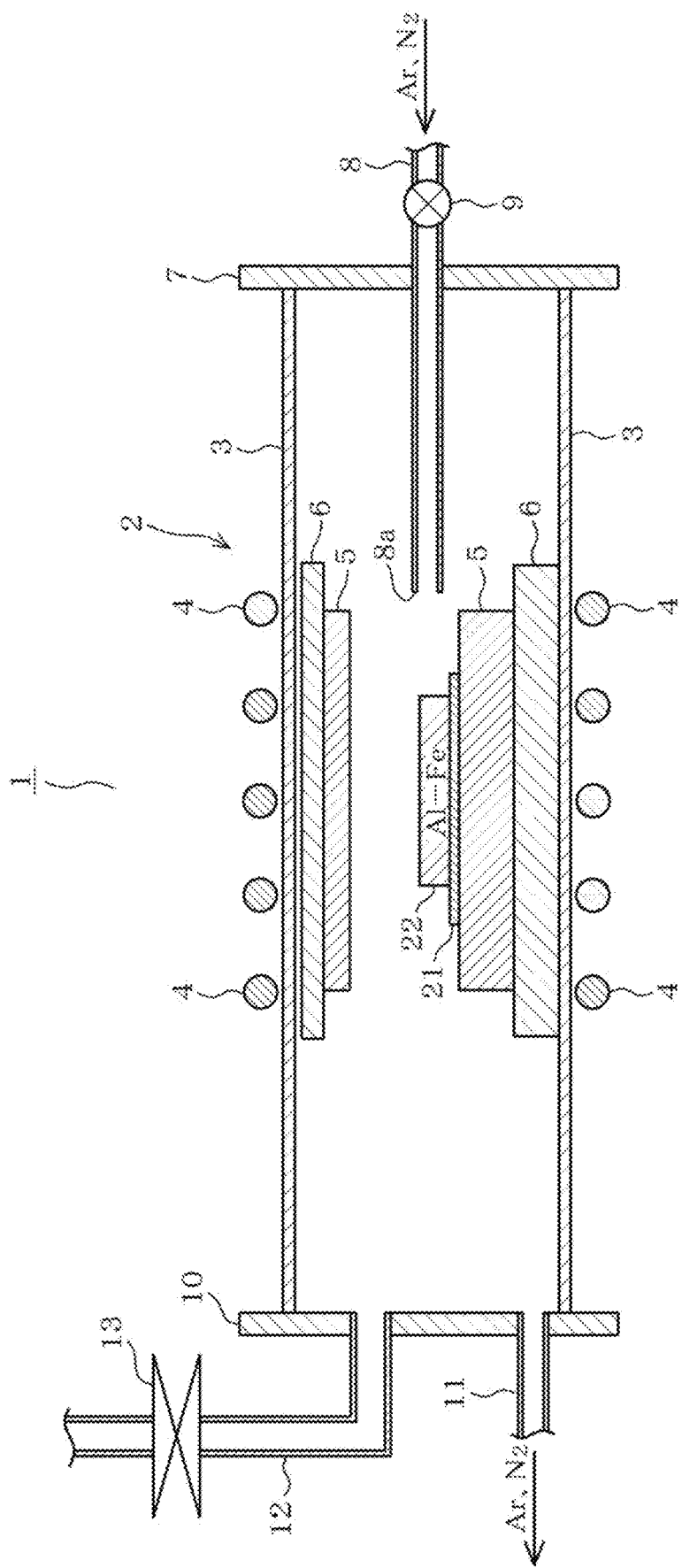
FIG. 2 is a diagram showing an AlN whisker production apparatus (part 2).

An alumina board (alumina container) 14 can be disposed on the carbon heater 5. The alumina board 14 is provided with a recess 14a, and the recess 14a is charged with a solvent 15. The solvent 15 is a liquid in which powders of Al and an element that satisfies conditions mentioned later are dissolved. These components do not have to be in a powder state. FIG. 1 illustrates a liquid containing Al and Fe powders dissolved therein. FIG. 1 illustrates the case where the alumina board 14 is disposed and the recess 14a of the alumina board 14 is charged with the solvent 15. As shown in FIG. 2, an alloy 22 may be disposed on an alumina plate 21. The alloy 22 is a composition comprising Al and an element that satisfies conditions mentioned later. FIG. 2 illustrates an alloy having Al—Fe composition.

Figure 3:
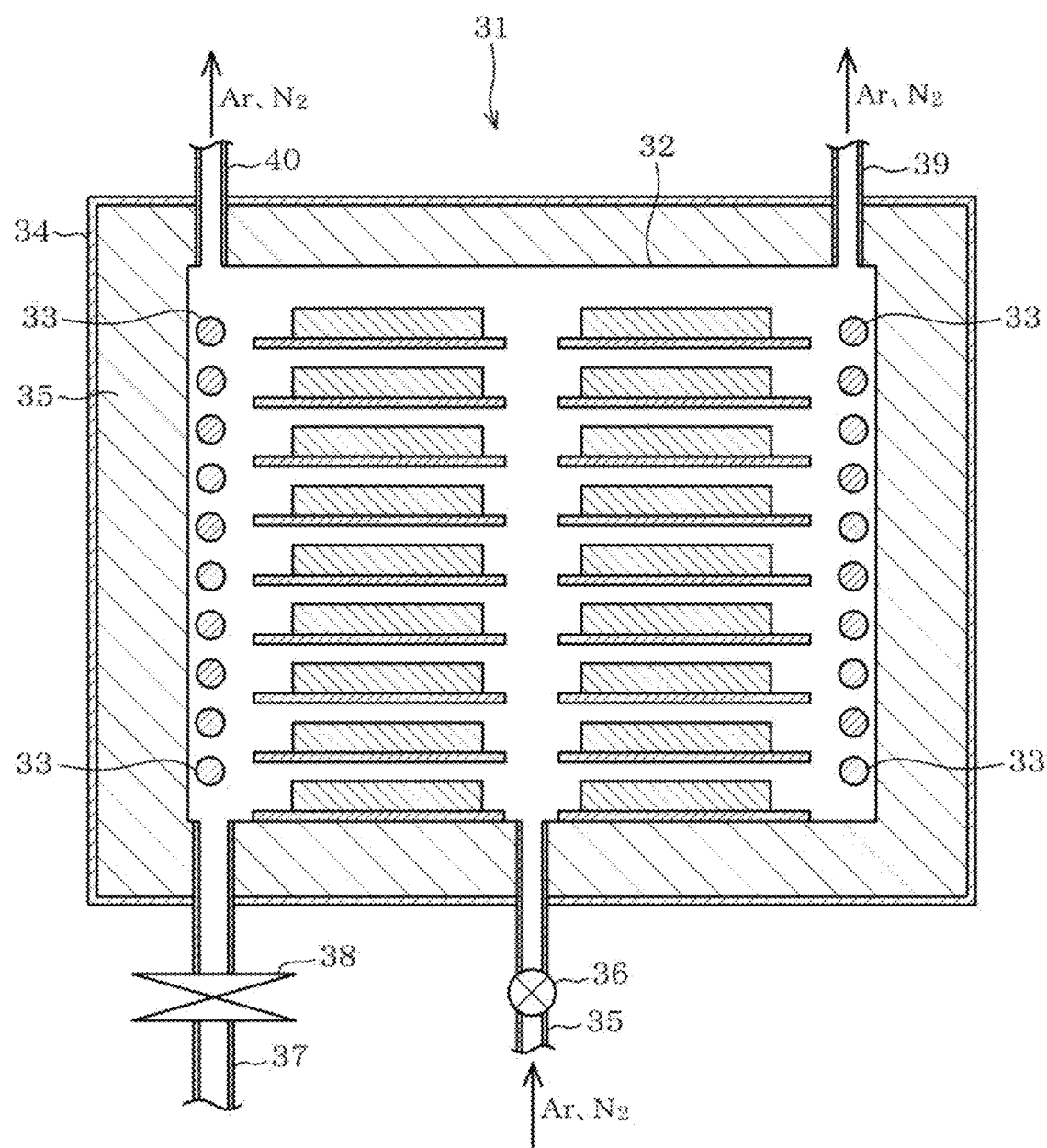
FIG. 3 is a diagram showing an AlN whisker production apparatus (part 3).

Alternatively, a configuration as shown in FIG. 3 may be used in consideration of mass productivity. In FIG. 3, an AlN whisker production apparatus 31 is a box high-frequency heating furnace 32. A heater 33 is disposed in the inside of the high-frequency heating furnace 32. Also, an insulator (heat-resistant brick, carbon wool, etc.) 35 is disposed between the high-frequency heating furnace 32 and a furnace wall 34. A pipe 35 for introducing argon gas or nitrogen gas to the inside of the high-frequency heating furnace 32 is connected on one end side of the high-frequency heating furnace 32 (on the lower side in FIG. 3). A regulating valve 36 is provided at some midpoint of the pipe 35. The flow rate of argon gas or nitrogen gas to be introduced to the inside of the high-frequency heating furnace 32 is adjusted by adjusting the degree of opening of the regulating valve 36. Also, a pipe 37 for vacuuming the inside of the high-frequency heating furnace 32 is connected on one end side of the high-frequency heating furnace 32. A pump (not shown) for vacuuming is provided on the tip side of the pipe 37, while a regulating valve 38 is provided at some midpoint thereof. The inside of the high-frequency heating furnace 32 is vacuumed by driving the pump and thereby adjusting the degree of opening of the regulating valve 38. Pipes 39 and 40 for discharging argon gas or nitrogen gas from the inside of the high-frequency heating furnace 32 are connected on the other end side 32*b* of the high-frequency heating furnace 32 (on the upper side in FIG. 3). In this case, it is preferred that the internal temperature of the high-frequency heating furnace 32 should be uniformly controlled, while the argon gas or the nitrogen gas to be introduced to the inside of the high-frequency heating furnace 32 should be uniformly controlled.

In the present embodiment, it is desirable that the element for use in the solvent 15 or the alloy 22, i.e., the element that constitutes the composition with Al, should satisfy a condition (i) from the viewpoint of producing the AlN whiskers:

(i) the element forms a compound with neither Al nor nitrogen gas, or the element forms a compound with any of Al and nitrogen gas provided that the standard free energy of formation of the compound is larger than that of AlN. The standard free energy of formation is an energy that works when a substance (compound) is formed from a simple substance.

Specifically, the inventors examined whether or not some elements would each form a compound with Al (the presence or absence of compound formation) and would each form a compound with N, and calculated the standard free energy of formation of the compound thus formed. FIG. 4 shows results obtained at 1700 K. The standard free energy of formation of AlN at 1700 K is "−129.591 KJ/mol", and Li, Mg, V, Cr, Mn, Fe, Co, Ni, Cu, Ga, Ge, Sr and Sn were determined as the element satisfying the condition (i). FIG. 5 shows results obtained at 1800 K. The standard free energy of formation of AlN at 1800 K is "−117.869 KJ/mol", and Li, Mg, V, Cr, Mn, Fe, Co, Ni, Cu, Ga, Ge, Sr and Sn were determined as the element satisfying the condition (i). FIG. 6 shows results obtained at 1900 K. The standard free energy of formation of AlN at 1900 K is "−106.151 KJ/mol", and Li, Mg, Si, V, Cr, Mn, Fe, Co, Ni, Cu, Ga, Ge, Sr and Sn were determined as the element satisfying the condition (i). FIG. 7 shows results obtained at 2000 K. The standard free energy of formation of AlN at 2000 K is "−94.436 KJ/mol", and Li, Mg, Si, V, Cr, Mn, Fe, Co, Ni, Cu, Ga, Ge, Sr and Sn were determined as the element satisfying the condition (i). Si satisfies the condition (i) at 1900 K and 2000 K, but does not satisfy the condition (i) at 1700 K and 1800 K. Accordingly, Li, Mg, V, Cr, Mn, Fe, Co, Ni, Cu, Ga, Ge, Sr and Sn were determined as the element satisfying the condition (i) at a reaction temperature for AlN (1450 to 1800° C.).

In addition, it is desirable that the element should satisfy both of the conditions (i) and (ii) from the viewpoint of suppressing the surface irregularities of the AlN whiskers:

(ii) the interaction energy with Al is negative, and the absolute value of this interaction energy is larger than the interaction energy between Al and Ge.

The interaction energy is an energy that works for the gravitational interaction between two atoms.

Figure 8:
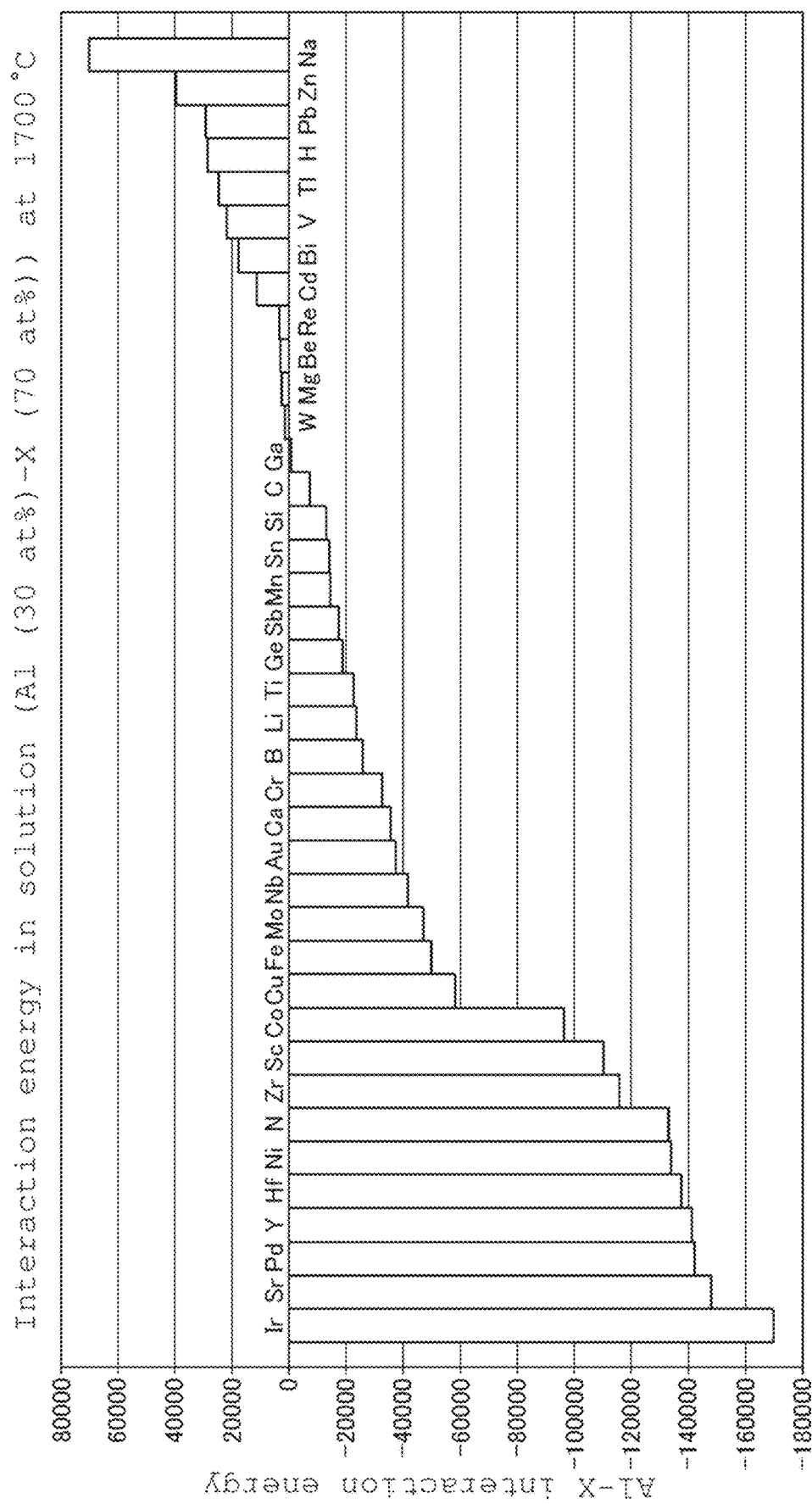
FIG. 8 is a diagram showing Al—X interaction energy.

Specifically, Li, Cr, Fe, Co, Ni, Cu and Sr were determined as the element satisfying both of the conditions (i) and (ii) on the basis of the interaction energy of (Al (30 at %)-X (70 at %)) in a solution at 1700° C. shown in FIG. 8.

Figure 10:
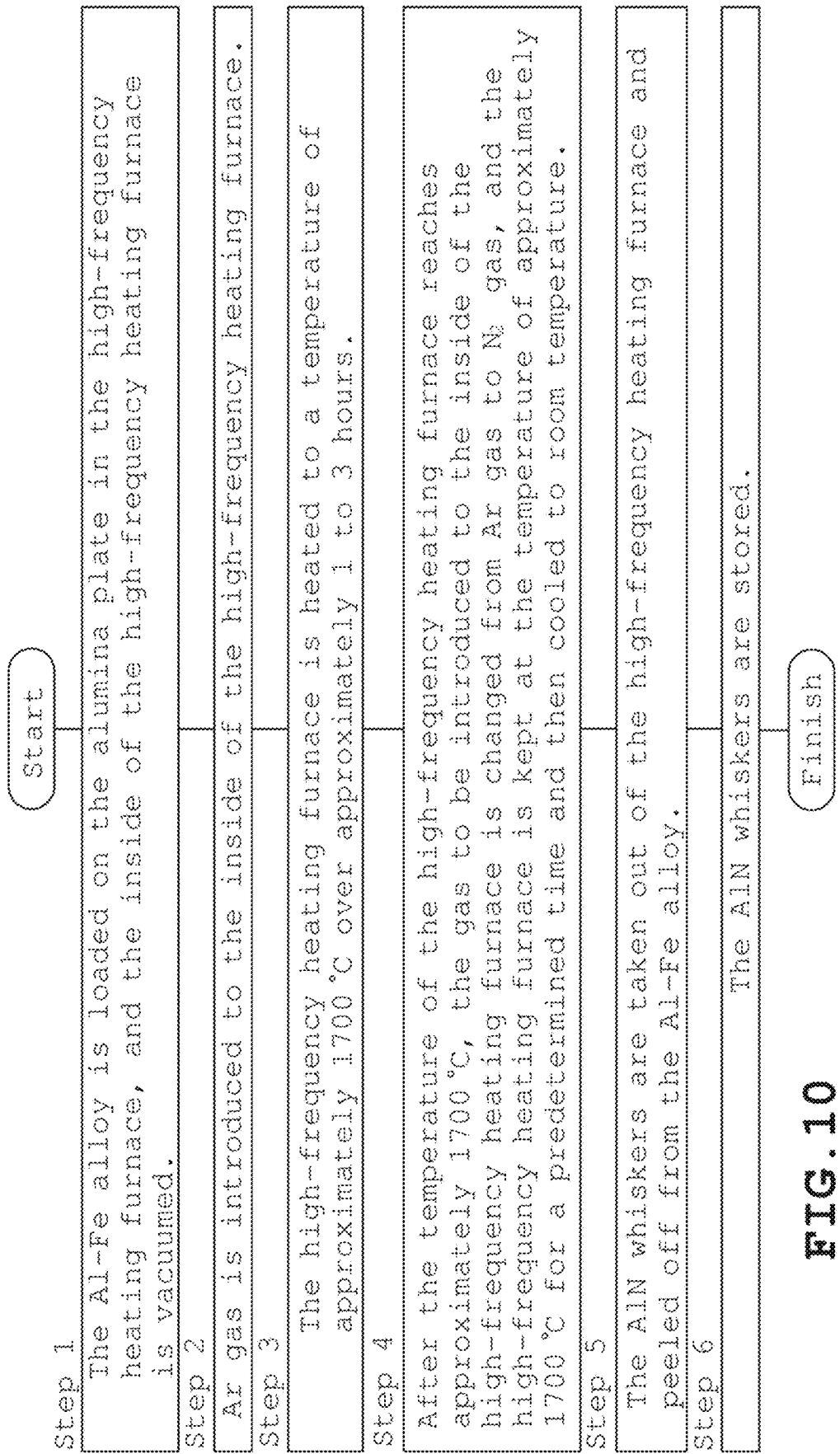
FIG. 10 is a diagram showing steps for producing AlN whiskers.

Next, a method for producing AlN whiskers by using an Al—Fe alloy obtained using Fe, which is an element satisfying both of the conditions (i) and (ii) described above, will be described. Here, (1) steps for producing an Al—Fe alloy (see FIG. 9) and
(2) steps for producing AlN whiskers (see FIG. 10) will be described in order.

(1) Steps for Producing Al—Fe Alloy

Figure 11:
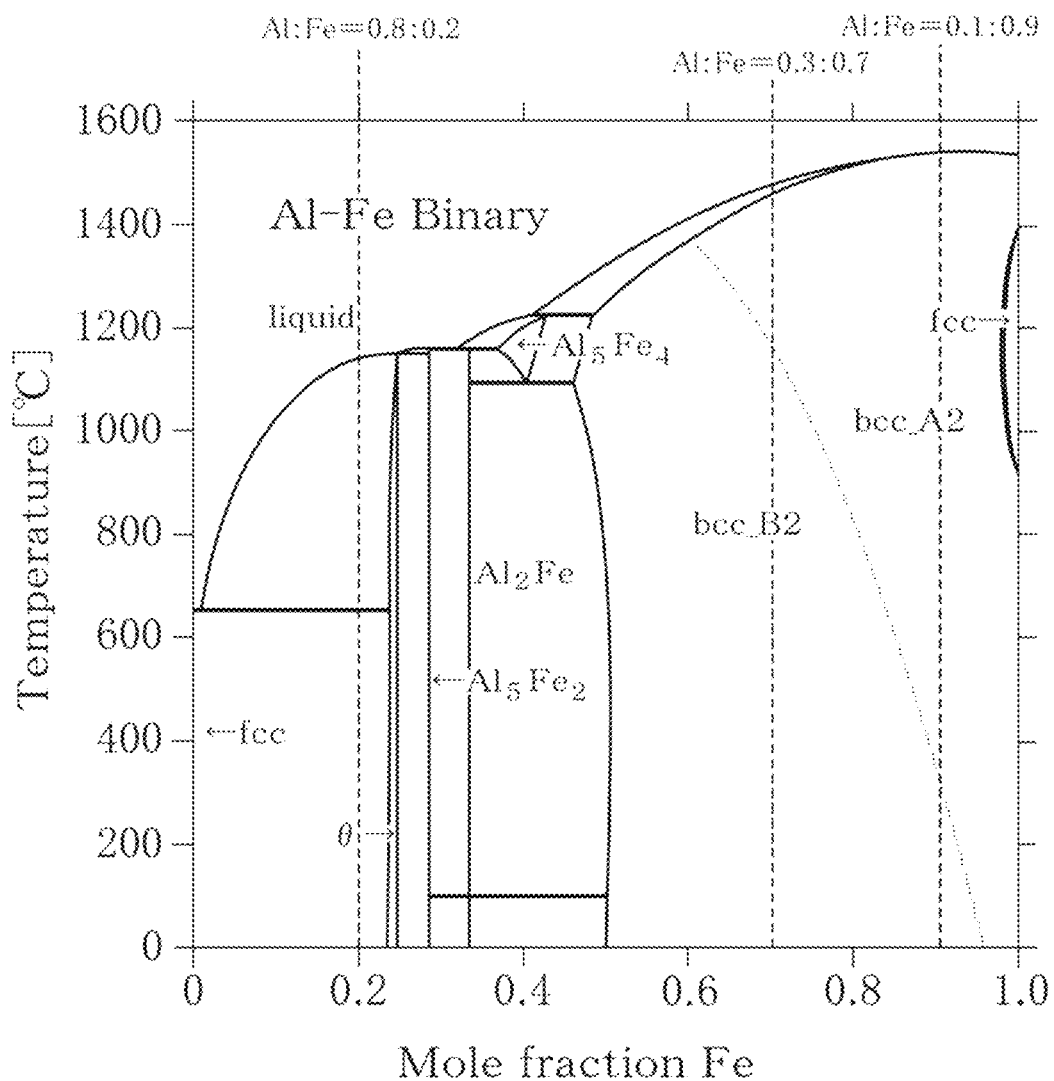
FIG. 11 is a composition diagram of Al—Fe.

Step 1: In order to produce the alloy having a desired molar ratio, the respective weights of the elements (Al and Fe) are measured, and a crucible is charged with these elements. The crucible is a crucible composed mainly of aluminum oxide or a crucible composed mainly of aluminum oxide and magnesium oxide. Alternatively, a crucible composed mainly of carbon may be used. In the present embodiment, in the case of producing, for example, an alloy having Al (30 at %)-Fe (70 at %) composition, the weight of 30 parts by mol of Al (purity: 95% or higher, preferably 99% or higher) particles or plate and the weight of 70 parts by mol of Fe (purity: 95% or higher, preferably 99% or higher) particles or plate are measured, and the crucible is charged with these elements. FIG. 11 shows the Al—Fe composition diagram.

Step 2: The crucible charged with Al and Fe is loaded in a high-frequency heating furnace, and the inside of the high-frequency heating furnace is vacuumed. In this respect, the degree of vacuum is set to 1 mmHg or lower, preferably $1 \times 10^{-1}$ mmHg or lower.

Step 3: After the vacuuming of the inside of the high-frequency heating furnace, argon gas (purity: 95% or higher, preferably 99% or higher) is introduced to the inside of the high-frequency heating furnace so that the internal pressure of the high-frequency heating furnace is adjusted to about atmospheric pressure. In this respect, it is preferred that oxygen in the argon gas should be removed with a titanium getter, or water vapor should be removed by liquefication in a condenser tube cooled with liquid nitrogen.

Step 4: Current is applied to the high-frequency coil to start the heating of the high-frequency heating furnace. The high-frequency heating furnace is heated to a temperature of approximately 1700° C. over approximately 0.5 to 2 hours, kept at the temperature of approximately 1700° C. for approximately 0.5 to 2 hours, and then cooled to room temperature by gradually lowering the current applied to the high-frequency coil.

Step 5: The Al—Fe alloy is taken out of the high-frequency heating furnace. In this respect, oxide is likely to reside on the surface (upper face, side face and lower face) of the Al—Fe alloy thus taken out. Therefore, the surface is polished with sand paper to remove the oxide. Alternatively, the Al—Fe alloy is etched with an acid to remove the oxide.

Step 6: The Al—Fe alloy thus free from the oxide is cut into a desired thickness. In this respect, the thickness is determined according to the diameter and length of the AlN whiskers to be produced. In the case of producing, for example, AlN whiskers having a diameter of approximately 0.1 to 1 μm and a length of approximately 10 to 50 μm, it is desirable that the Al—Fe alloy should have a thickness of approximately 0.1 to 5 mm. In the case of producing, for example, AlN whiskers having a diameter of approximately 0.5 to 1.5 μm and a length of approximately 0.05 to 1 mm, it is desirable that the Al—Fe alloy should have a thickness of approximately 0.3 to 2 mm. In the case of producing, for example, AlN whiskers having a diameter of approximately 1 to 2 μm and a length of approximately 1 mm or larger, it is desirable that the Al—Fe alloy should have a thickness of approximately 0.5 to 5 mm. The cutting method is a cutting method using a diamond cutter, a cutting method using a laser or a cutting method using wire discharge. Since the oxide is likely to reside on the surface of the Al—Fe alloy even after the cutting, it is preferred that the oxide should be removed by polishing with a sand paper or by etching with an acid.

The steps described above are steps for producing an Al—Fe alloy by using a high-frequency heating furnace different from the high-frequency heating furnace 2 of the AlN whisker production apparatus 1 shown in FIG. 1 or 2. The Al—Fe alloy may be produced using the high-frequency heating furnace 2 of the AlN whisker production apparatus 1. In short, the Al—Fe alloy may be produced using the same high-frequency heating furnace as shown in FIG. 1 or 2, and the AlN whiskers can be produced using the produced Al—Fe alloy.

(2) Steps for Producing AlN Whiskers

Step 1: The Al—Fe alloy produced by the aforementioned (1) steps for producing an Al—Fe alloy is loaded on the alumina plate in the high-frequency heating furnace 2, and the inside of the high-frequency heating furnace 2 is vacuumed. In this respect as well, the degree of vacuum is set to 1 mmHg or lower, preferably $1\times10^{-1}$ mmHg or lower.

Step 2: After the vacuuming of the inside of the high-frequency heating furnace 2, argon gas (purity: 95% or higher, preferably 99% or higher) is introduced to the inside of the high-frequency heating furnace 2 so that the internal pressure of the high-frequency heating furnace 2 is adjusted to about atmospheric pressure. In this respect as well, it is preferred that oxygen in the argon gas should be removed with a titanium getter, or water vapor should be removed by liquefication in a condenser tube cooled with liquid nitrogen.

Figure 12:
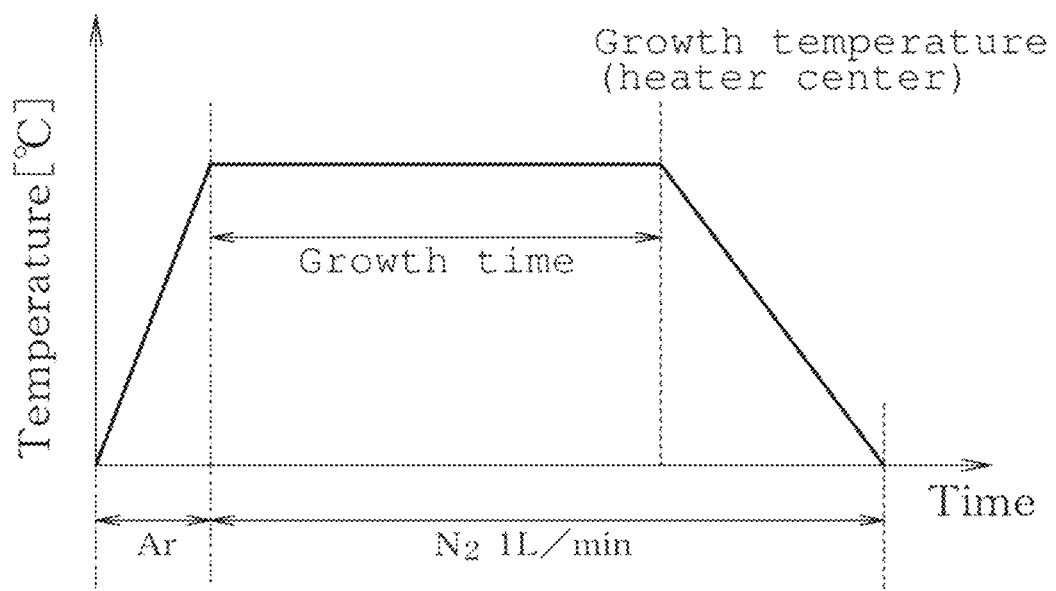
FIG. 12 is a diagram showing a temperature gradient.

Step 3: Current is applied to the high-frequency coil 4 to start the heating of the high-frequency heating furnace 2. The high-frequency heating furnace 2 is heated to a temperature of approximately 1700° C. over approximately 1 to 3 hours. FIG. 12 shows the temperature gradient.

Step 4: After the temperature of the high-frequency heating furnace 2 reaches approximately 1700° C. (growth temperature in FIG. 11), the gas to be introduced to the inside of the high-frequency heating furnace 2 is changed from argon gas to nitrogen gas. Specifically, the nitrogen gas is introduced at a flow rate of, for example, 1 L/min (a nitrogen gas atmosphere is formed) to the inside of the high-frequency heating furnace 2, and the high-frequency heating furnace 2 is kept at the temperature of approximately 1700° C. for a predetermined time (growth time in FIG. 11). The direction in which the nitrogen gas flows is set to a direction parallel to the surface of the Al—Fe alloy. In this context, the term "parallel" means that the nitrogen gas flows from one end side (from the right side in FIG. 1) toward the other end side (toward the left side in FIG. 1) along the surface of the Al—Fe alloy. In the present embodiment, the case where the nitrogen gas flows is illustrated. Alternatively, the nitrogen gas may be sealed in the inside of the high-frequency heating furnace 2. In this case as well, it is preferred to remove oxygen in the nitrogen gas or water vapor. On the surface of the Al—Fe alloy, the Al element (or Al vapor) reacts with the nitrogen gas to produce the core of AlN. Subsequently, on the tip of the core of AlN, the Al element (or Al vapor) reacts with the nitrogen gas so that AlN grows into a whisker form to produce AlN whiskers. Alternatively, the pressure of the nitrogen gas may be several mmHg to atmospheric pressure or higher. At a higher pressure of the nitrogen gas, the growth rate of the AlN whiskers becomes faster. At a lower pressure of the nitrogen gas, the growth rate of the AlN whiskers becomes slower. Also, the pressure of the nitrogen gas may be determined in light of the vapor pressure of Al. The time for which the high-frequency heating furnace 2 is kept at the temperature of approximately 1700° C. is determined according to the diameter and length of the AlN whiskers to be produced. In the case of producing, for example, AlN whiskers having a diameter of approximately 0.1 to 1 μm and a length of approximately 10 to 50 μm, the time is approximately 0.5 to 10 hours. In the case of producing, for example, AlN whiskers having a diameter of approximately 0.5 to 1.5 μm and a length of approximately 50 to 1 mm, the time is several hours to 20 hours. In the case of producing, for example, AlN whiskers having a diameter of approximately 1 to 2 μm and a length of approximately 1 mm or larger, the time is 20 hours or longer. The high-frequency heating furnace 2 thus kept at the temperature of approximately 1700° C. for the predetermined time is cooled to room temperature by gradually lowering the current applied to the high-frequency coil 4.

Step 5: The AlN whiskers are taken out of the high-frequency heating furnace 2. These AlN whiskers are grown so as to cover the whole surface of the Al—Fe alloy. Then, the AlN whiskers are peeled off from the Al—Fe alloy. If the AlN whiskers are difficult to peel off from the Al—Fe alloy, the AlN whiskers can be peeled off by using a sharp knife or the like.

Step 6: The AlN whiskers are stored. The AlN whiskers have a propensity to form ammonia and aluminum hydroxide according to the chemical equation "$AlN+3H_2O \rightarrow Al(OH)_3+NH_3$" through reaction with moisture in the atmosphere. Therefore, it is important that the AlN whiskers taken out of the high-frequency heating furnace 2 are immediately covered with dry air and stored in a depository, such as a desiccator, having an exceedingly small moisture content. Also, it is preferred that such an operation should be performed in a dry room having very low humidity. In addition, the AlN whiskers are dipped in a surface treatment agent rarely reactive with moisture, and dried. For the AlN whiskers, contact with oxygen is also undesirable. Therefore, it is important that the AlN whiskers are stored in a depository such as a desiccator as mentioned above.

In the present embodiment, the reaction temperature is raised to approximately 1700° C. The reaction temperature can be raised to the temperature at which the AlN whiskers grow, and can be raised to the range of 1450 to 1800° C. The steps described above employ the AlN whisker production apparatus 1 shown in FIG. 1 or 2. The AlN whiskers can also be produced by similar steps using the AlN whisker production apparatus 31 for mass production shown in FIG. 3. Also, the AlN whiskers can be produced by similar steps using a continuous tunnel furnace. In the case of using the continuous tunnel furnace, a carriage loaded with the Al—Fe alloy and an alumina plate is disposed in an anterior chamber. In the state where a gate valve which separates the anterior chamber from a firing chamber is closed, the anterior chamber is vacuumed, and argon gas is introduced thereto. Then, in the nitrogen atmosphere formed in the firing chamber, the gate valve which separates the anterior chamber from the firing chamber is opened, and the carriage loaded with the Al—Fe alloy and an alumina plate is moved from the anterior chamber to the firing chamber. The carriage keeps moving in the inside of the firing chamber so that the temperature of the firing chamber is raised. The carriage moves in the space of approximately 1700° C. to produce the core of AlN on the surface of the Al—Fe alloy. Subsequently, on the tip of the core of AlN, the Al element (or Al vapor) reacts with the nitrogen gas so that AlN grows into a whisker form to produce AlN whiskers. Then, the carriage loaded with the Al—Fe alloy and an alumina plate is moved from the firing chamber to a posterior chamber and cooled to room temperature.

Figure 13:
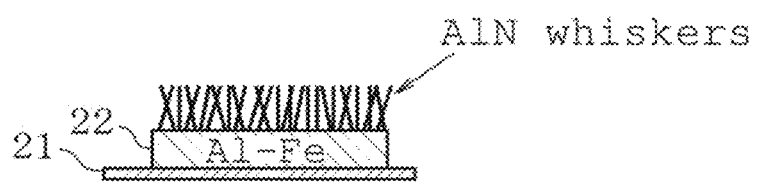
FIG. 13 is a diagram schematically showing the growth of AlN whiskers.

FIG. 13 shows the aspect in which on the surface of the Al—Fe alloy, the Al element (or Al vapor) reacts with the nitrogen gas to produce the core of AlN; and subsequently, on the tip of the core of AlN, the Al element (or Al vapor) reacts with the nitrogen gas so that AlN grows into a whisker form to produce AlN whiskers. In this case, Fe that constitutes the composition with Al is the element satisfying the condition under which the element forms a compound with neither Al nor nitrogen gas or the condition under which the element forms a compound with any of Al and nitrogen gas provided that the standard free energy of formation of the compound is larger than that of AlN (the compound is thermodynamically more unstable than AlN). Therefore, the growth of the AlN whiskers is promoted, while the production of particulate AlN is suppressed.

Also, Fe that constitutes the composition with Al is the element satisfying the condition under which the interaction energy with Al becomes negative. Therefore, the surface in the axial direction is flat (the surface in the axial direction has very few irregularities). In short, the element satisfying the condition under which the interaction energy with Al becomes negative has a propensity to be easily adsorbed onto Al on the AlN surface. The AlN whisker grown in the <0001> direction has two end faces, one of which is covered with N (N-face) and the other of which is covered with Al (Al-face). It is generally known about the growth of AlN by a sublimation method that the stable growth of the AlN crystal is promoted at the N-face, whereas the growth of the AlN crystal is inhibited at the Al-face, for example, due to the formation of facets such as (10-11). In short, when the AlN crystals are AlN whiskers, the growth of the AlN whisker at the Al-face is inhibited when the element satisfying the condition under which the interaction energy with Al becomes negative is adsorbed on the Al-face of the AlN whisker. As a result, the growth of the AlN whisker at the N-face, which permits stable growth, can be promoted so that the AlN whisker grows stably toward the direction of the N-face to produce AlN whiskers having flat surface in the axial direction.

Figure 14:
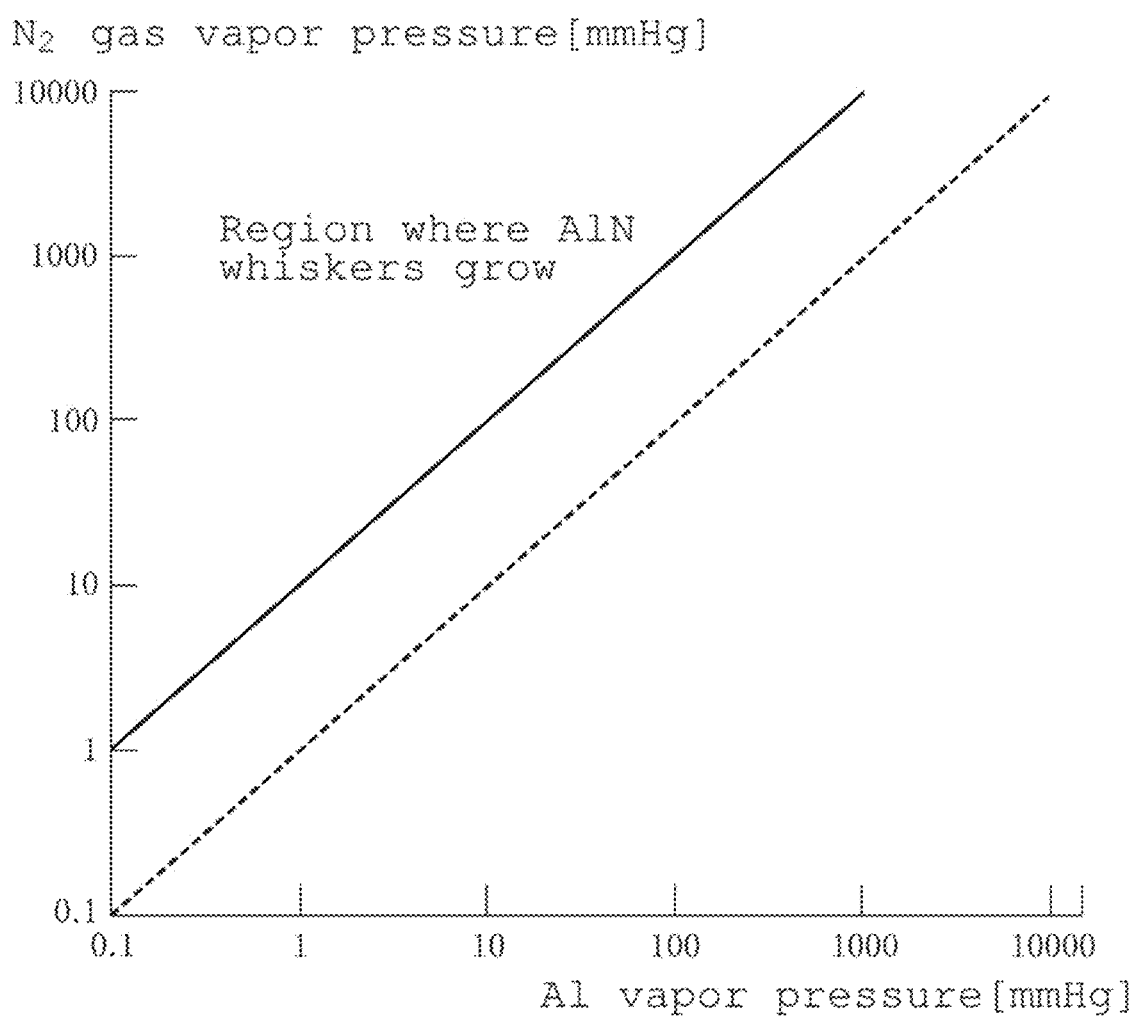
FIG. 14 is a diagram showing the relationship between the vapor pressure of Al and the vapor pressure of nitrogen gas.

FIG. 14 shows the relationship between the vapor pressure of Al vapor and the vapor pressure of nitrogen gas. As seen from the relationship shown in FIG. 14, the yield (production efficiency) of the AlN whiskers can be enhanced provided that the ratio between Al vapor and nitrogen gas is 1:1 to 100.

Figure 15:
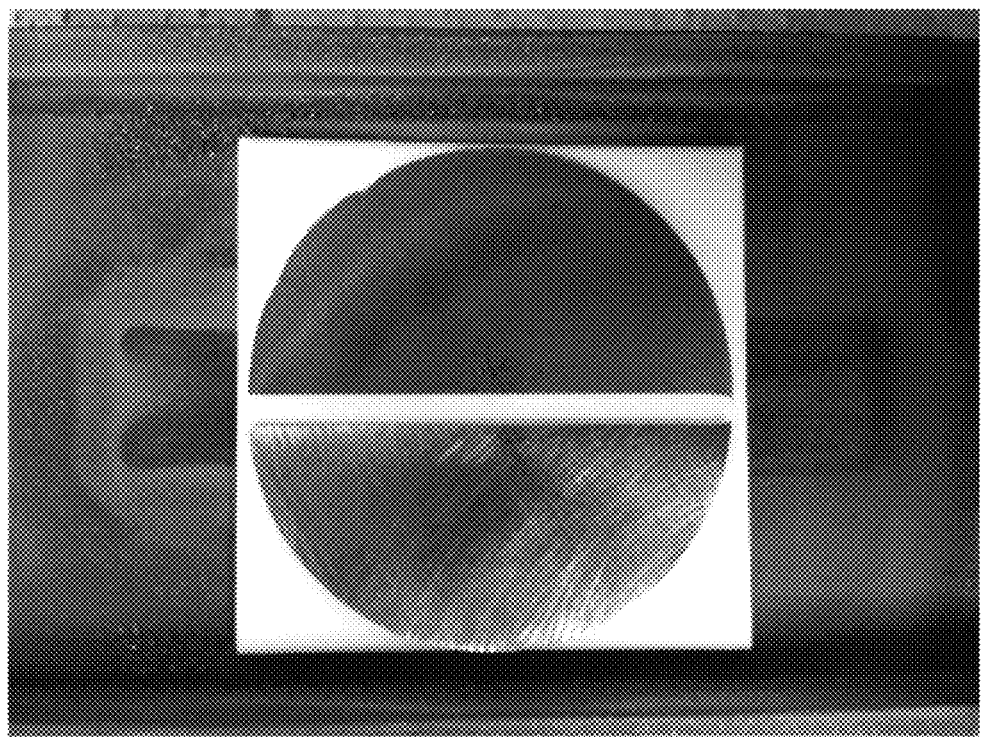
FIG. 15 is a diagram showing an image of a photographed Al—Fe alloy (part 1).
Figure 16:
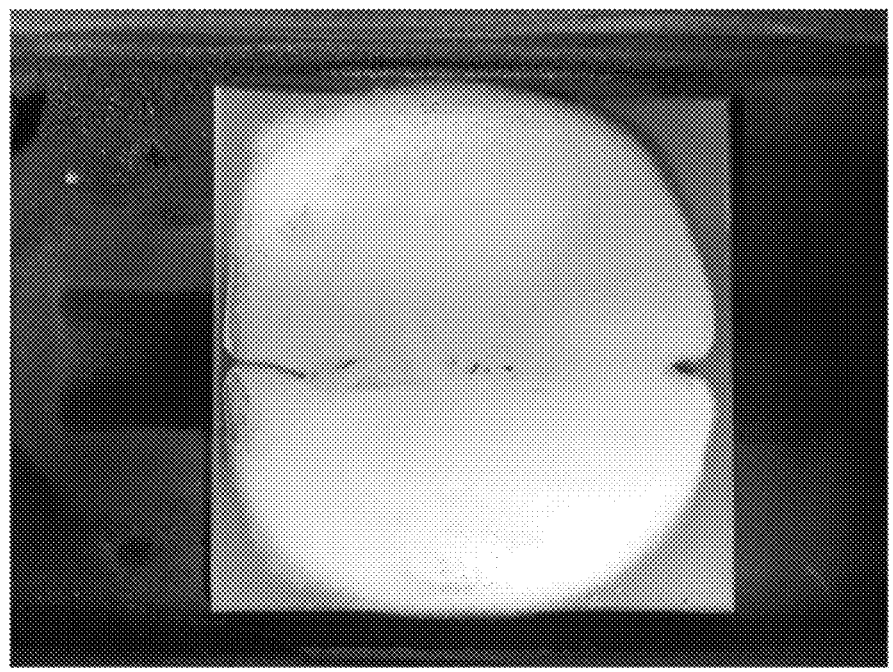
FIG. 16 is a diagram showing an image of photographed AlN whiskers (part 1).
Figure 17:
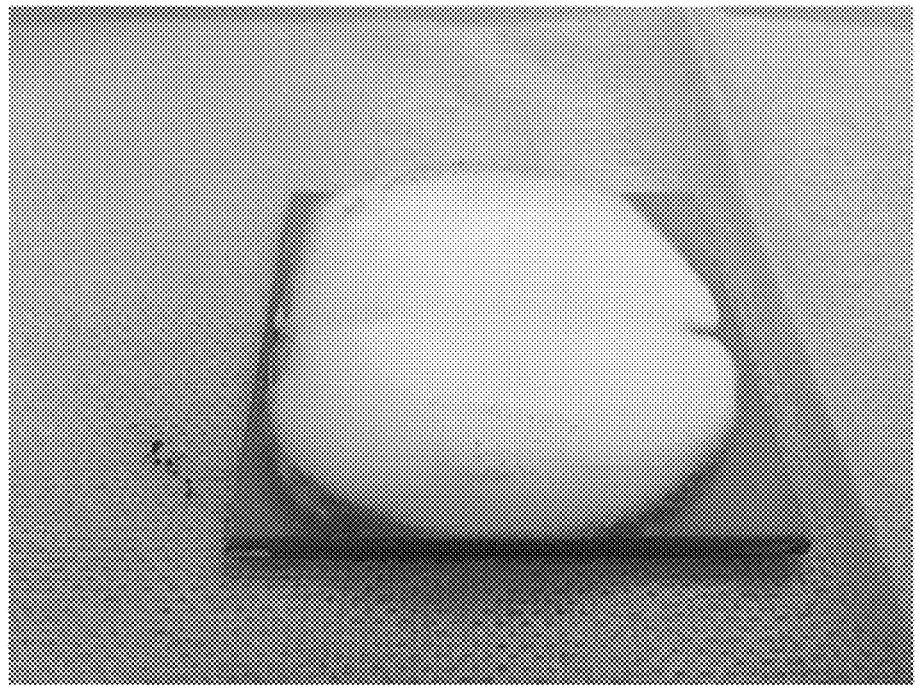
FIG. 17 is a diagram showing an image of photographed AlN whiskers (part 2).
Figure 18:
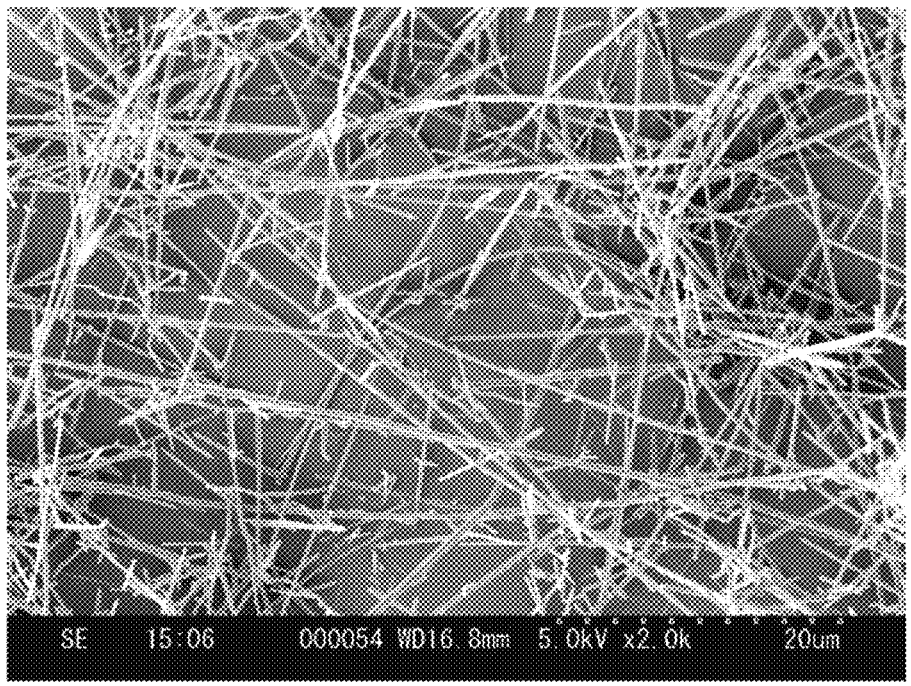
FIG. 18 is a diagram showing an image taken with a scanning electron microscope (part 1).
Figure 19:
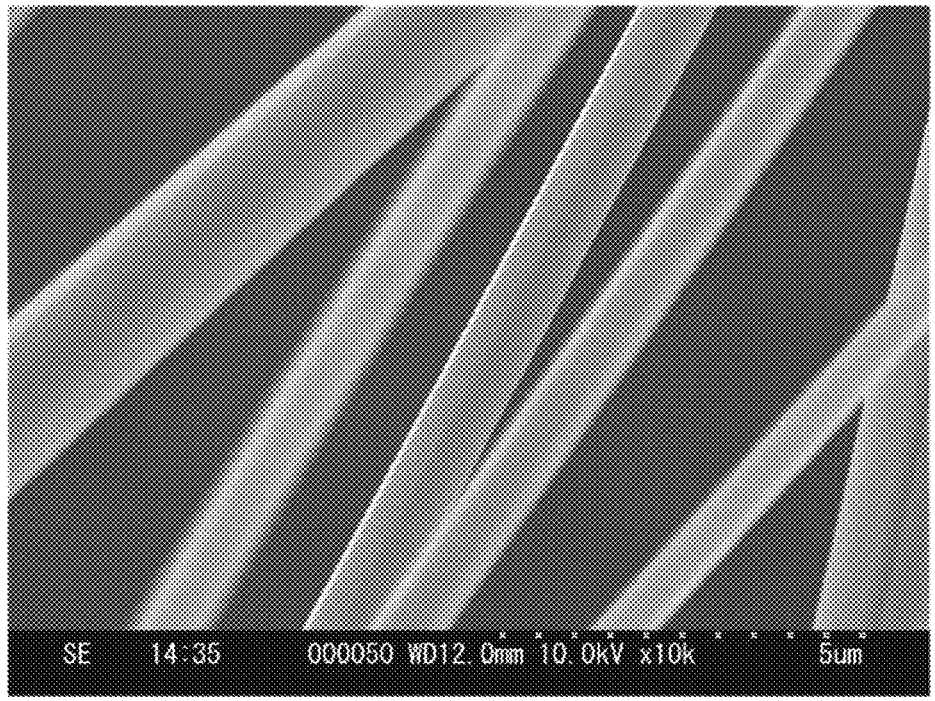
FIG. 19 is a diagram showing an image taken with a scanning electron microscope (part 2).
Figure 20:
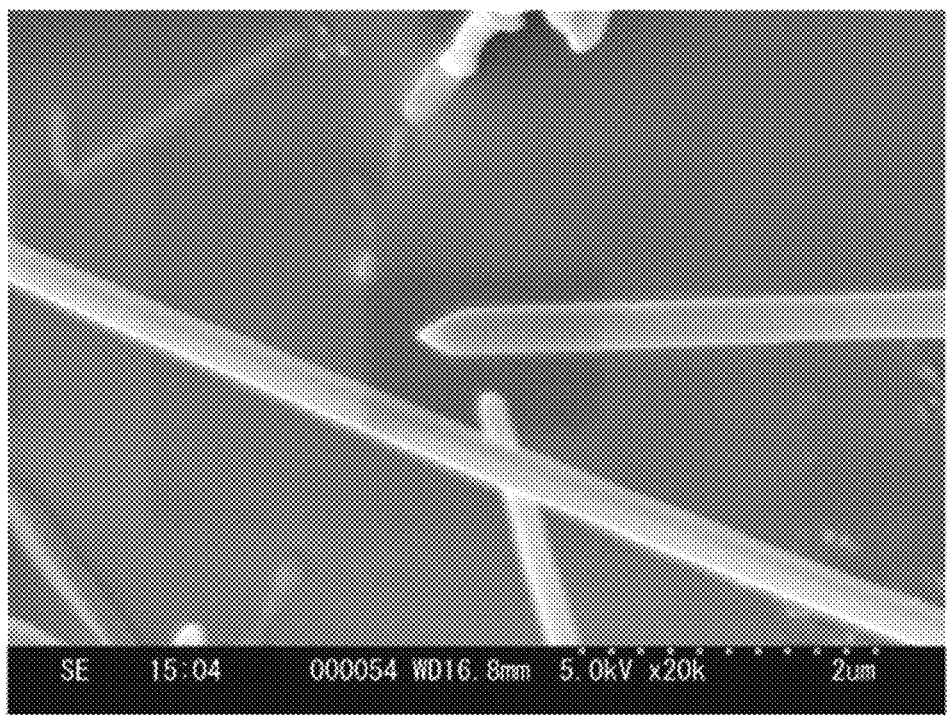
FIG. 20 is a diagram showing an image taken with a scanning electron microscope (part 3).
Figure 21:
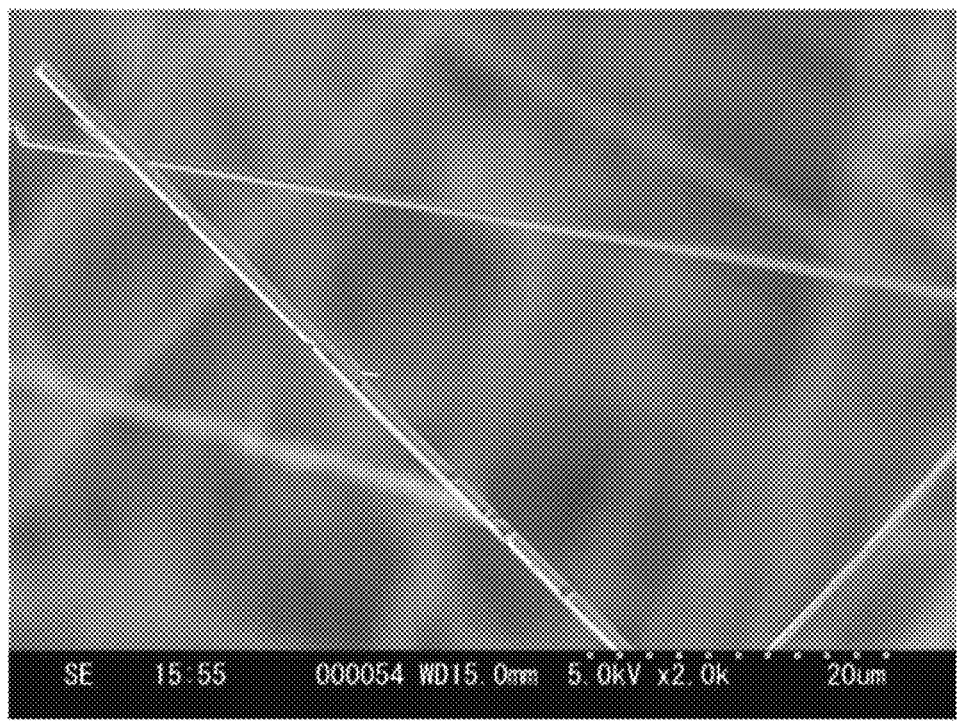
FIG. 21 is a diagram showing an image taken with a scanning electron microscope (part 4).
Figure 22:
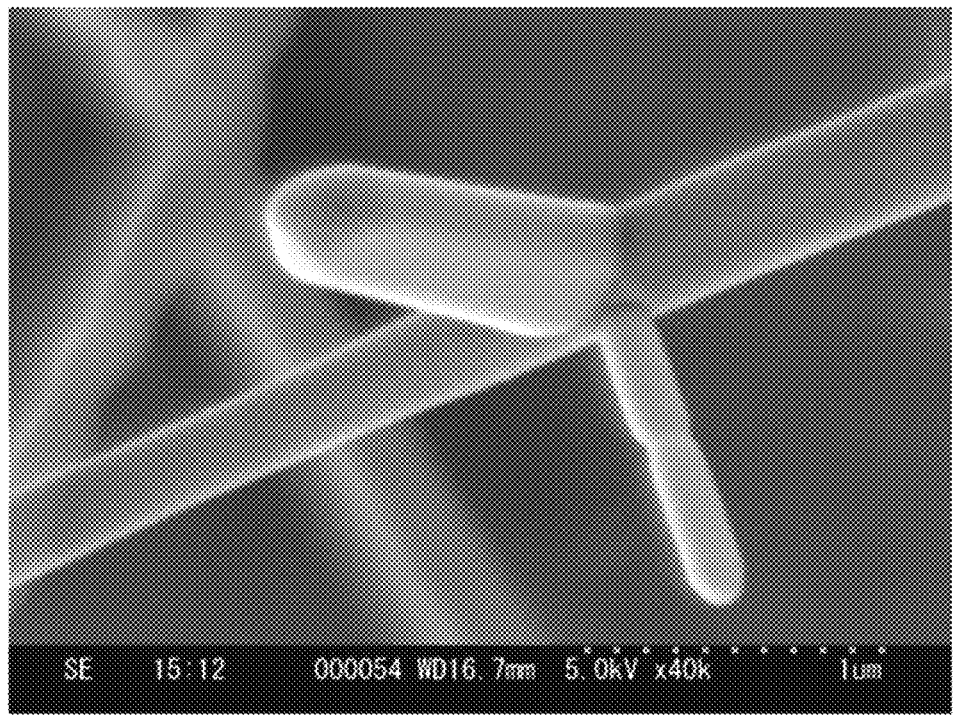
FIG. 22 is a diagram showing an image taken with a scanning electron microscope (part 5).
Figure 23:
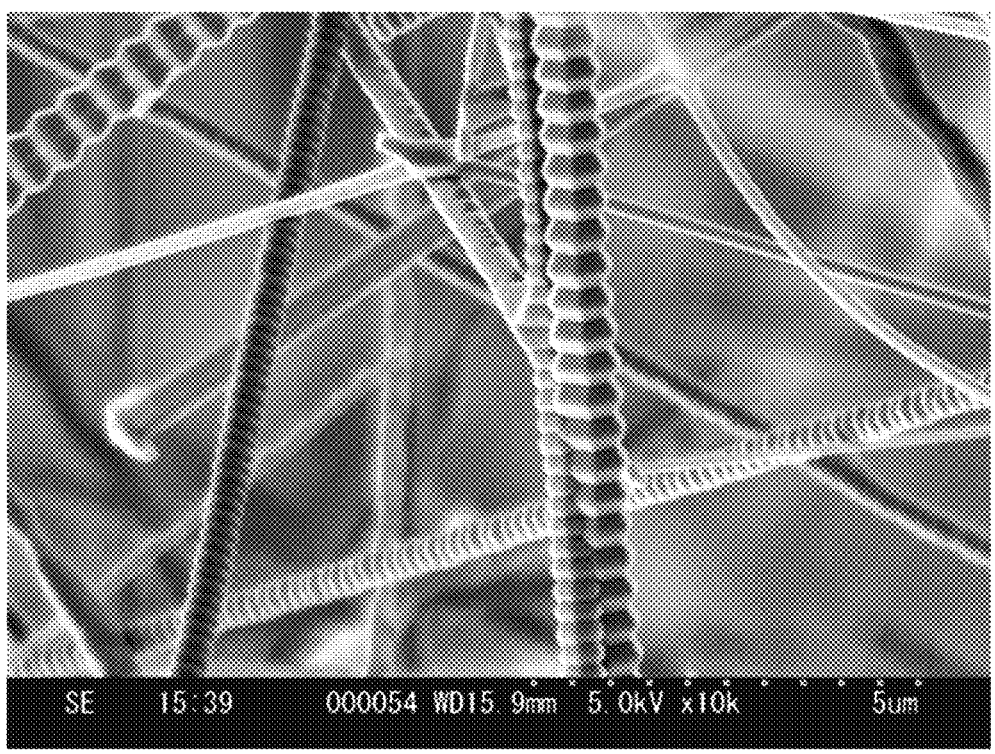
FIG. 23 is a diagram showing an image taken with a scanning electron microscope (part 6).

FIG. 15 is an image obtained by photographing the Al—Fe alloy before AlN whisker production. Each of FIGS. 16 and 17 is an image taken after AlN whisker production under conditions involving Al (30 at %)-Fe (70 at %) composition, a reaction temperature of 1700° C. and a growth time of 2 hours. As is evident from FIGS. 16 and 17, it was confirmed that the AlN whiskers grow so at to cover the whole surface of the Al—Fe alloy. Each of FIGS. 18 to 23 is an image taken with a scanning electron microscope. The surface in the axial direction of the AlN whiskers has few irregularities. Even at a site where having surface irregularities, the difference between a projection and a depression is several to 10 nm (10 nm at a maximum). The reason for such few surface irregularities is that, as described above, Fe is the element that satisfies the condition under which the interaction energy with Al becomes negative and also satisfies the condition under which the absolute value of this interaction energy is larger than the interaction energy between Al and Ge. As shown in FIG. 22, a branched portion was also found. This is because the core of AlN is present at some midpoint of the AlN whisker. As shown in FIG. 23, some sites were confirmed to have surface irregularities, the degree of which is however only a few out of 10000 AlN whiskers, demonstrating that a very large number of AlN whiskers have no surface irregularities.

Figure 24:
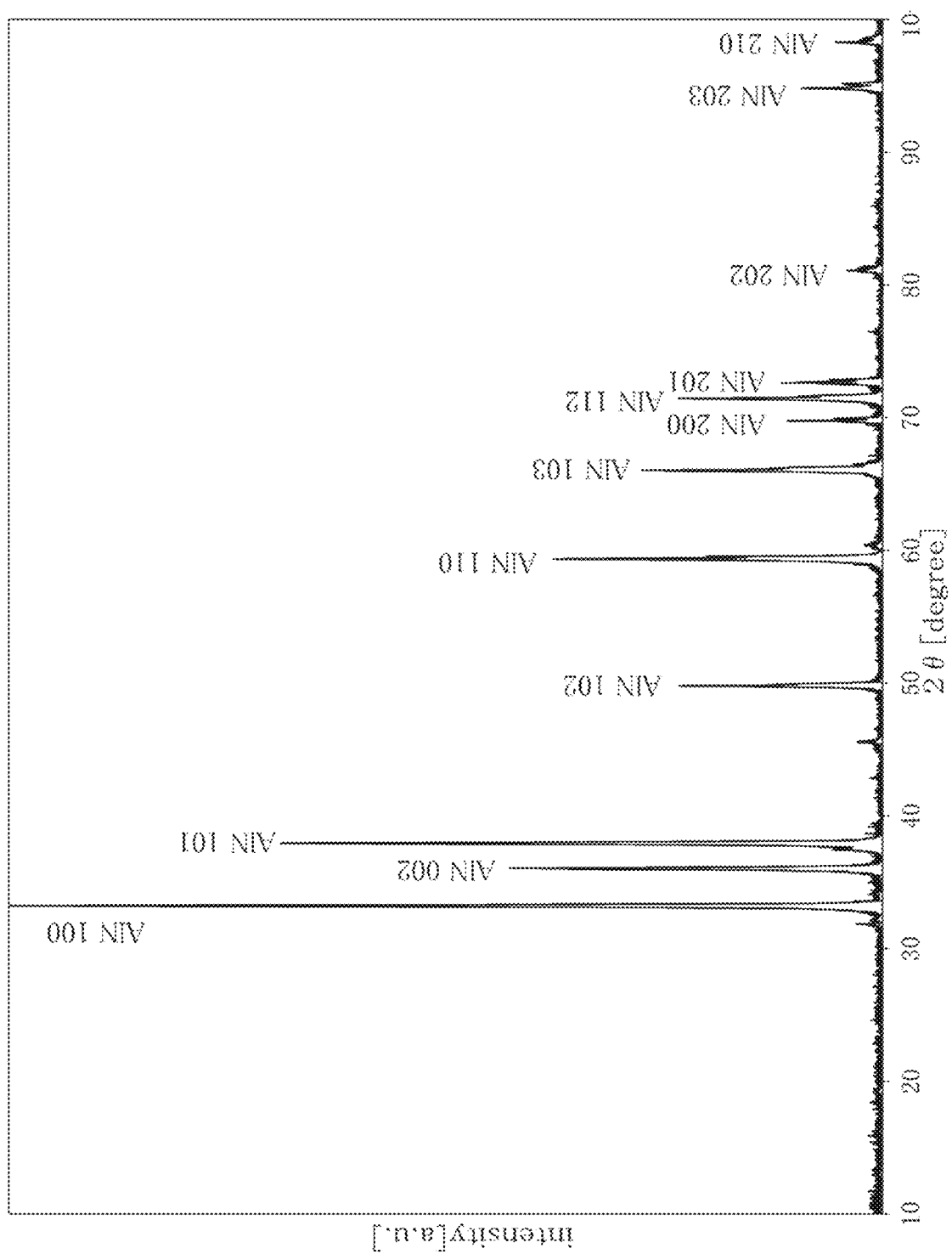
FIG. 24 is a diagram showing analysis results of XRD.
Figures 25, 26:
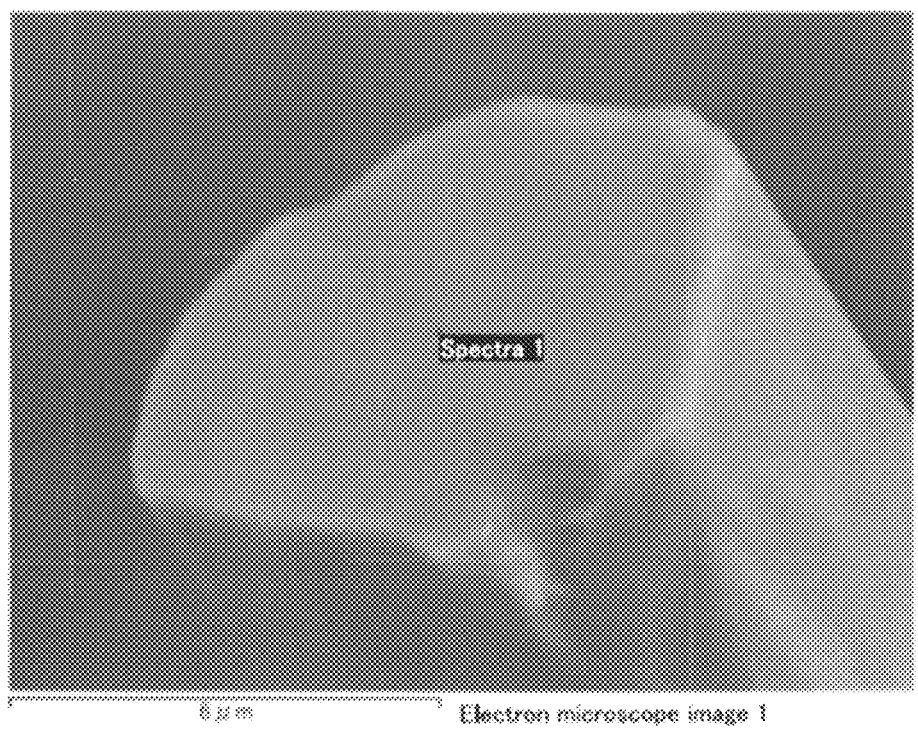
FIG. 25 is a diagram showing an image taken with a transmission electron microscope (part 1).
FIG. 26 is a diagram showing results of analyzing mass concentration and atomic concentration (part 1).
Figure 27:
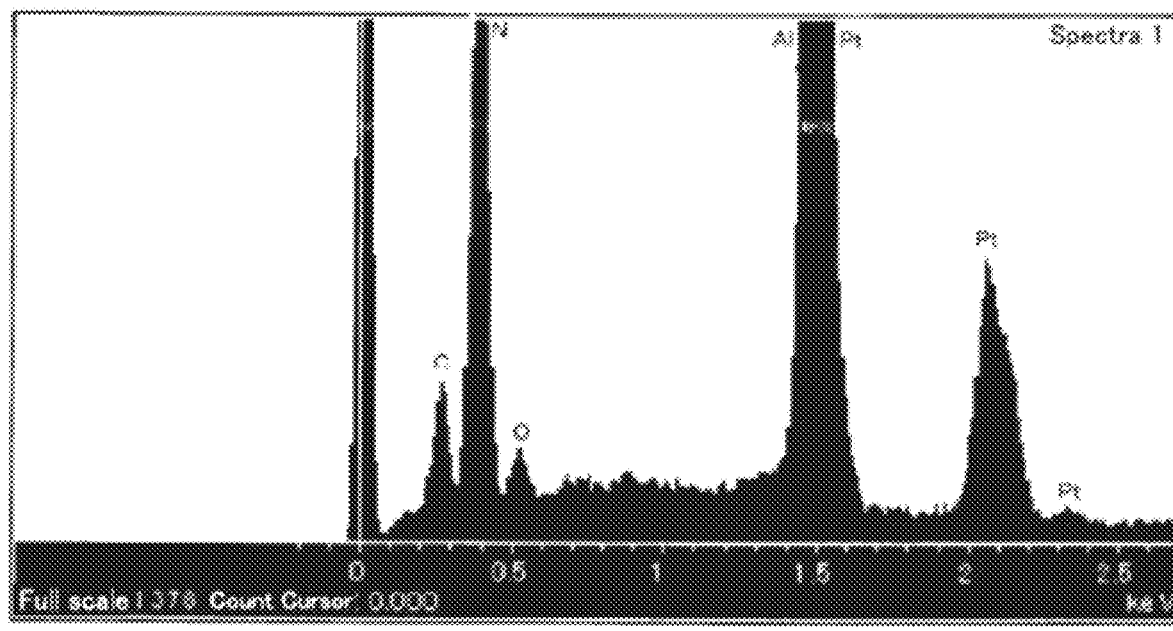
FIG. 27 is a diagram showing spectra (part 1).
Figures 28, 29:
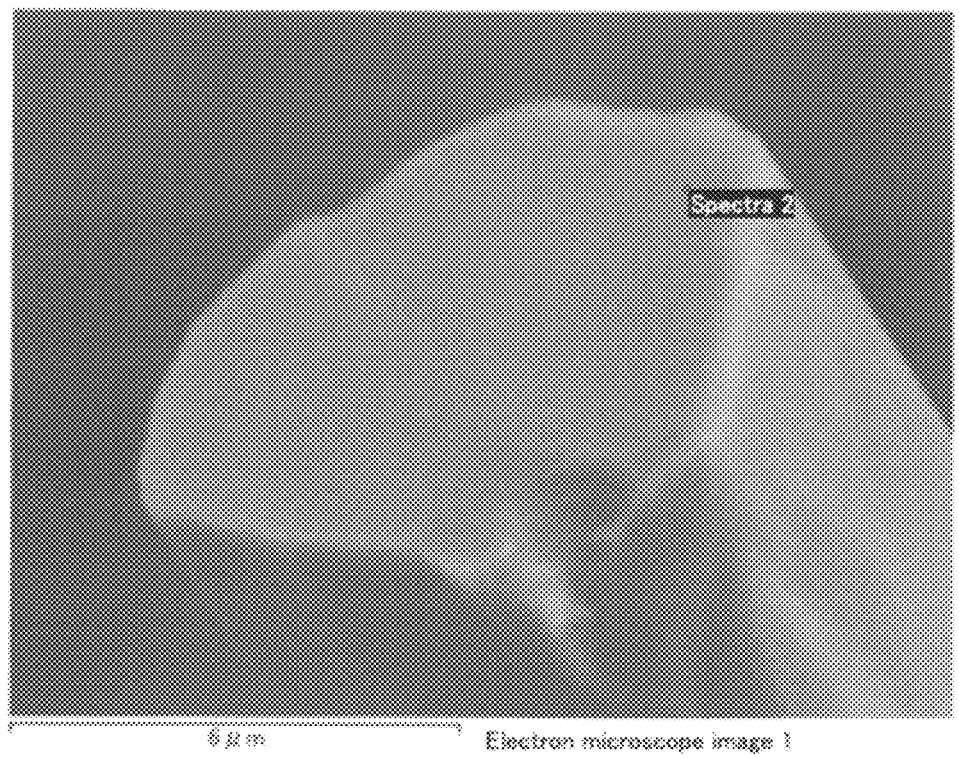
FIG. 28 is a diagram showing an image taken with a transmission electron microscope (part 2).
FIG. 29 is a diagram showing results of analyzing mass concentration and atomic concentration (part 2).
Figure 30:
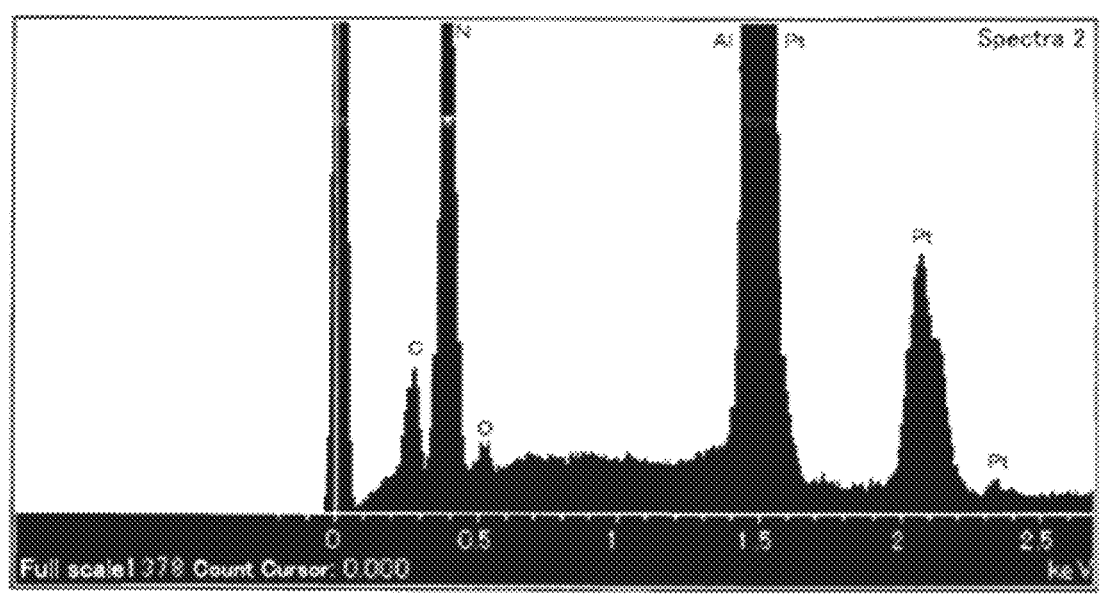
FIG. 30 is a diagram showing spectra (part 2).

FIG. 24 shows analysis results of XRD (X-ray diffraction) in the state where AlN whiskers were chopped. Most of products were confirmed to be AlN, demonstrating that substances other than AlN (impurities) were not mixed therein. Thus, the yield of the AlN whiskers can be confirmed to be high.

FIGS. 25 to 30 each show analysis results of EDX in the SEM analysis of two sites in the cross section of an arbitrary one of the AlN whiskers. It was confirmed that Fe was not detected. Presumably, the detection of carbon was due to background, and the detection of oxygen was due to oxidation that occurred when the AlN whiskers were taken out or the cross section was disrupted. Also, the detection of platinum was due to vapor deposition such as sputtering that occurred when the insulating material was analyzed.

Figure 31:
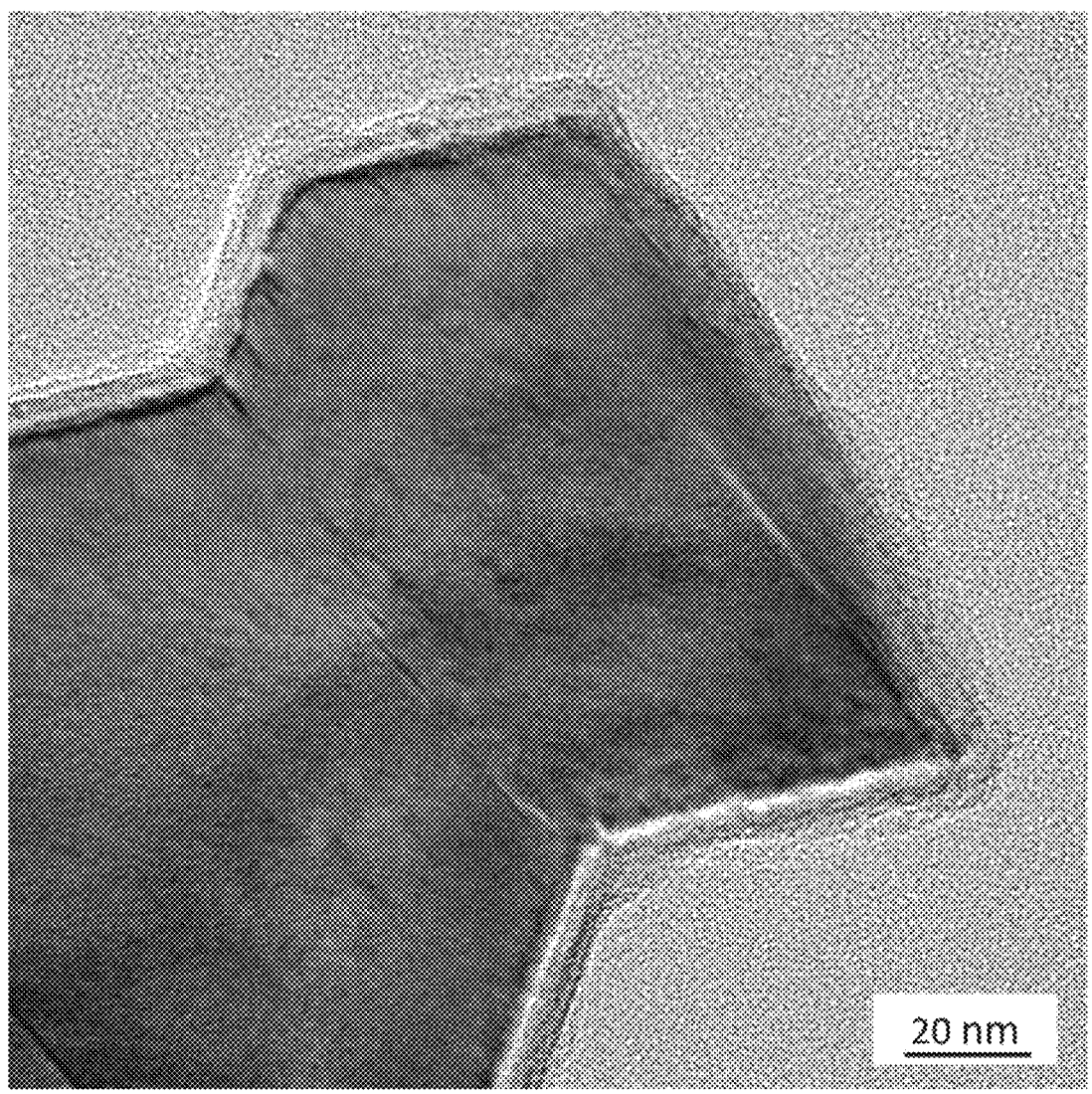
FIG. 31 is a diagram showing an image taken with a transmission electron microscope (part 3).
Figure 32:
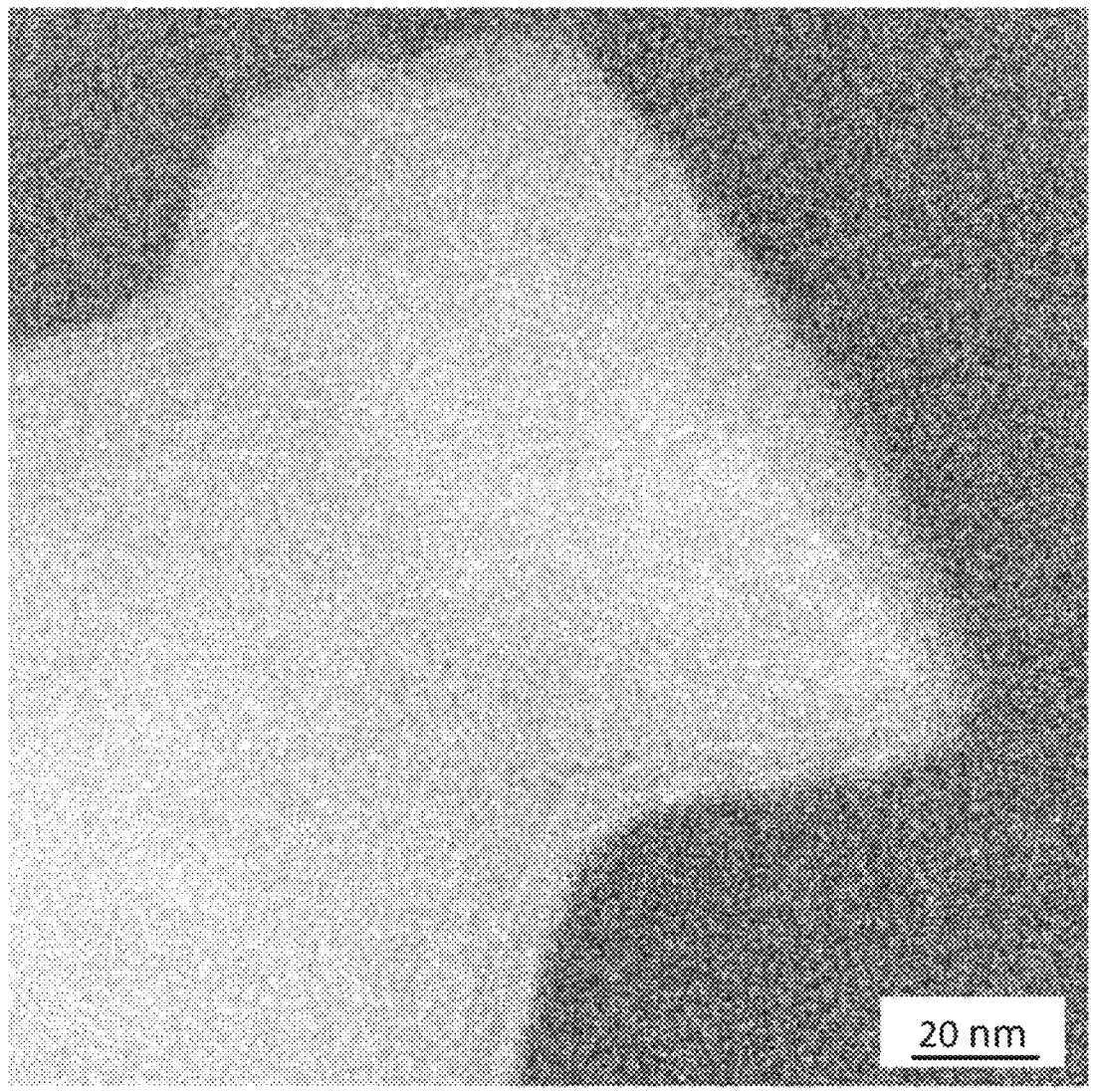
FIG. 32 is a diagram showing a mapping image of Al.
Figure 33:
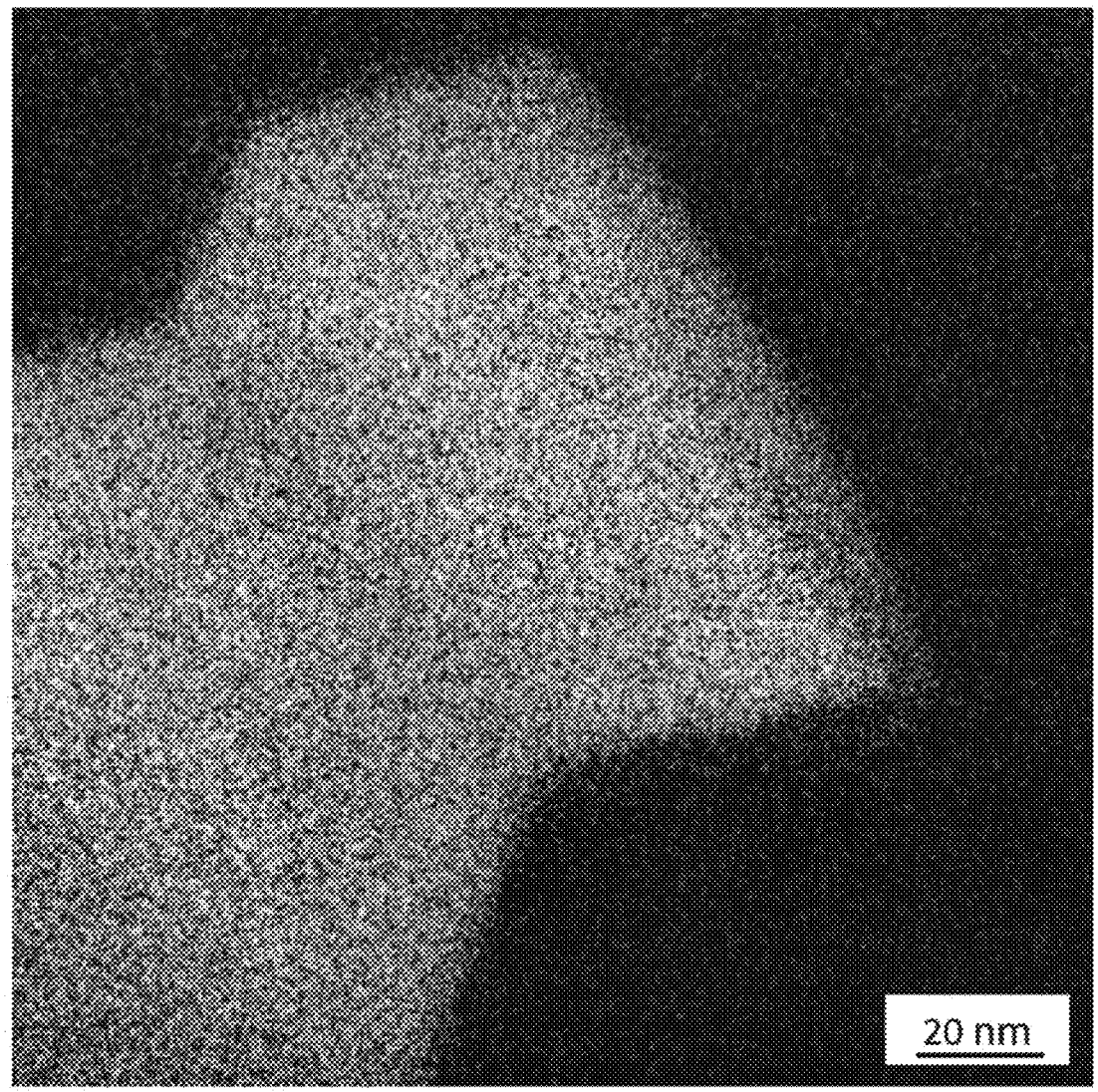
FIG. 33 is a diagram showing a mapping image of N.
Figure 34:
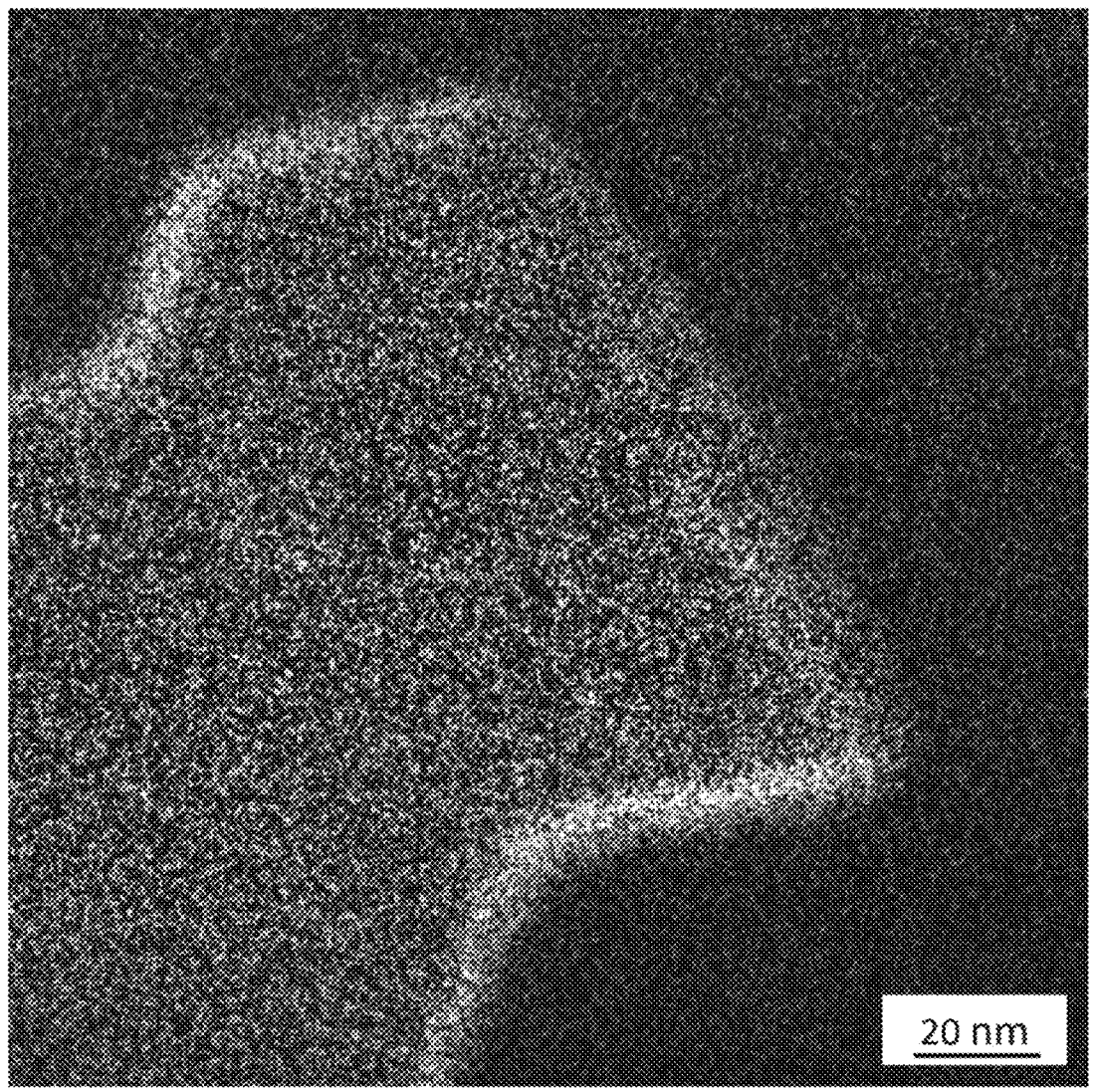
FIG. 34 is a diagram showing a mapping image of O.

FIG. 31 is a TEM image of the cross section of an arbitrary one of the AlN whiskers exposed to the atmosphere after production, wherein the image was taken after a lapse of approximately half a year from the exposure. FIGS. 32, 33 and 34 are mapping images of Al, N and O, respectively. An oxide layer having a thickness of approximately 8 nm (10 nm at a maximum) was found throughout the surface of the AlN whisker, whereas no such oxide layer was found in the inside of the AlN whisker. Thus, the inside of the AlN whisker is presumed to have a crystalline structure of a single crystal that makes the entry of O difficult. Since the thickness of the oxide layer on the surface of the AlN whisker influences thermal conductivity, reduction in thermal conductivity caused by the influence of the oxide layer having a thickness of approximately 8 nm is presumably very small.

Figure 35:
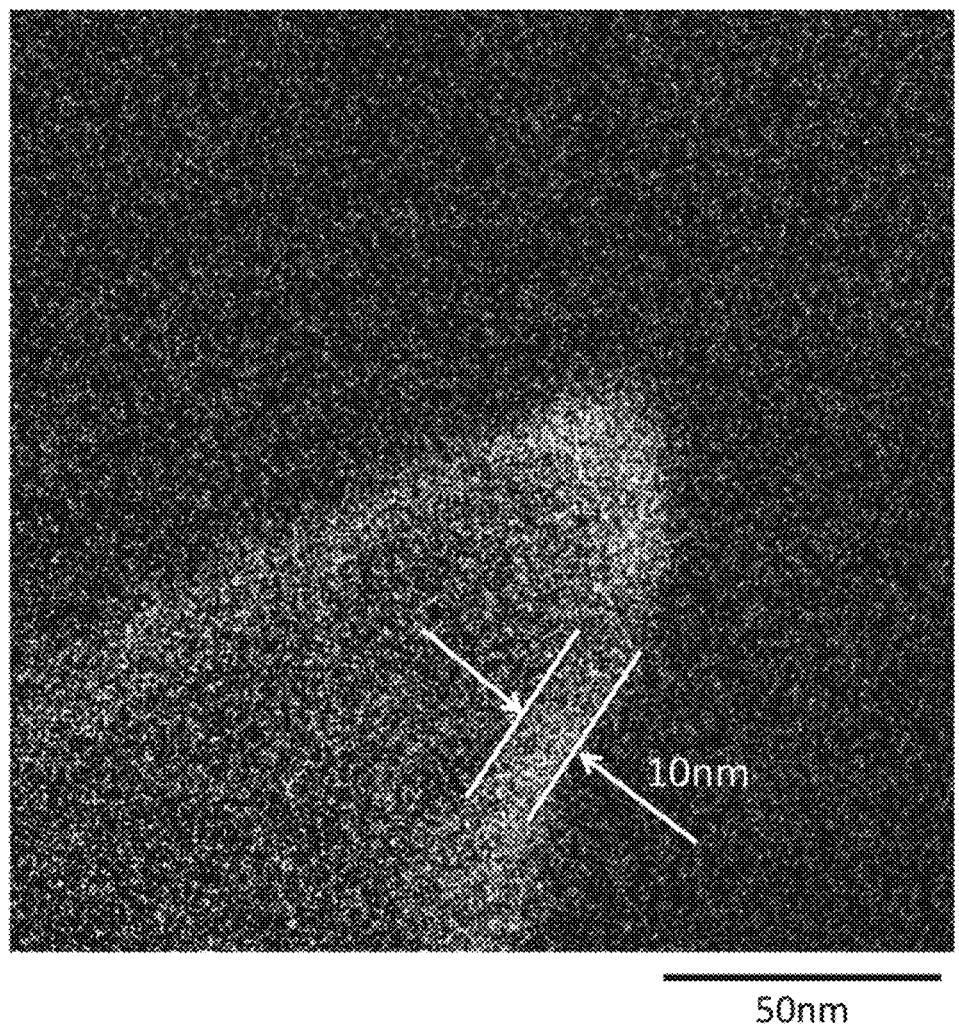
FIG. 35 is a diagram showing a mapping image of O.

FIG. 35 is a mapping image of O of an arbitrary one of the AlN whiskers exposed to the atmosphere after production, wherein the image was taken immediately after the exposure. In this case as well, an oxide layer having a thickness of approximately 10 nm was found throughout the surface of the AlN whisker, whereas no such oxide layer was found in the inside of the AlN whisker. From FIGS. 34 and 35, it was confirmed that the thickness of the oxide layer found in the AlN whisker produced by the steps of the present invention does not largely differ between immediately after the exposure to the atmosphere and after a lapse of approximately half a year from the exposure. Thus, it was confirmed that when the AlN whiskers produced by the steps of the present invention are exposed to the atmosphere after production, an oxide layer having a thickness of approximately 10 nm at a maximum is formed immediately after the exposure, and the thickness of the oxide layer formed immediately after the exposure is not increased even after a lapse of approximately half a year (the thickness is rarely changed as compared with immediately after the exposure).

Here, the oxide layer will be supplemented. As mentioned above, the AlN whiskers have a propensity to form ammonia and aluminum hydroxide through reaction with moisture in the atmosphere. When the AlN whiskers are used for the purpose of being mixed in a resin as mentioned later, the reaction of the AlN whiskers mixed in the resin with moisture penetrating the resin has the risk of causing cracks in the resin or causing the corrosion of a product (e.g., motors, electronic components and printed circuit boards)

filled with the resin or reduction in the quality of the product. In light of such a situation, it is desirable for preventing the reaction of the AlN whiskers with moisture that the oxide layer having a moderate film thickness should be formed throughout the surface of each AlN whisker. The moderate film thickness is a thickness that does not hinder thermal conductivity and insulation, which are the properties of the AlN whiskers. In this respect, the oxide layer having a thickness of approximately 10 nm is formed by mere exposure to the atmosphere in the steps of the present invention and can ensure moisture resistance. This can circumvent the risk of causing problems with the mixing of the AlN whiskers into the resin. Furthermore, it is unnecessary for securing moisture resistance to reluctantly perform a treatment for forming the oxide layer. In addition, if the oxide layer had a thickness over approximately 10 nm (thickness larger than necessary) as the time passed, it would be necessary to perform a treatment for removing the larger-than-necessary thickness of the oxide layer. In the steps of the present invention, the thickness is not increased from approximately 10 nm even after a lapse of at least approximately half a year as compared with immediately after the exposure to the atmosphere. Therefore, it is unnecessary to perform the treatment for removing the larger-than-necessary thickness of the oxide layer.

Figure 36:
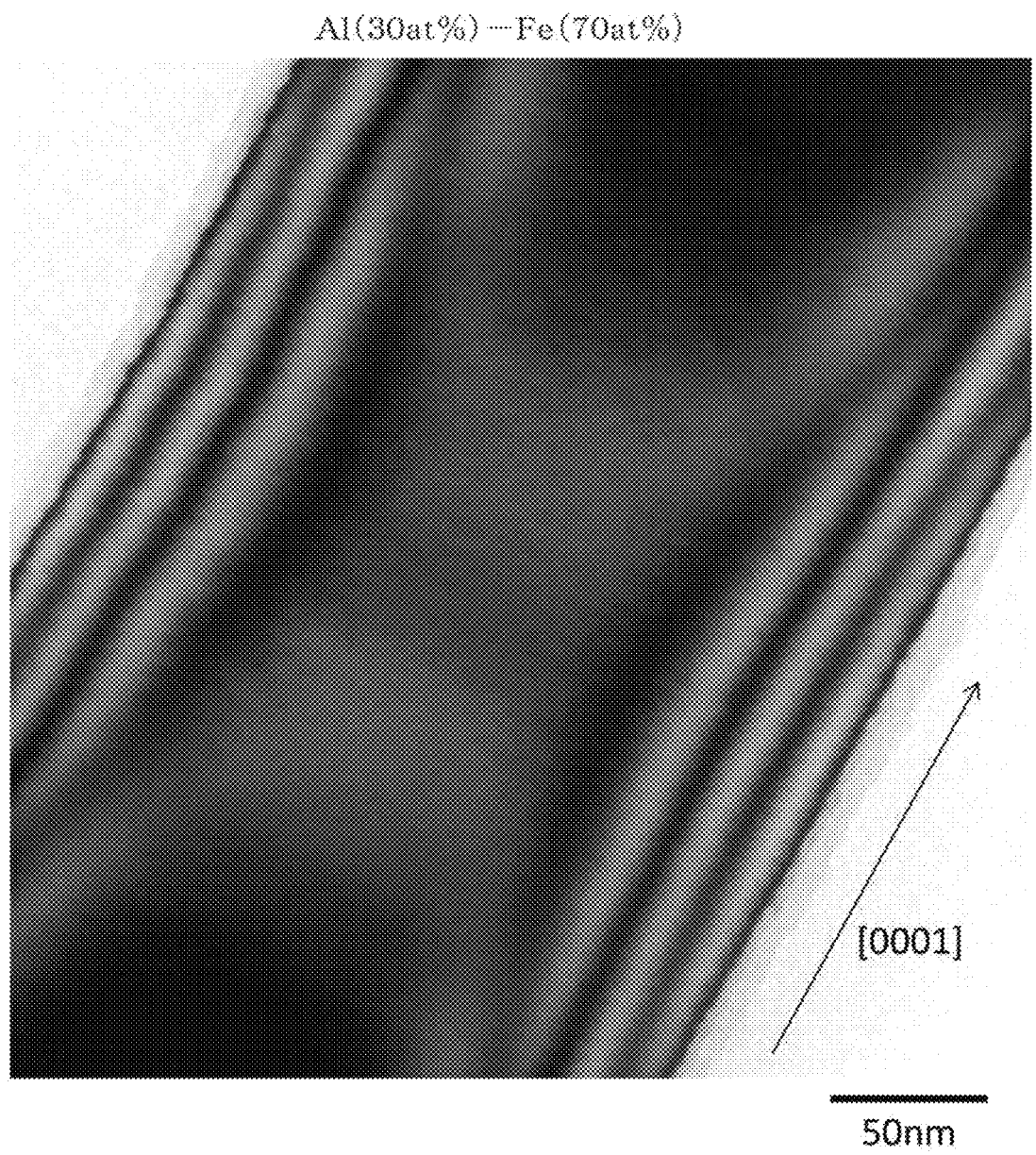
FIG. 36 is a diagram showing an image taken with a transmission electron microscope (part 4).
Figure 37:
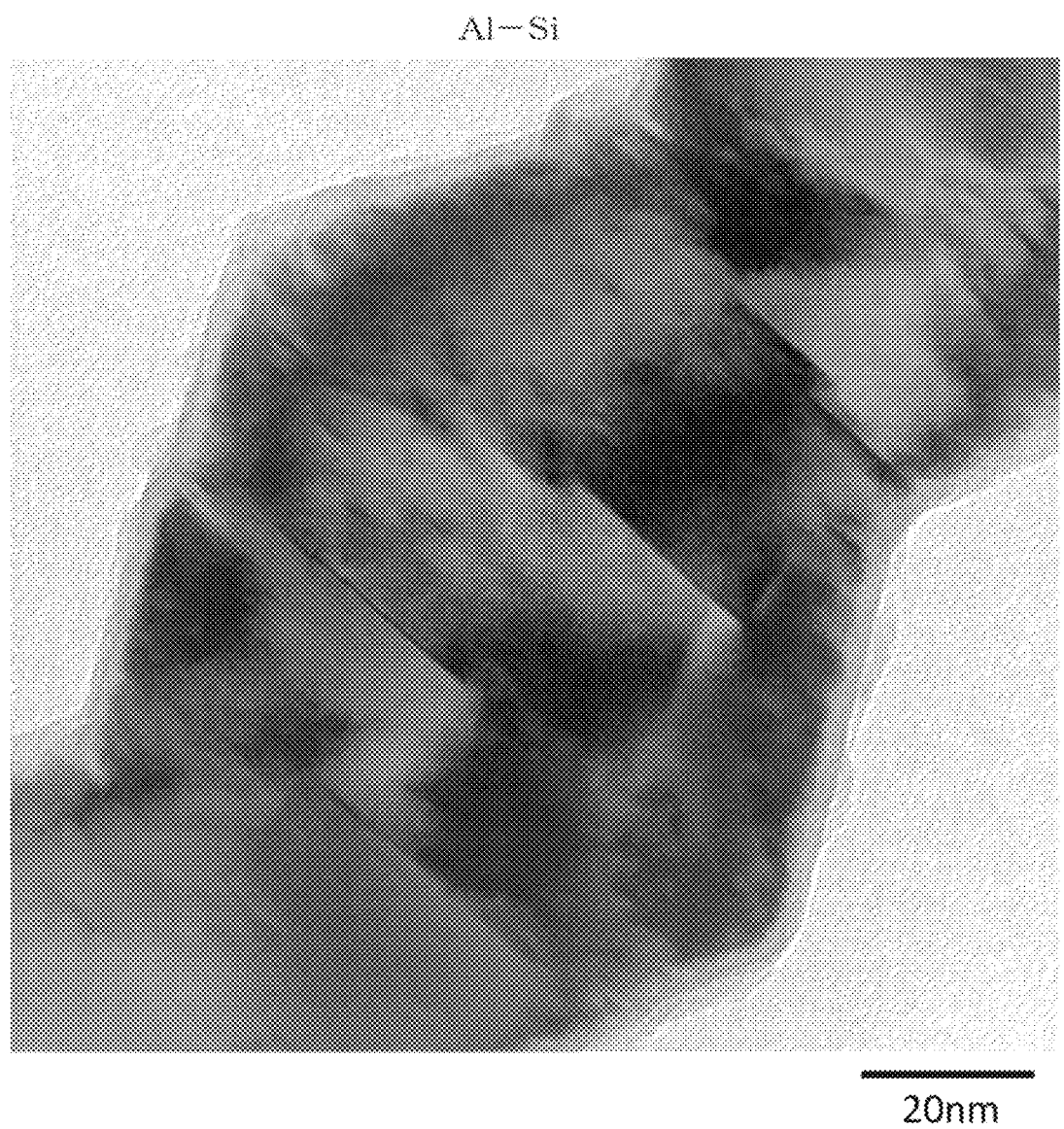
FIG. 37 is a diagram showing an image taken with a transmission electron microscope (part 5).

FIG. 36 is a TEM image of the surface of AlN whiskers produced using a solvent of Al—Fe. FIG. 37 is a TEM image of the surface of AlN whiskers produced using a solvent of Al—Si. A stacking fault was found in the surface of the AlN whiskers produced using the solvent of Al—Si, whereas neither dislocation nor planar defects were found in the surface of the AlN whiskers produced using the solvent of Al—Fe.

Figure 38:
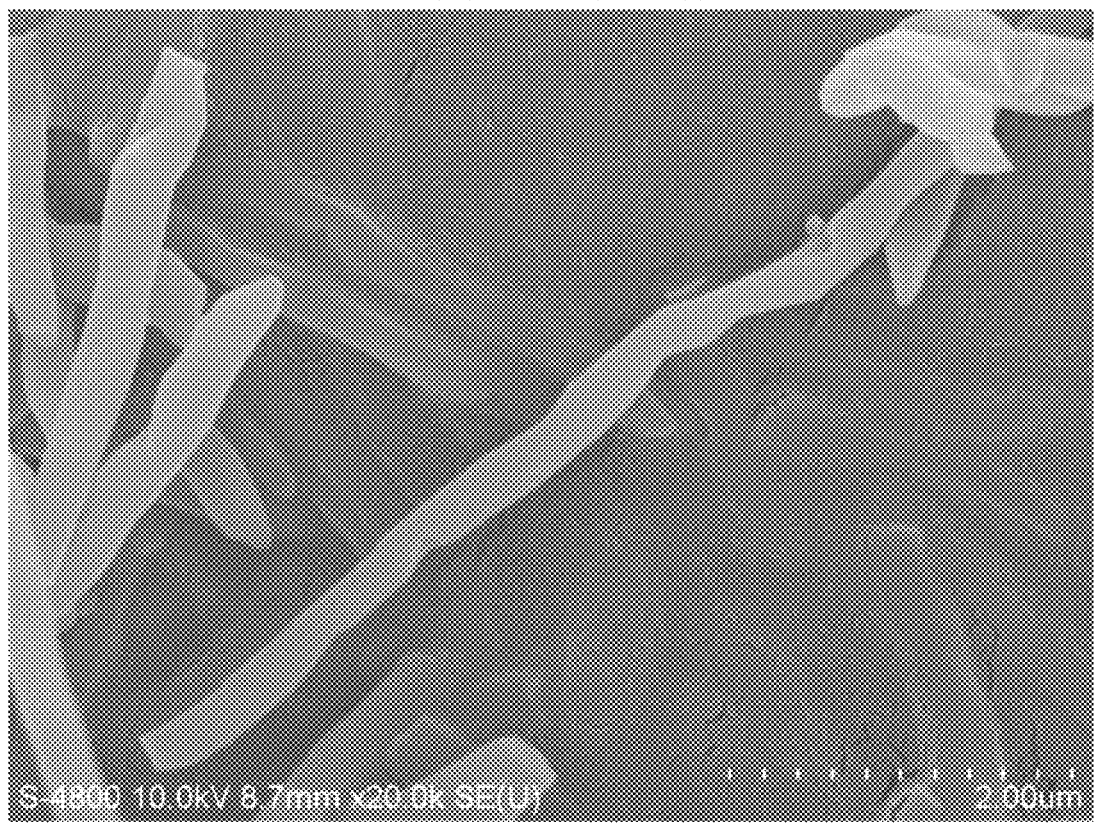
FIG. 38 is a diagram showing an image taken with a scanning electron microscope (part 7).
Figure 39:
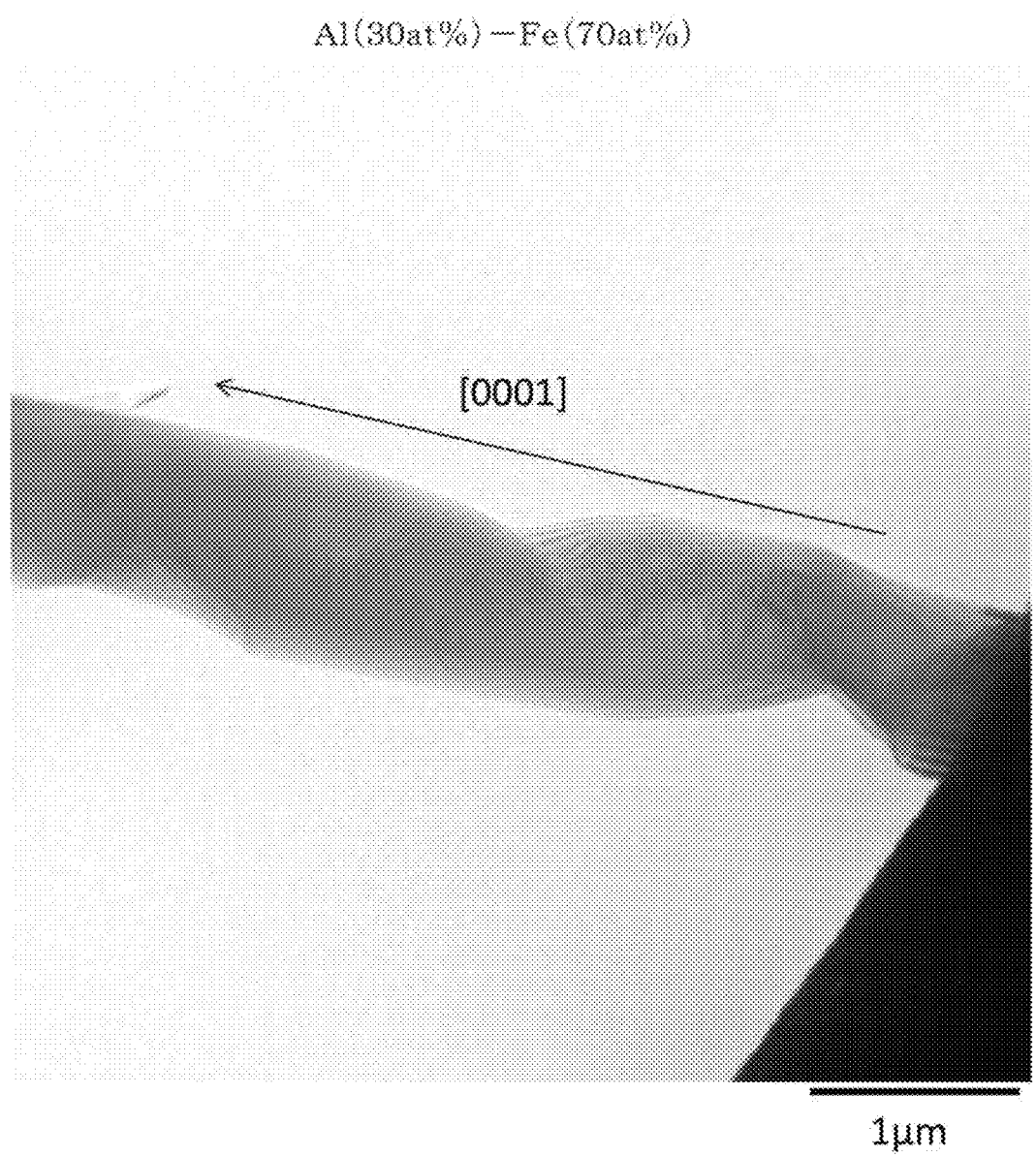
FIG. 39 is a diagram showing an image taken with a transmission electron microscope (part 6).
Figure 40:
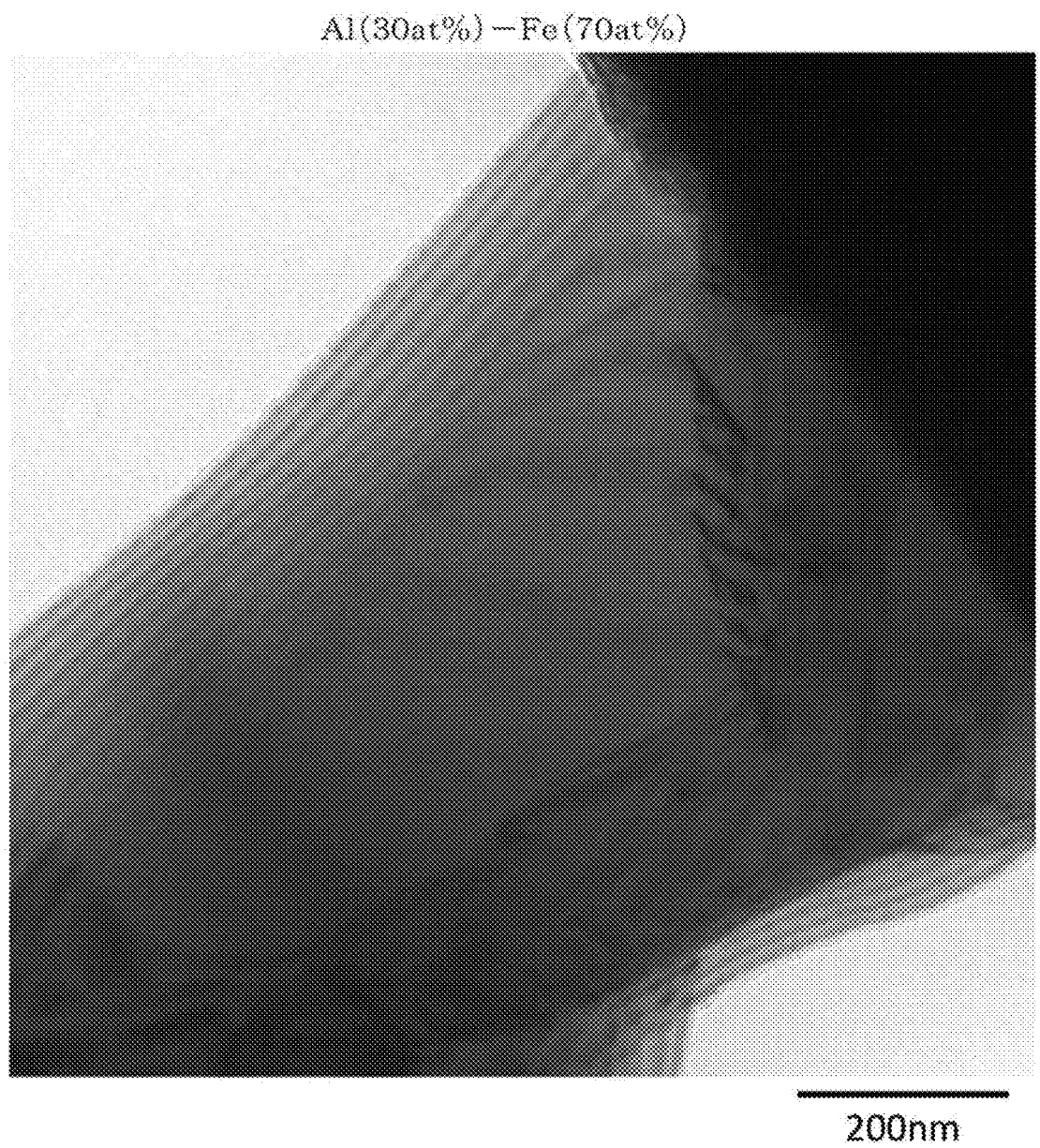
FIG. 40 is a diagram showing an image taken with a transmission electron microscope (part 7).

FIG. 38 is a SEM image of the surface of AlN whiskers produced using a solvent of Al—Fe. A curved portion was found in the AlN whiskers produced using the solvent of Al—Fe. Each of FIGS. 39 and 40 is a TEM image of the curved portion. Dislocation was found in the curved portion.

Figure 41:
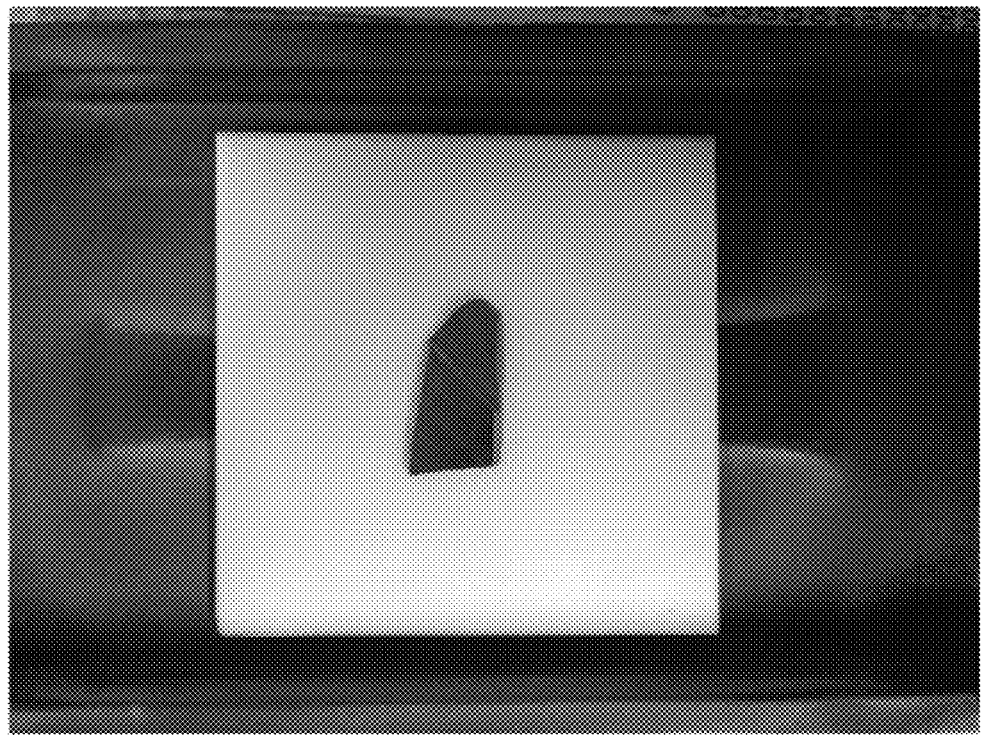
FIG. 41 is a diagram showing an image of a photographed Al—Fe alloy (part 2).
Figure 42:
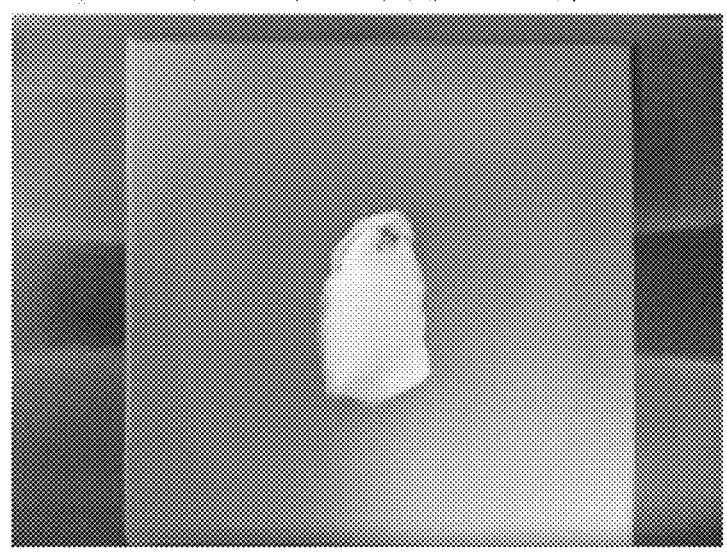
FIG. 42 is a diagram showing an image of photographed AlN whiskers (part 3).
Figure 43:
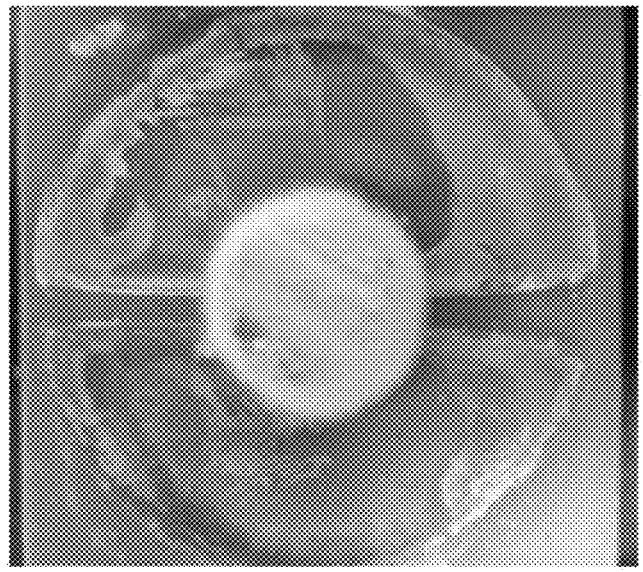
FIG. 43 is a diagram showing an image of photographed AlN whiskers (part 4).
Figure 44:
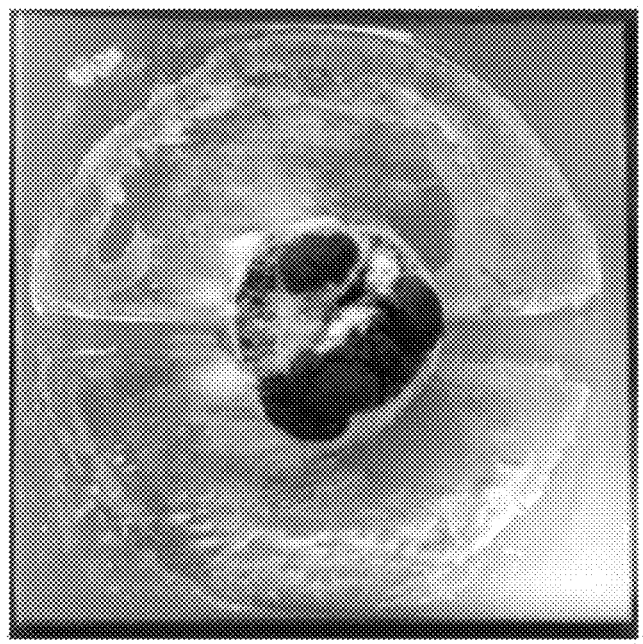
FIG. 44 is a diagram showing an image of photographed AlN whiskers (part 5).
Figure 45:
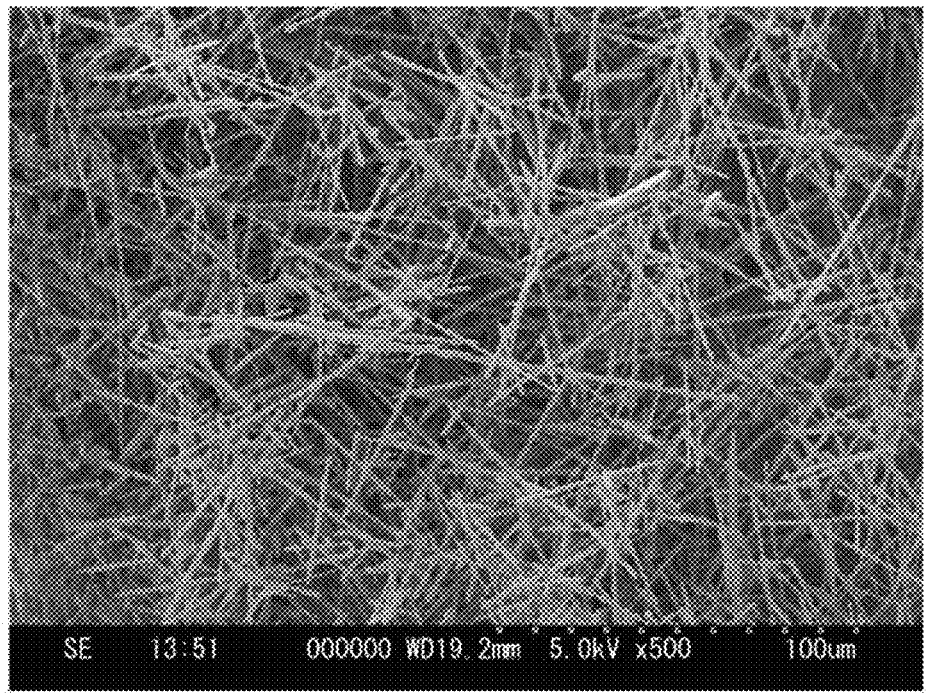
FIG. 45 is a diagram showing an image taken with a scanning electron microscope (part 8).
Figure 46:
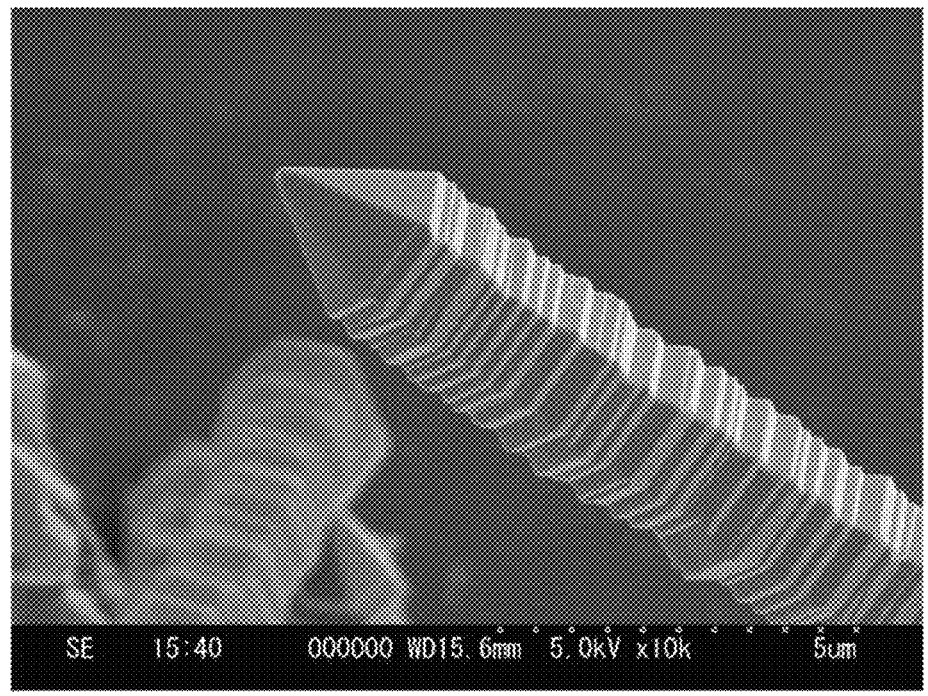
FIG. 46 is a diagram showing an image taken with a scanning electron microscope (part 9).
Figure 47:
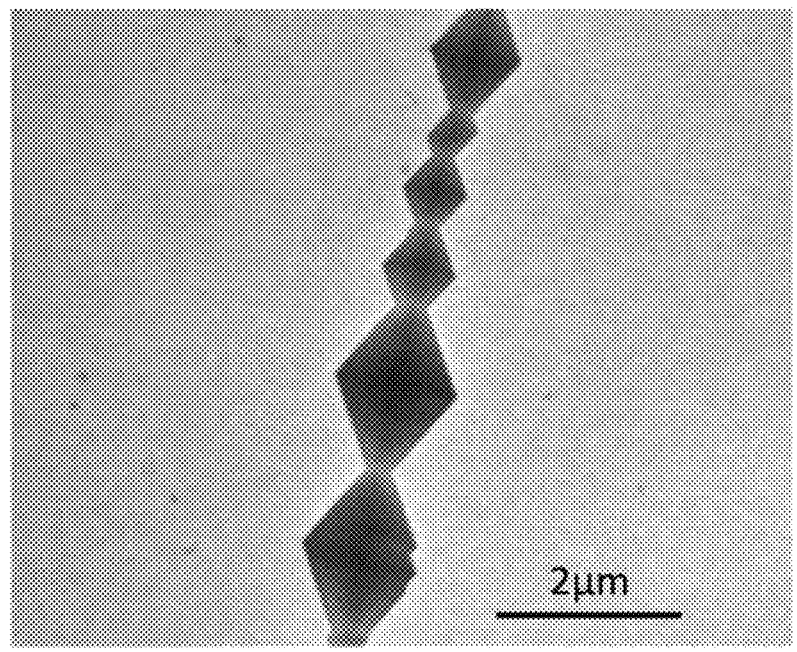
FIG. 47 is a diagram showing an image taken with a transmission electron microscope (part 8).
Figure 48:
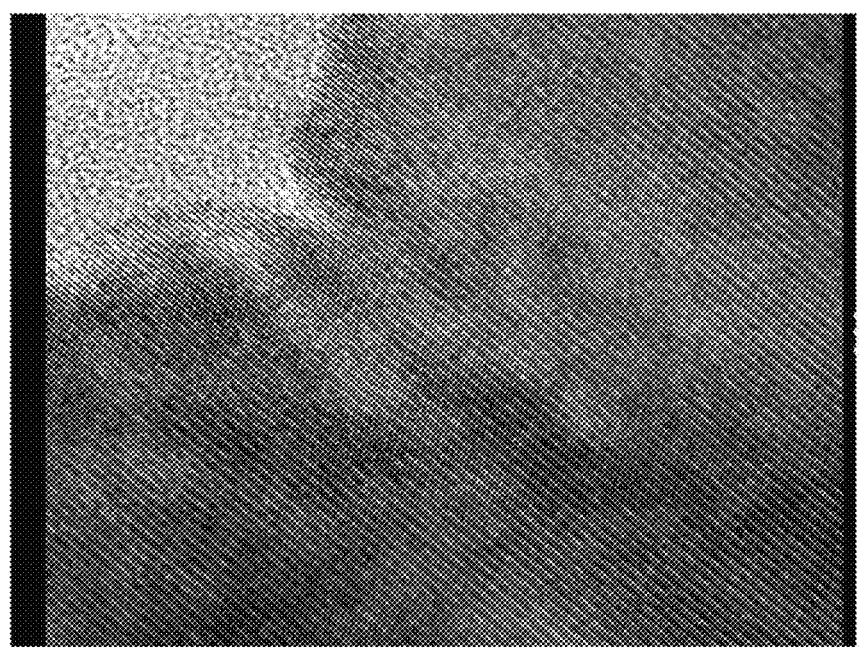
FIG. 48 is a diagram showing an image taken with a transmission electron microscope (part 9).

FIGS. 41 and 42 are images obtained by photographing samples different in shape from the samples shown in FIGS. 15 to 30, before and after AlN whisker production, respectively. In this case as well, the surface in the axial direction of the AlN whiskers was confirmed to have few irregularities. FIG. 43 is an image taken after AlN whisker production under conditions involving Al (10 at %)-Fe (90 at %) composition, a reaction temperature of 1700° C. and a growth time of 2 hours. The growth of the AlN whiskers was also found when the alloy having Al (10 at %)-Fe (90 at %) composition was used. However, its yield was confirmed to be low as compared with use of the alloy having Al (30 at %)-Fe (70 at %) composition. FIG. 44 is an image taken after AlN whisker production using an alloy having Al (80 at %)-Fe (20 at %) composition. The growth of the AlN whiskers was also found when the alloy having Al (80 at %)-Fe (20 at %) composition was used. However, the growth was confirmed to be not favorable as compared with use of the alloy having Al (30 at %)-Fe (70 at %) composition. It can be concluded that among the samples shown in the present invention, the Al (30 at %)-Fe (70 at %) composition is favorable.

Each of FIGS. 45 to 48 is an image obtained by photographing, with a scanning electron microscope, AlN whiskers produced by the method of the '951 Publication (the method using an alloy having Al—Si—Ti composition) described in, for example, the Summary of the Invention, above, as a subject to be compared with the present invention. The surface in the axial direction of the AlN whiskers produced by the method of the '951 Publication was confirmed to have irregularities, and the difference between a projection and a depression is several tens of nm on average and is approximately 1 μm in a site having a large difference therebetween. These surface irregularities occurred because, as is evident from FIG. 8 described above, Si that constitutes the composition with Al satisfies the condition under which the interaction energy with Al becomes negative, but does not satisfy the condition under which the absolute value of this interaction energy is larger than the interaction energy between Al and Ge.

Figure 49:
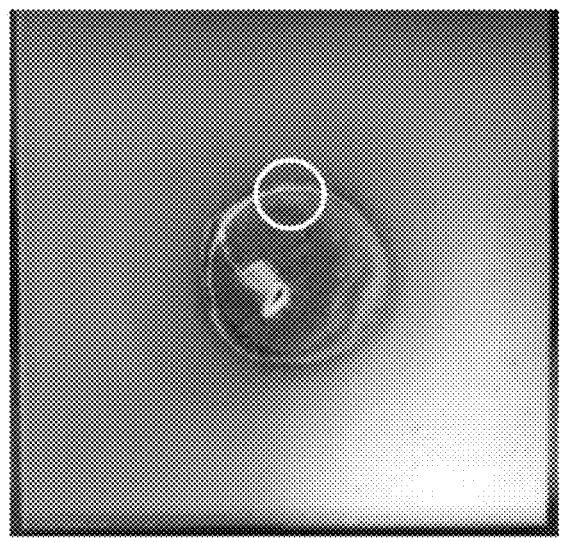
FIG. 49 is a diagram showing an image of photographed AlN whiskers (part 6).
Figure 50:
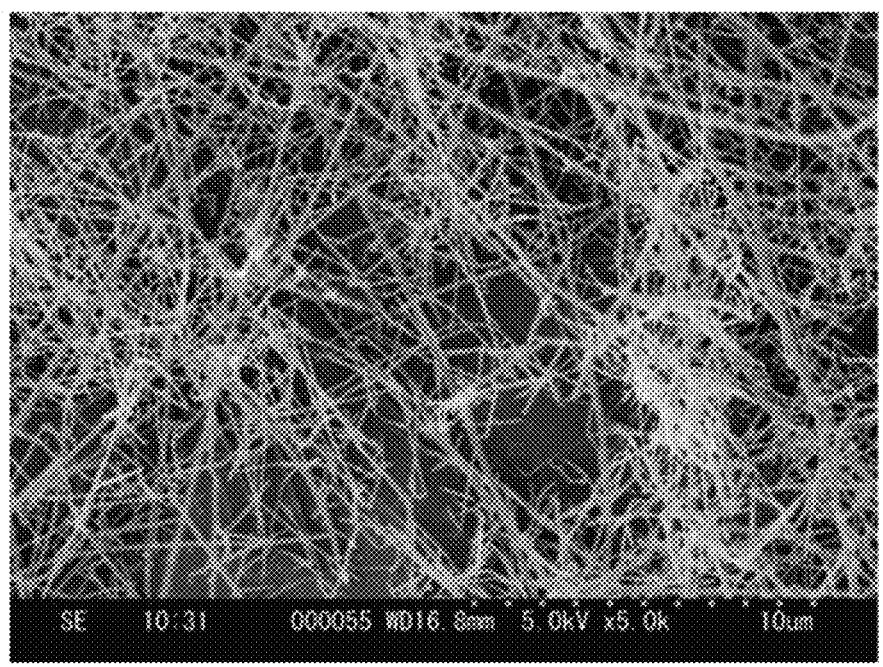
FIG. 50 is a diagram showing an image taken with a scanning electron microscope (part 10).
Figure 51:
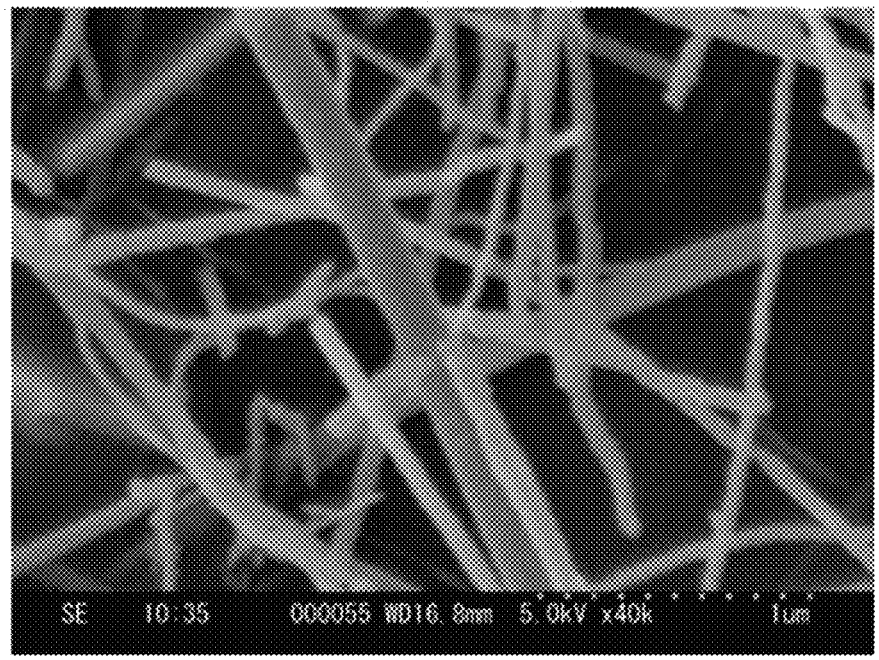
FIG. 51 is a diagram showing an image taken with a scanning electron microscope (part 11).
Figure 52:
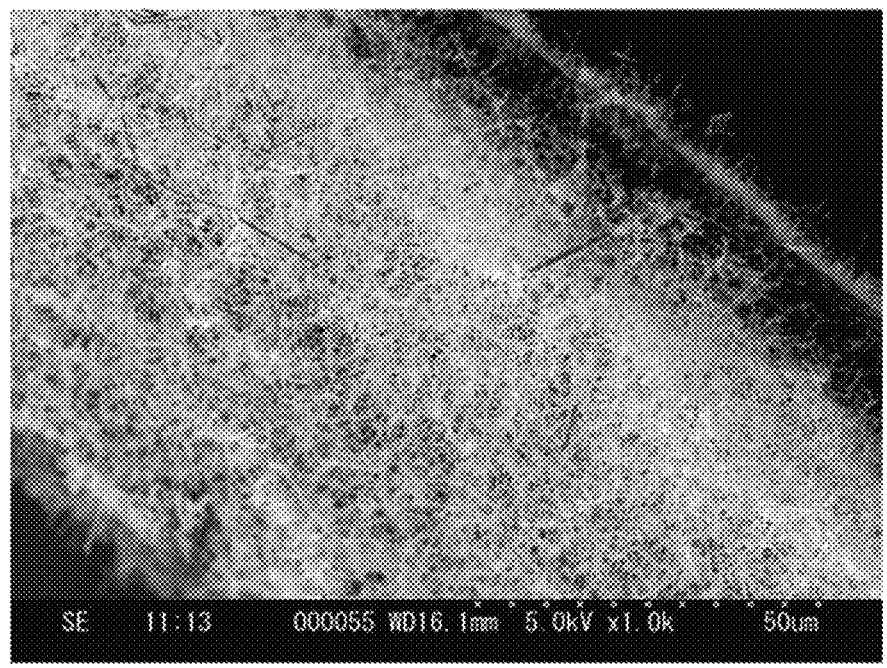
FIG. 52 is a diagram showing an image taken with a scanning electron microscope (part 12).
Figure 53:
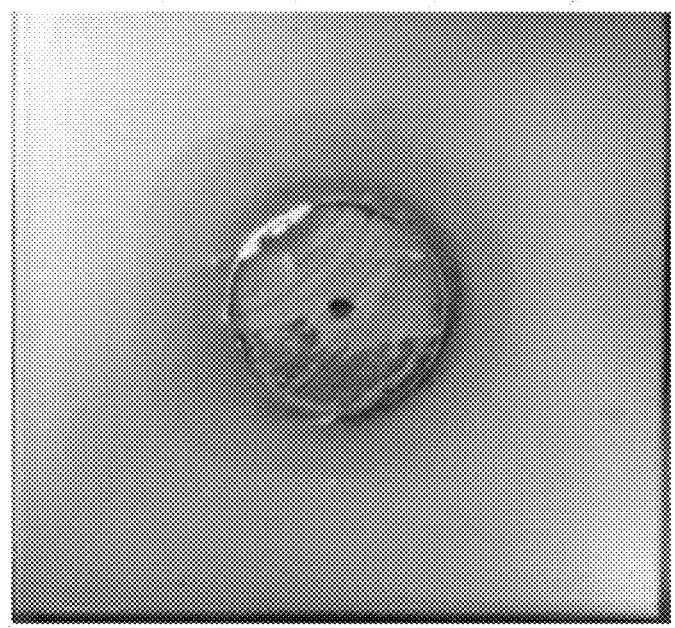
FIG. 53 is a diagram showing an image of photographed AlN whiskers (part 7).
Figure 54:
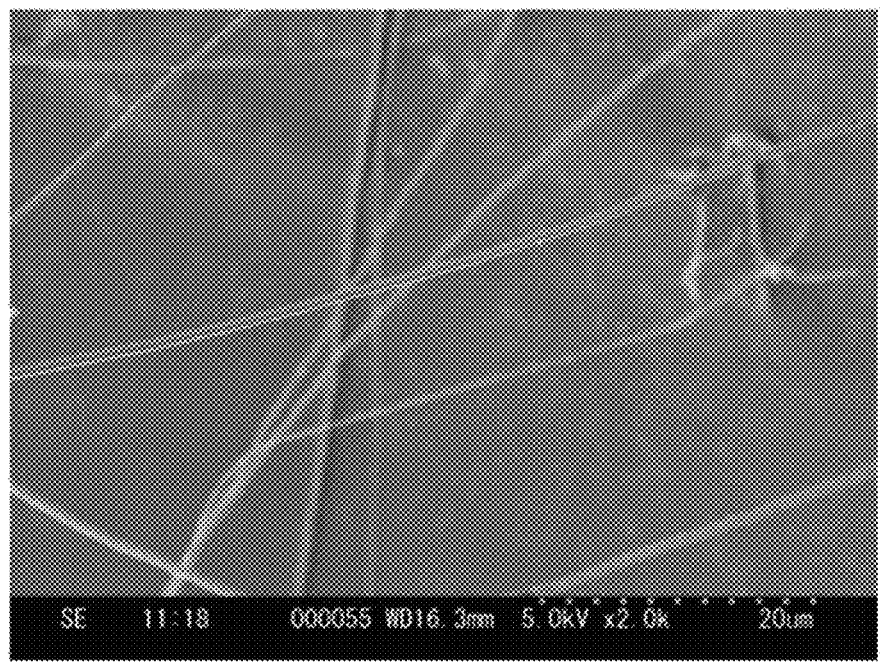
FIG. 54 is a diagram showing an image taken with a scanning electron microscope (part 13).
Figure 55:
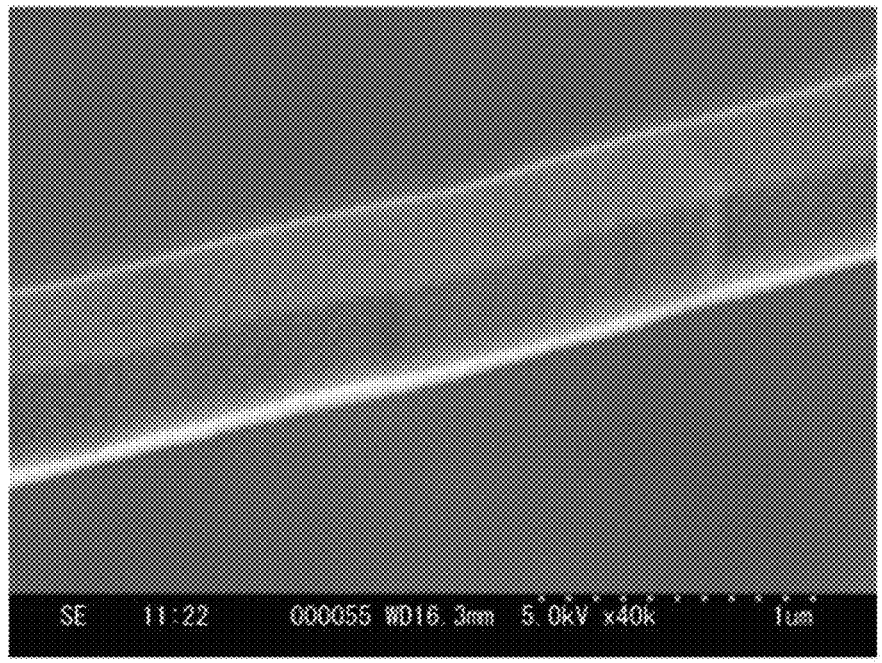
FIG. 55 is a diagram showing an image taken with a scanning electron microscope (part 14).
Figure 56:
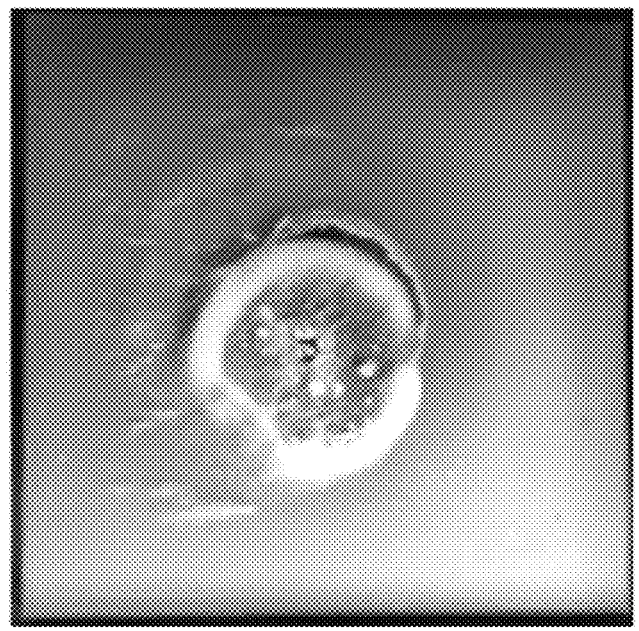
FIG. 56 is a diagram showing an image of photographed AlN whiskers (part 8).
Figure 57:
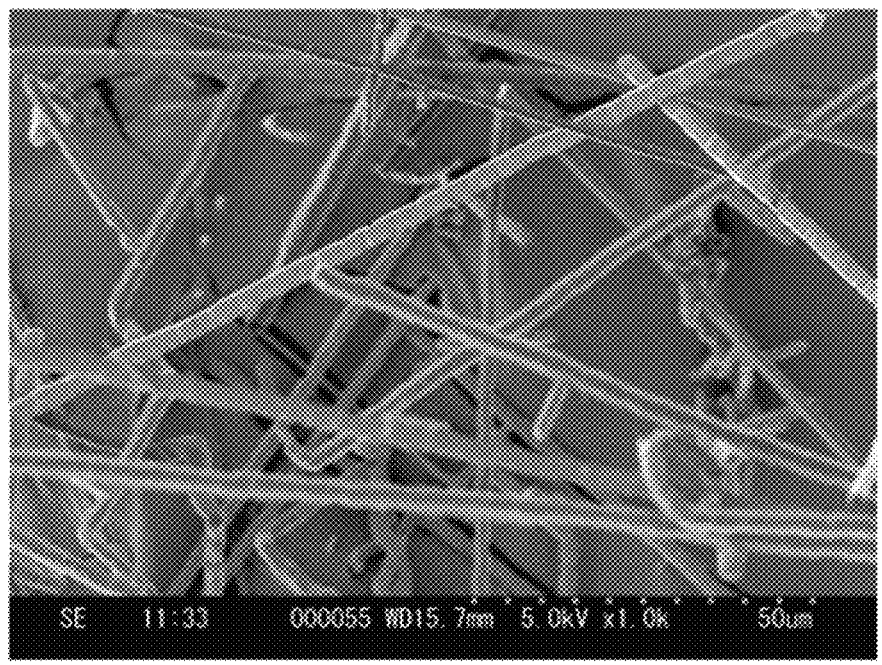
FIG. 57 is a diagram showing an image taken with a scanning electron microscope (part 15).
Figure 58:
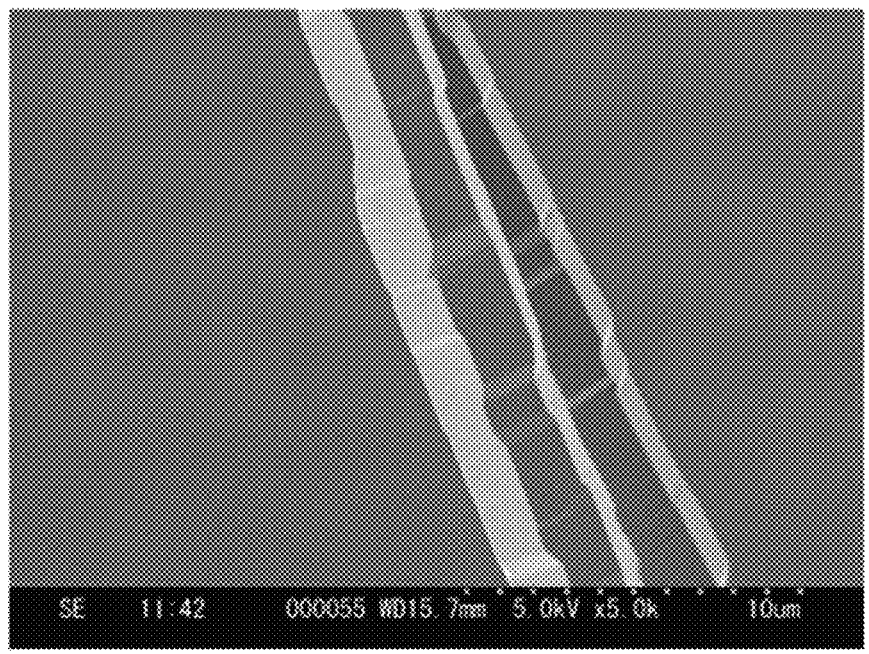
FIG. 58 is a diagram showing an image taken with a scanning electron microscope (part 16).
Figure 59:
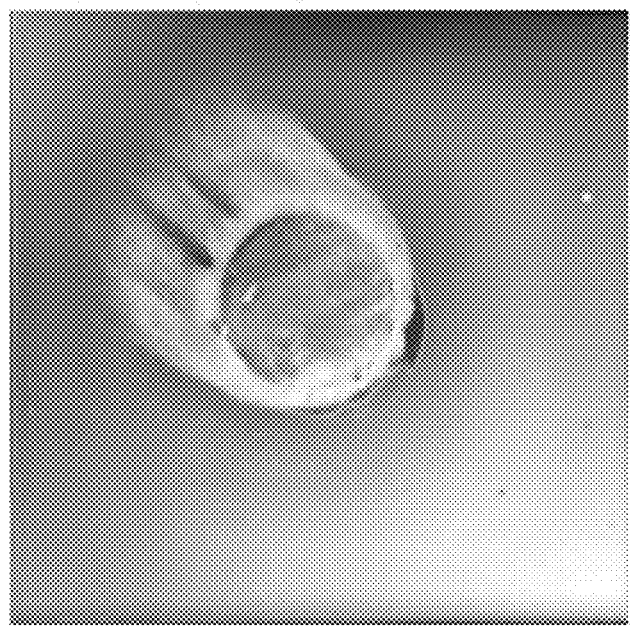
FIG. 59 is a diagram showing an image of photographed AlN whiskers (part 9).
Figure 60:
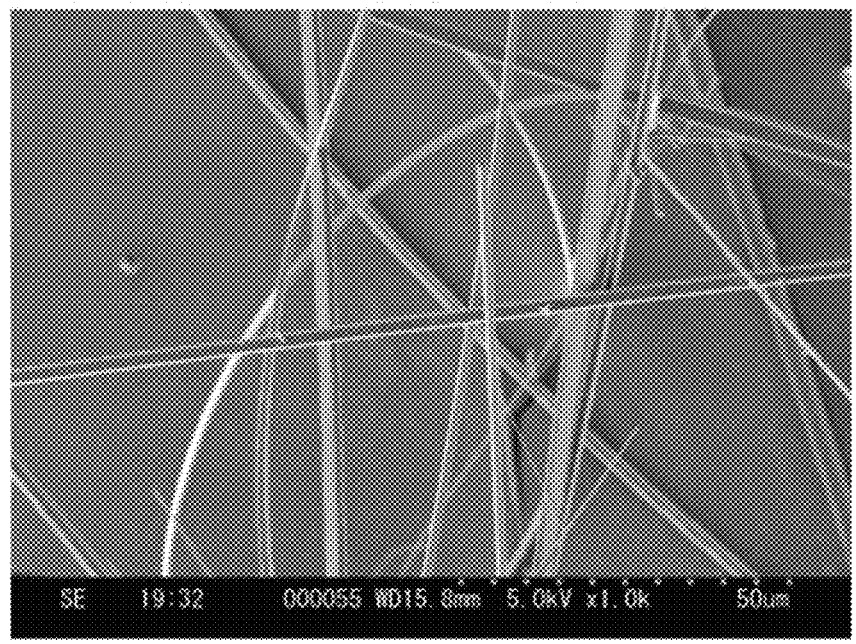
FIG. 60 is a diagram showing an image taken with a scanning electron microscope (part 17).
Figure 61:
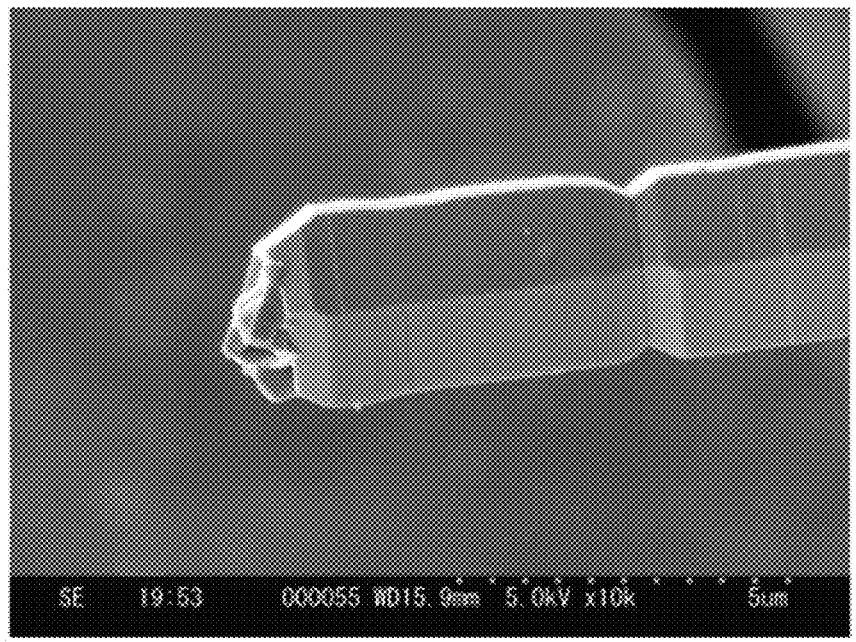
FIG. 61 is a diagram showing an image taken with a scanning electron microscope (part 18).
Figure 62:
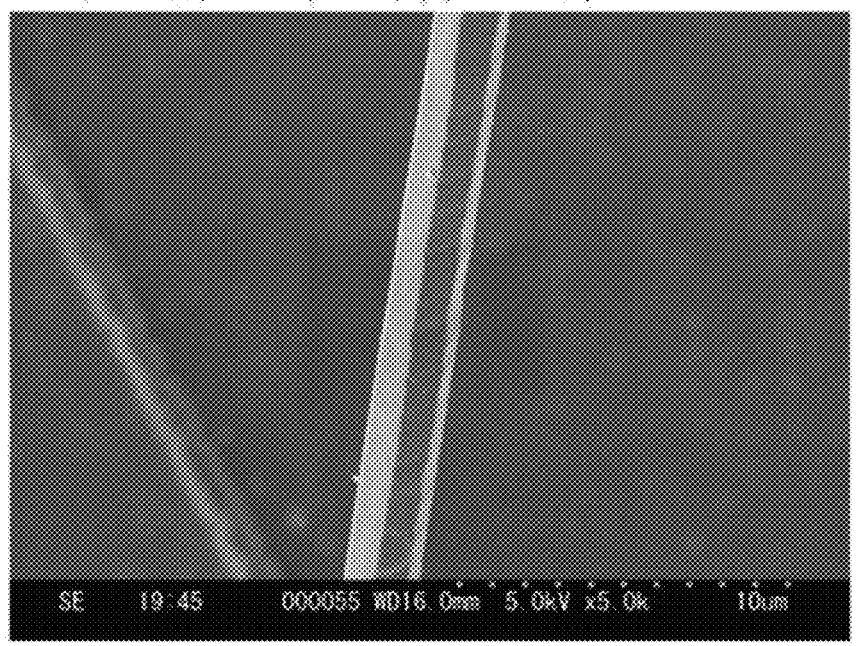
FIG. 62 is a diagram showing an image taken with a scanning electron microscope (part 19).

Each of FIGS. 49 to 75 is an image of AlN whiskers produced by changing the compositional ratio of Al and Fe, the reaction temperature, the metal that constitutes the composition with Al, etc. Each of FIGS. 49 to 51 is an image taken after AlN whisker production under conditions involving Al (60 at %)-Fe (40 at %) composition, a reaction temperature of 1450° C. and a growth time of 2 hours. FIG. 52 is an image taken after AlN whisker production under conditions involving Al (60 at %)-Fe (40 at %) composition, a reaction temperature of 1500° C. and a growth time of 2 hours. Each of FIGS. 53 to 55 is an image taken after AlN whisker production under conditions involving Al (60 at %)-Fe (40 at %) composition, a reaction temperature of 1550° C. and a growth time of 2 hours. Each of FIGS. 56 to 58 is an image taken after AlN whisker production under conditions involving Al (60 at %)-Fe (40 at %) composition, a reaction temperature of 1700° C. and a growth time of 2 hours. Under these conditions, the surface in the axial direction of the AlN whiskers was also confirmed to have few irregularities. Thus, it was confirmed that the Al (60 at %)-Fe (40 at %) composition rarely produces irregularities on the surface in the axial direction of the AlN whiskers under conditions involving a reaction temperature of 1450 to 1700° C. and a growth time of 2 hours.

Figure 63:
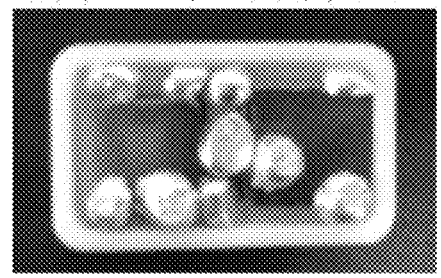
FIG. 63 is a diagram showing an image of photographed metals of Al—Co.
Figure 64:
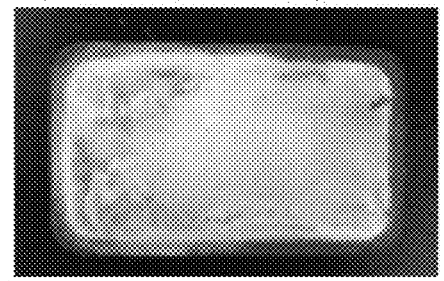
FIG. 64 is a diagram showing an image of photographed AlN whiskers (part 10).
Figure 65:
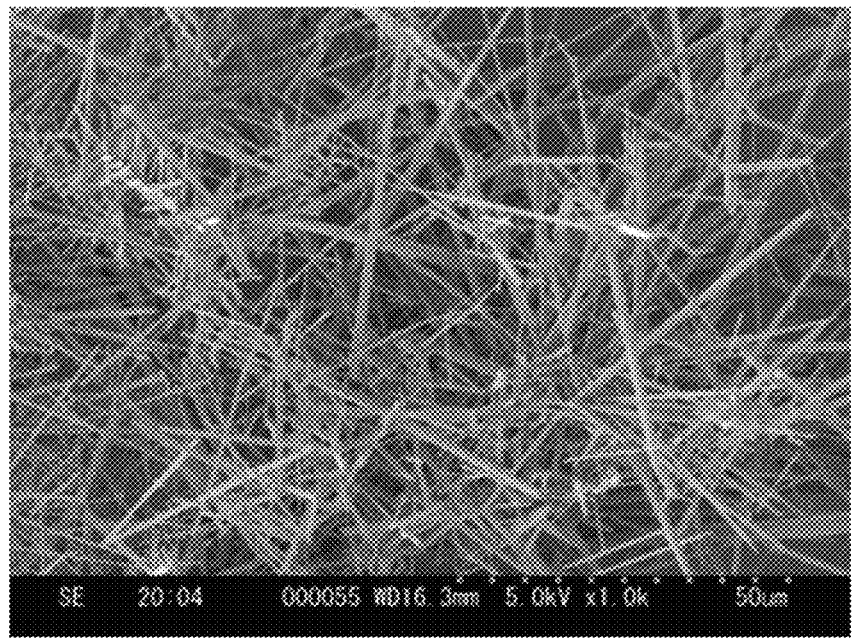
FIG. 65 is a diagram showing an image taken with a scanning electron microscope (part 20).
Figure 66:
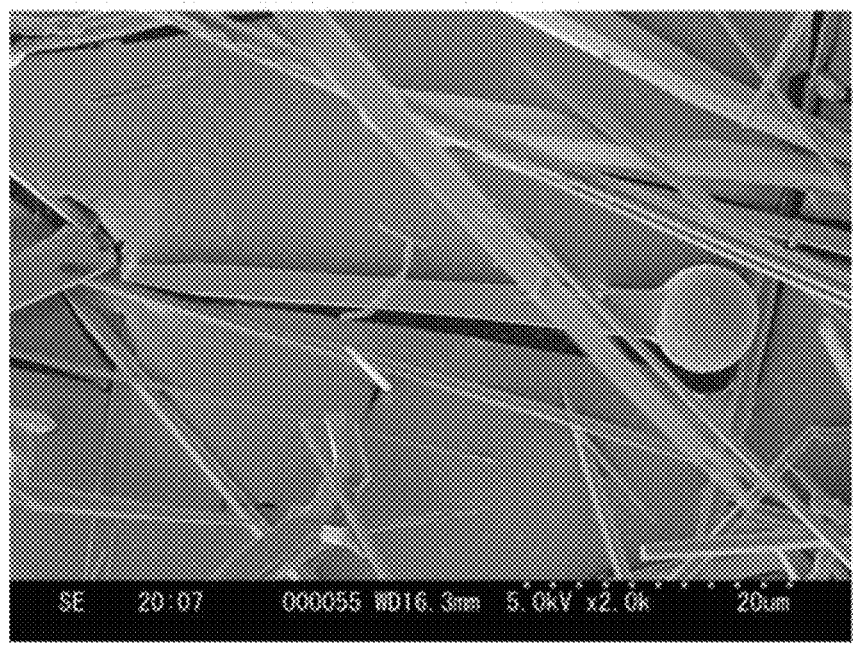
FIG. 66 is a diagram showing an image taken with a scanning electron microscope (part 21).
Figure 67:
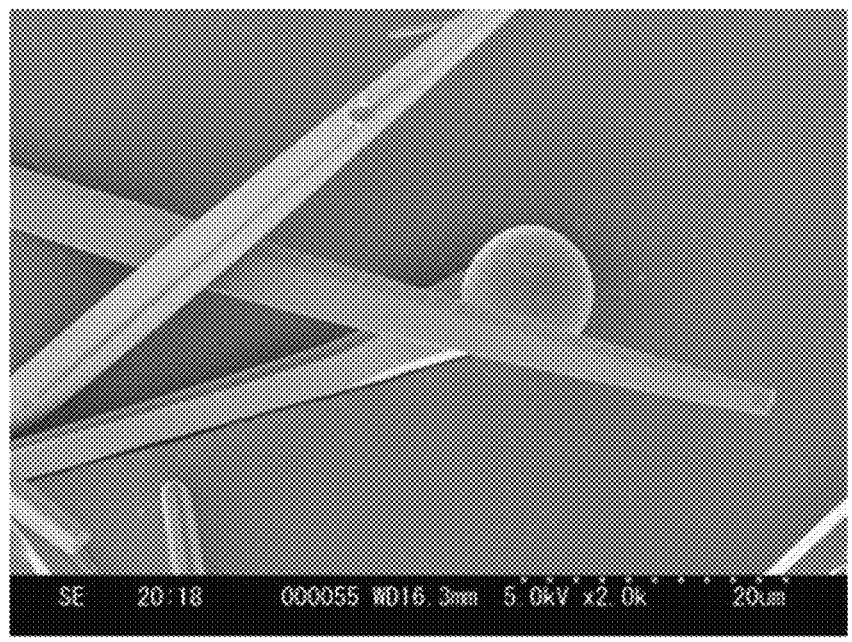
FIG. 67 is a diagram showing an image taken with a scanning electron microscope (part 22).
Figure 68:
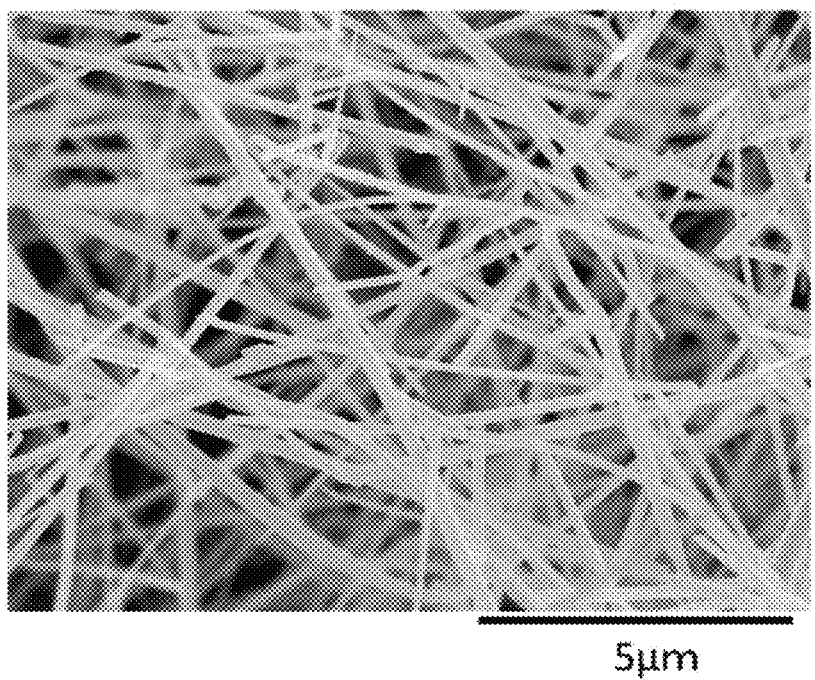
FIG. 68 is a diagram showing an image taken with a scanning electron microscope (part 23).
Figure 69:
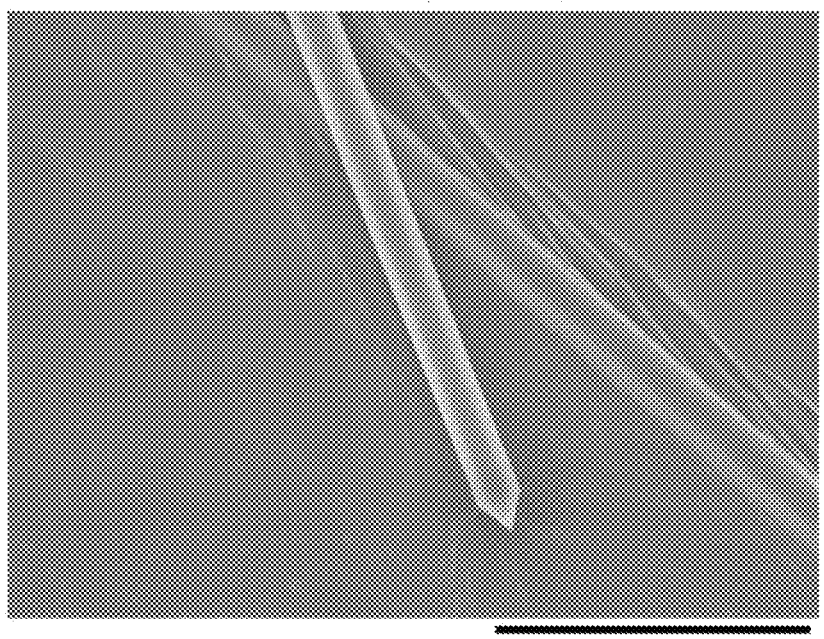
FIG. 69 is a diagram showing an image taken with a scanning electron microscope (part 24).

Each of FIGS. 59 to 62 is an image taken after AlN whisker production under conditions involving Al (30 at %)-Cu (70 at %) composition, a reaction temperature of 1700° C. and a growth time of 2 hours. FIG. 63 is an image obtained by photographing each metal having Al (30 at %)-Co (70 at %) composition. Each of FIGS. 64 to 67 is an image taken after AlN whisker production under conditions involving Al (30 at %)-Co (70 at %) composition, a reaction temperature of 1700° C. and a growth time of 2 hours. Each of FIGS. 68 and 69 is an image taken after AlN whisker production under conditions involving Al (30 at %)-Ni (70 at %) composition, a reaction temperature of 1700° C. and a growth time of 2 hours. Under these conditions, the surface in the axial direction of the AlN whiskers was also confirmed to have few irregularities. Thus, it was confirmed that the use of Cu, Co or Ni instead of Fe as the metal that constitutes the composition with Al also rarely produces irregularities on the surface in the axial direction of the AlN whiskers. This is because Cu, Co or Ni, as with Fe, is the element satisfying the condition under which the interaction energy with Al becomes negative.

Figure 70:
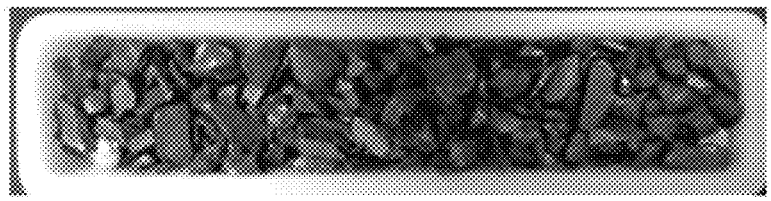
FIG. 70 is a diagram showing an image of photographed metals of Al—Ge.
Figure 71:
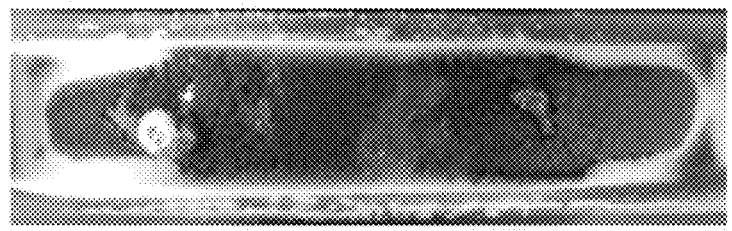
FIG. 71 is a diagram showing an image of photographed AlN whiskers (part 11).
Figure 72:
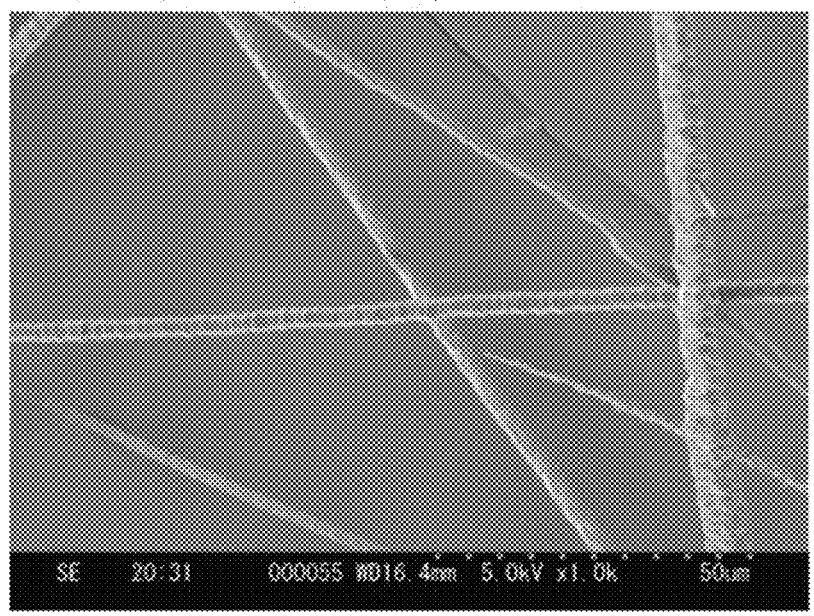
FIG. 72 is a diagram showing an image taken with a scanning electron microscope (part 25).
Figure 73:
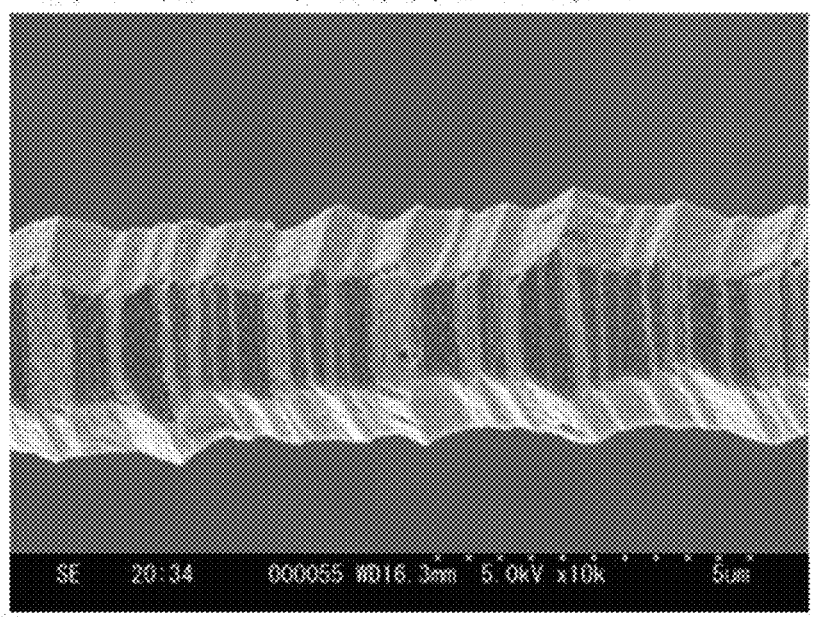
FIG. 73 is a diagram showing an image taken with a scanning electron microscope (part 26).
Figure 74:
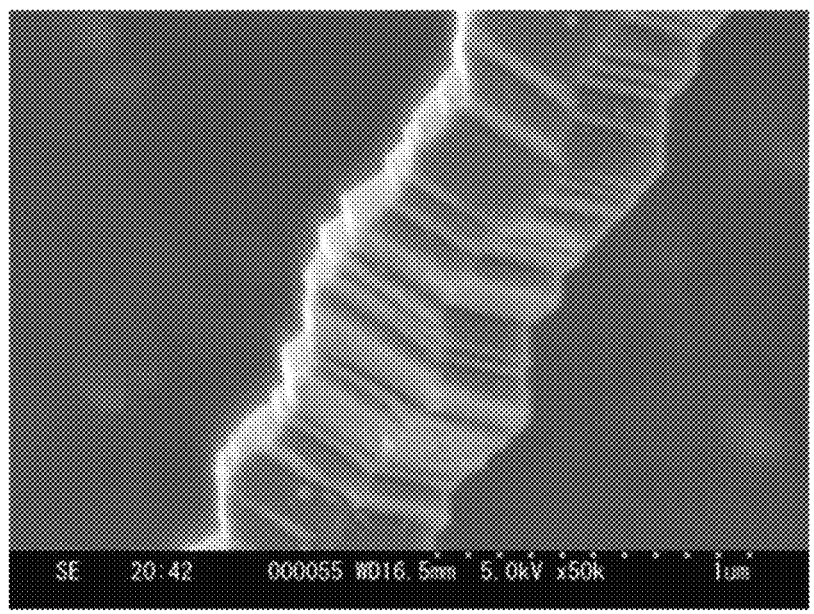
FIG. 74 is a diagram showing an image taken with a scanning electron microscope (part 27).
Figure 75:
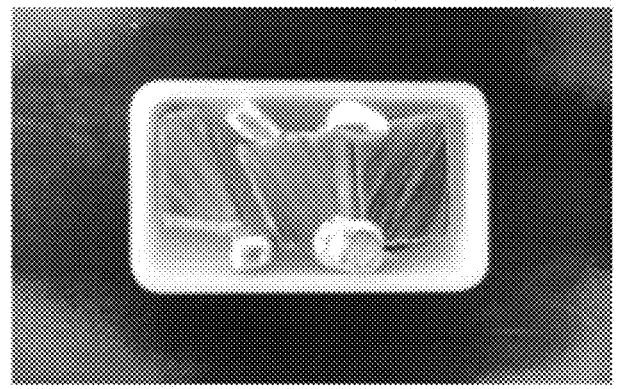
FIG. 75 is a diagram showing an image of photographed metals of Al—Sn.
Figure 76:
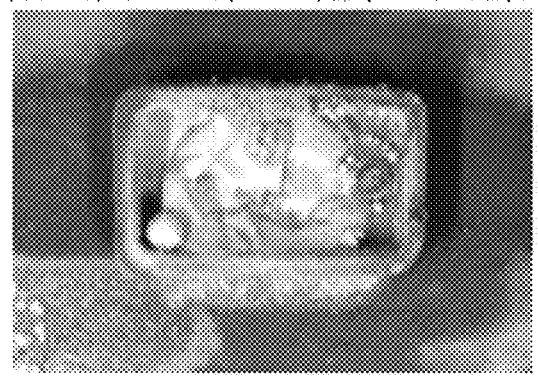
FIG. 76 is a diagram showing an image of photographed AlN whiskers (part 12).
Figure 77:
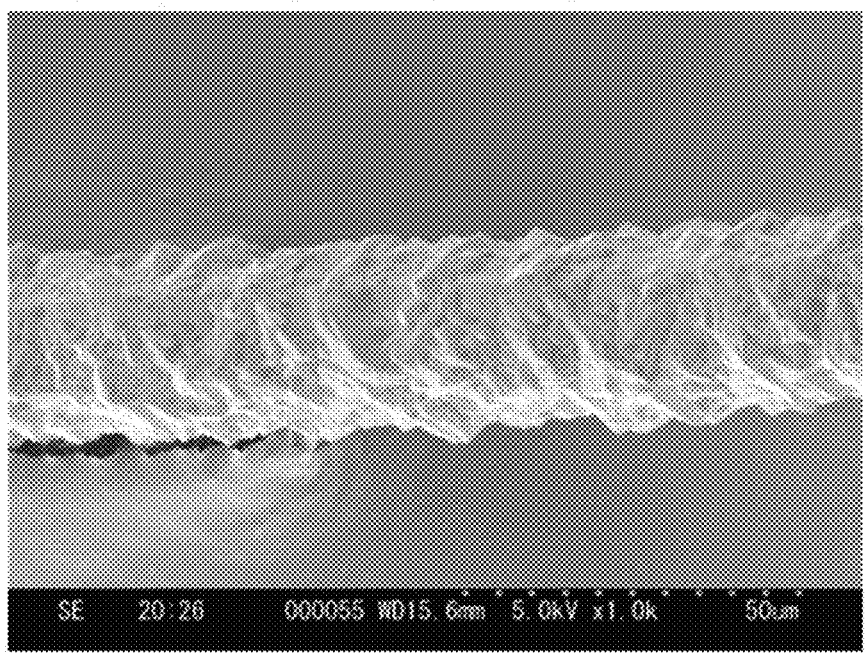
FIG. 77 is a diagram showing an image taken with a scanning electron microscope (part 28).

FIG. 70 is an image obtained by photographing each metal having Al (30 at %)-Ge (70 at %) composition. Each of FIGS. 71 to 74 is an image taken after AlN whisker production under conditions involving Al (30 at %)-Ge (70 at %) composition, a reaction temperature of 1700° C. and a growth time of 2 hours. FIG. 75 is an image obtained by photographing each metal having Al (30 at %)-Sn (70 at %) composition. Each of FIGS. 76 and 77 is an image taken after AlN whisker production under conditions involving Al (30 at %)-Sn (70 at %) composition, a reaction temperature of 1700° C. and a growth time of 2 hours. Under these conditions, unlike use of Cu, Co or Ni as the metal that constitutes the composition with Al, AlN whiskers were confirmed to be produced, and however, the surface in the axial direction of the AlN whiskers was confirmed to have irregularities. This is because unlike Fe, Cu, Co and Ni, Ge or Sn does not satisfy the condition under which the absolute value of the interaction energy is larger than the interaction energy between Al and Ge, though the interaction energy with Al becomes negative.

Figure 78:
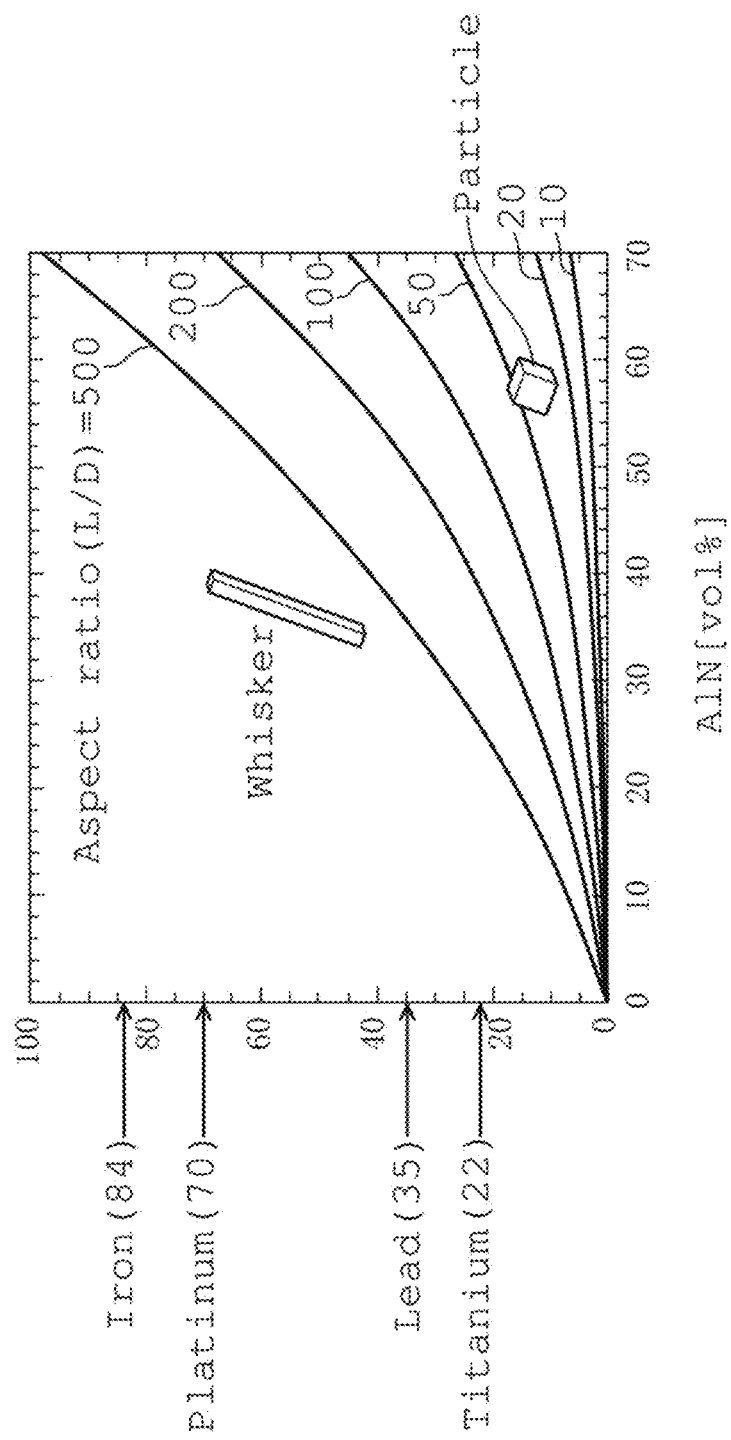
FIG. 78 is a diagram showing the relationship between the amount of AlN whiskers added to a resin and thermal conductivities.

The AlN whiskers thus produced are mixed into, for example, a resin or fat and oil, and used as a composite member having high thermal conductivity and insulation. FIG. 78 shows the relationship between the amount of the AlN whiskers added to a resin and thermal conductivities. The values were calculated on the basis of the Yamada model according to Etsuro Yamada and Terukazu Ota, "Effective Thermal Conductivity of Dispersed Materials," Warme and Stoffübertragung 13 (1980), pages 27-37 (hereinafter "Yamada").

In the Yamada model, thermal conductivities are calculated in the state where AlN whiskers are present in random directions and can be cataloged in terms of the aspect ratio between the diameter and length of AlN. In the case of the same amount of the AlN whiskers added, a larger aspect ratio is found to lead to a higher thermal conductivity. The thermal conductivity (250 to 270 W/mk) of the AlN whiskers is calculated on the basis of the hypothesis that AlN is a single crystal. Approximately 40 vol % of a material having an aspect ratio of approximately 100 (diameter: approximately 1 μm, length: approximately 100 μm) was mixed into each polyethylene resin (thermal conductivity: 0.33 to 0.42 W/mk), followed by molding at approximately 250 to 300° C. under pressure. As a result, the obtained resin mixtures were confirmed to have a thermal conductivity varying from approximately 3 to 10 W/mk. In this case, if the AlN whiskers and the resin are poorly mixed (nonuniformly mixed), the thermal conductivity of a portion rich in the resin is close to the value of the thermal conductivity of the resin itself while the thermal conductivity of a portion rich in the AlN whiskers is close to the value of the thermal conductivity of the AlN whiskers themselves. On the other hand, if the AlN whiskers and the resin are well mixed (uniformly mixed), the thermal conductivity is (converges to) 8 to 9 W/mk. Provided that the AlN whiskers and the resin can be uniformly mixed, the thermal conductivity less varies, and the average value thereof is slightly higher. From the comparison of these results with the Yamada model shown in FIG. 78, it can be concluded that the value was slightly lower than the calculation results of the Yamada model, but was not largely different therefrom. Accordingly, the resin mixture having a desired thermal conductivity can be obtained by changing (adjusting) the aspect ratio, added amount, diameter and length of the AlN whiskers. A resin mixture having a higher thermal conductivity can be obtained by using a resin having a high thermal conductivity (e.g., an alignment material for main-chain liquid crystalline polyester resins, thermal conductivity: approximately 1 W/mk) and mixing the resin having a high thermal conductivity with the AlN whiskers.

Next, the method for mixing the AlN whiskers into the resin will be described.

Step 1: The desired aspect ratio is determined with reference to the Yamada model shown in FIG. 78, and the respective weights of the AlN whiskers and a powdery resin material are measured. In this respect, it is preferred that the AlN whiskers should be surface-treated.

Step 2: These materials are stirred in a kneading machine. In this respect, the internal pressure of the kneading machine can be reduced to thereby efficiently remove air or the like at the contact interface between the resin and the AlN whiskers. Furthermore, a vibration can be applied to the kneading machine from the outside to thereby efficiently mix the materials.

Step 3: The kneaded materials are vacuum-molded into particles while pressed at a temperature that partially melts the resin. Subsequently, a desired product is filled with the vacuum-molded materials in a particle form.

Hereinafter, some specific purposes of use of the resin mixture containing the AlN whiskers will be illustrated.

Figure 79A:
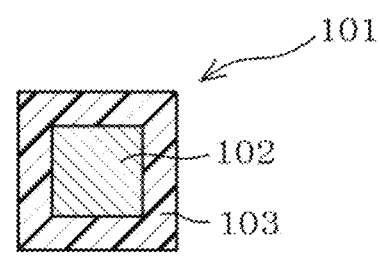
FIGS. 79A and 79B illustrate two embodiments of an electric wire with differing cross sections.
Figure 79B:
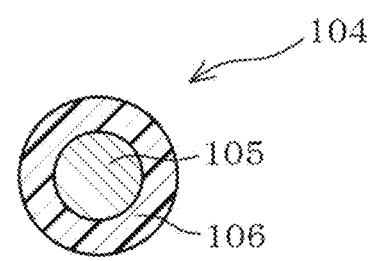

FIG. 79 shows an aspect in which the resin mixture (organic compound) containing the AlN whiskers is used as a covering member for an electric wire. An electric wire 101 shown in FIG. 79(*a*) is configured such that a copper or aluminum wire rod 102 having a square cross section is covered with a resin mixture 103. An electric wire 104 shown in FIG. 79(*b*) is configured such that a copper or aluminum wire rod 105 having a circular cross section is covered with a resin mixture 106. Heretofore, enamel paint has been applied around a wire rod, or scales of mica have been mixed into enamel paint for heat-resistant wires. By contrast, in the present invention, the resin mixture 103 or 106 containing the AlN whiskers is adopted instead of the enamel paint. Therefore, thermal conductivity better than ever can be expected by the amount (weight) of mica added smaller than the conventional one. In short, in the case of applying the same current, the approach of the present invention can suppress a rise in the temperature of the wire rod 102 or 105 as compared with the conventional approach. If the wire rod of the present invention and the conventional wire rod have temperature resistant properties for the same temperature, larger current can be applied to the wire rod of the present invention.

Figure 80:
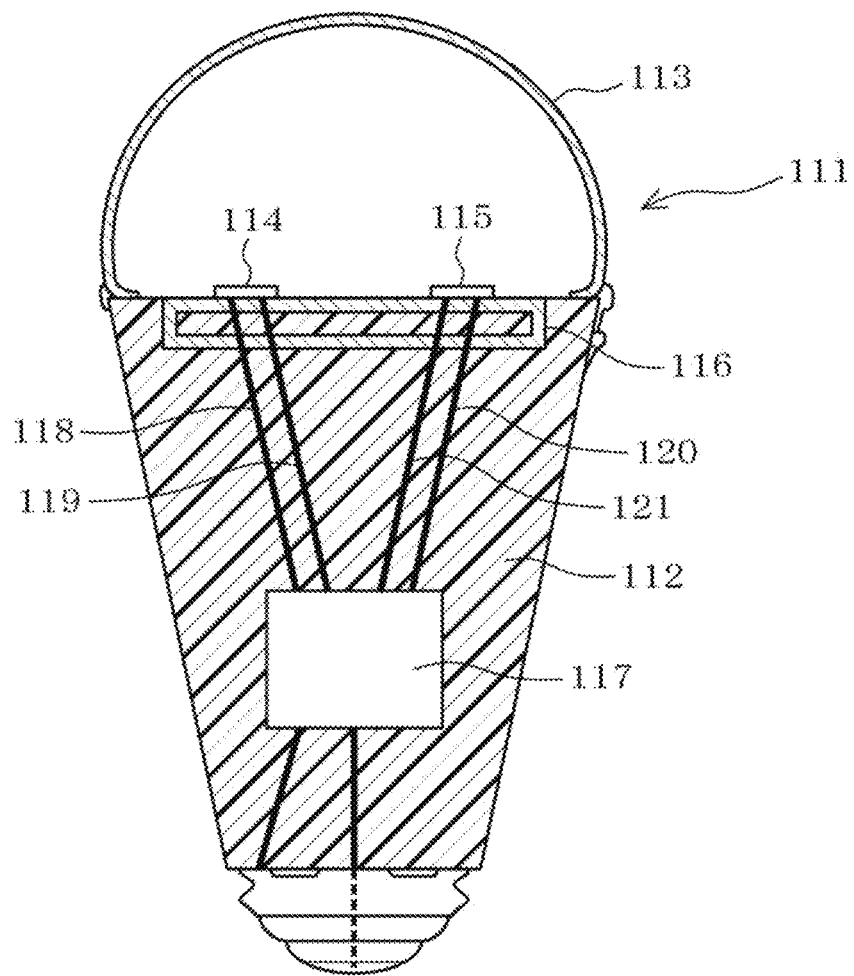
FIG. 80 is a diagram showing the cross section of a light bulb.

FIG. 80 shows an aspect in which the resin mixture containing the AlN whiskers is used as a member for a light bulb. A LED light bulb 111 shown in FIG. 80 is configured such that a glass cover 113 is attached to a resin mixture 112, and two LED elements (114 and 115) are implemented on a resin substrate 116. The resin mixture 112 contains the AlN whiskers, and the AlN whiskers are also mixed in the resin substrate 116. The LED element 114 is supplied with power from a power supply substrate 117 via electric wires 118 and 119 to emit light. The LED element 115 is supplied with power from the power supply substrate 117 via electric wires 120 and 121 to emit light. Upon light emission of the LED elements 114 and 115, heat generated from the LED elements 114 and 115 is transferred to the resin mixture 112 via the resin substrate 116 and released (dissipated) from the resin mixture 112 into the atmosphere. The surface of the resin mixture 112, i.e., the portion that comes into contact with the atmosphere, preferably has a concavo-convex shape that facilitates dissipating heat.

Heretofore, the glass cover has been attached to an aluminum alloy. By contrast, in the present invention, the resin mixture 112 containing the AlN whiskers is adopted instead of the aluminum alloy. Therefore, the whole weight can be reduced. The aluminum alloy is effective in terms of heat dissipation, but is inferior in insulation performance. Therefore, the aluminum alloy transfers heat via an insulating plate or the like. Hence, thermal conductivity is inhibited at the insulating portion, or the structure is complicated due to the increased number of components. By contrast, such problems do not arise in the present invention.

Figure 81:
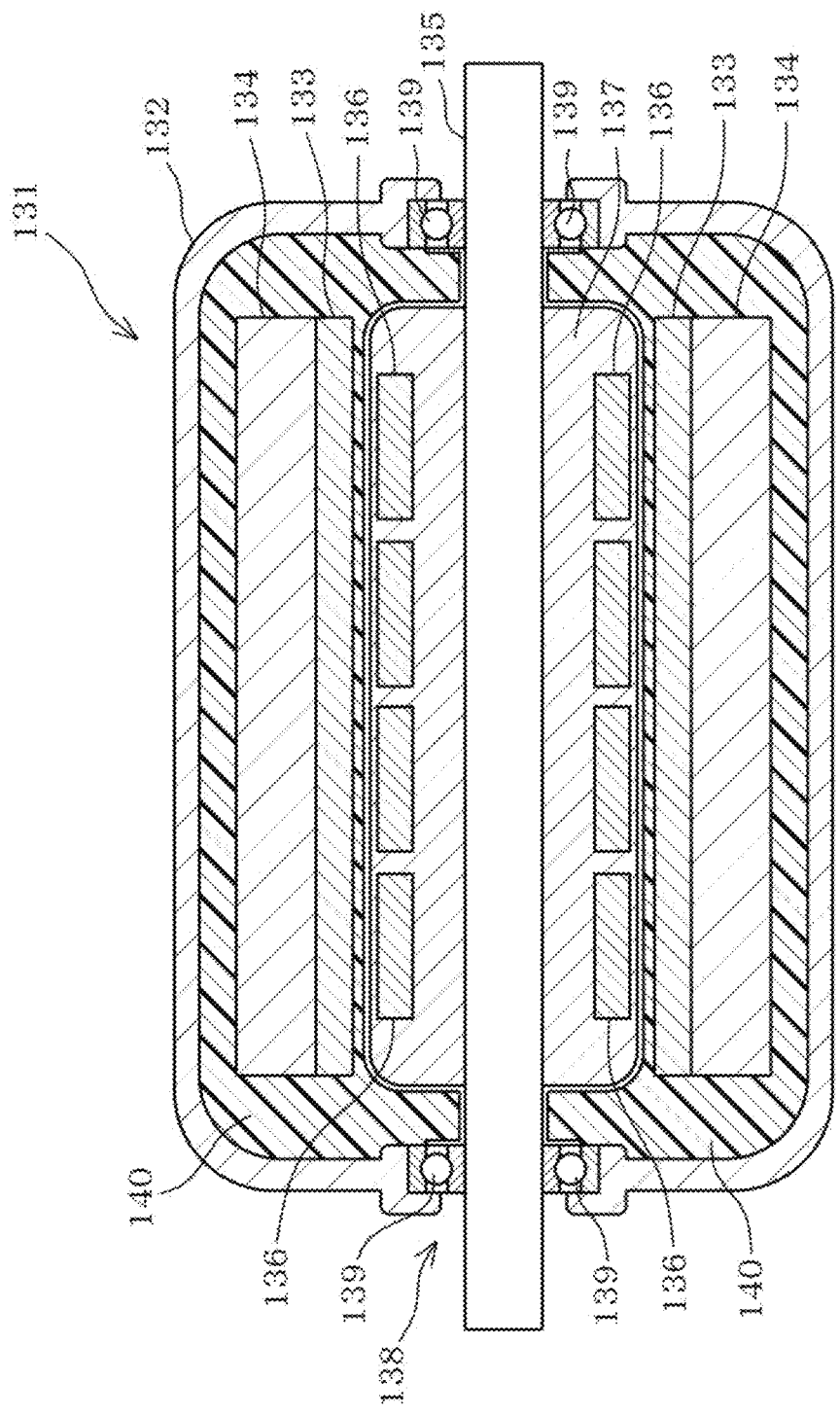
FIG. 81 is a diagram showing the cross section of a motor.

FIG. 81 shows an aspect in which the resin mixture containing the AlN whiskers is used as a member for a motor. A motor 131 shown in FIG. 81 is configured such that an iron core material 133 and a coil 134 are disposed in the inside of a housing 132, and a rotor 138 comprising a shaft 135 and a magnet 136 integrated with an axis 137 for magnet mounting is rotatably supported by a bearing 139. A resin mixture 140 containing the AlN whiskers is filled between the rotor 138 and the inner wall of the housing 132. In the case of, for example, a motor for HEV (hybrid electric vehicle), a motor of several tens to several hundreds of kW is adopted, and approximately 70 to 80% of supplied power serves as motivity to generate heat of 0 to 30 kW.

Heretofore, an insulating oil has been used for releasing heat generated in the inside of the motor 131 to the outside, and the motor 131 has been cooled by discharging the insulating oil to the outside of the motor 131, cooling the insulating oil with a heat exchanger, and injecting (circulating) the cooled insulating oil again to the motor 131. By contrast, in the present invention, the resin mixture 140 containing the AlN whiskers is adopted instead of the insulating oil. This eliminates the need of preparing a heat exchanger outside the motor 131 and releases heat generated in the inside of the motor 131 to the outside via the housing 132. Such elimination of the need of a heat exchanger can be expected to achieve a compact structure or cost reduction. Also, effects equivalent to the scheme of circulating the insulating oil can be expected provided that a resin mixture obtained by mixing, for example, AlN whiskers having a thermal conductivity of approximately 20 W/mk into a polyimide resin (decomposition temperature: 500° C. or higher) can be filled thereto and a radiation fin can be attached to the housing 132. The magnet 136 generally tends to exhibit decrease in magnetic force at Curie temperature or higher. For example, the Curie temperature of a NdFe magnet is 330° C., and the NdFe magnet has the properties of deteriorating its magnetic force at this temperature or higher. By contrast, the deterioration in the magnetic force of the NdFe magnet can be prevented even at or around its Curie temperature 330° C. by adopting a resin mixture obtained by mixing, for example, AlN whiskers having a thermal conductivity of approximately 20 W/mk, for example, into a polyimide resin.

Figure 82A:
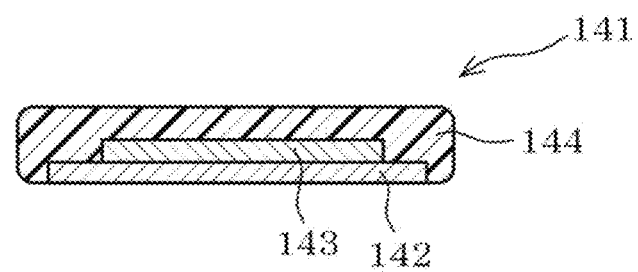
FIGS. 82A and 82B are diagrams of two embodiments of an electronic component (part 1) with differing cross sections.
Figure 82B:
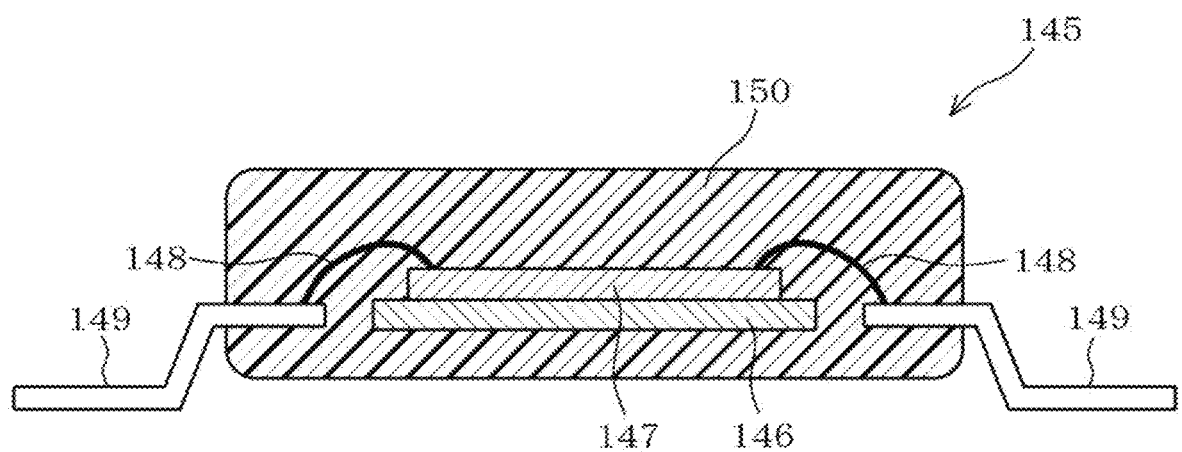

FIG. 82 shows an aspect in which the resin mixture containing the AlN whiskers is used as a member for an electronic component. An electronic component 141 shown in FIG. 82(a) is configured such that, for example, Si or GaAs semiconductor element 143 implemented on a substrate 142 is molded with a resin mixture 144. An electronic component 145 shown in FIG. 82(b) is configured such that a semiconductor element 147 implemented on a substrate 146 is molded, together with a portion of a wire 148 and a pin 149, with a resin mixture 150. The electronic component 145 is produced by the following steps: the semiconductor element 147 is implemented onto the substrate 146, and the semiconductor element 147 and the pin 149 are connected through the wire 148 (electrically connected by wire bonding). In this state where the semiconductor element 147 and the pin 149 are connected through the wire 148, the melted resin mixture 150 is injected into the mold while the mold is heated. In this operation, the resin mixture 150 is injected into the whole mold in vacuum so as not to form space (so as not to leave air bubbles). Then, the resin mixture 150 is cured by cooling and then taken out of the mold, together with the semiconductor element 147, etc. In this case, it is preferred that the AlN whiskers used should have a length having no chance to cut the wire 148, preferably, a length of for example, several to 100 μm. In the case of energization with the same power, use of a resin mixture 150 having a thermal conductivity of approximately 20 W/mk can drastically lower the temperature of the semiconductor element as compared with use of a conventional epoxy resin (e.g., thermal conductivity: approximately 0.1 to 0.5 W/mk).

Figure 83A:
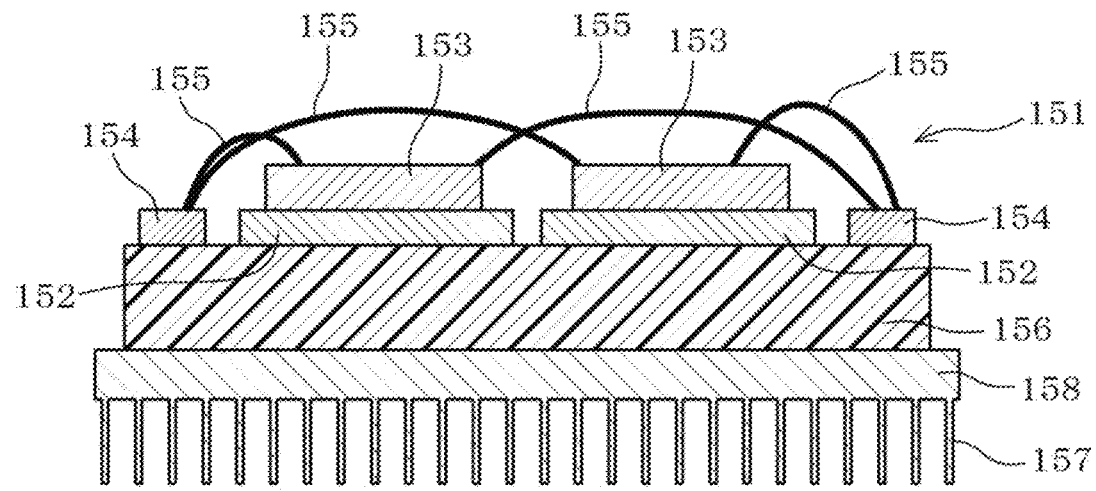
FIGS. 83A and 83B are cross sections of two embodiments of an electronic component (part 2) with differing constructions.
Figure 83B:
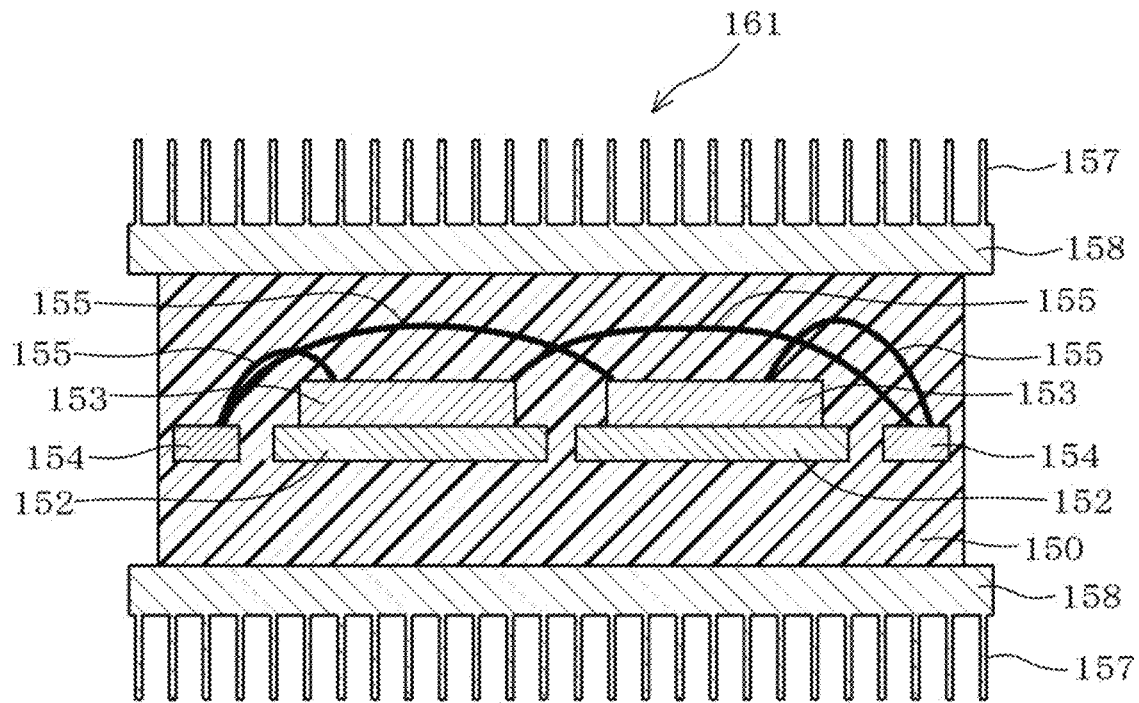

FIG. 83 also shows an aspect in which the resin mixture containing the AlN whiskers is used as a member for an electronic component. An electronic component 151 shown in FIG. 83(a) is a power card for use in HEV or the like and is an instrument having the function of converting voltage or the function of converting direct current to alternating current. An IGBT element 153 is implemented on a substrate 152. The IGBT element 153 and an electrode 154 are electrically connected through a wire 155. The electronic component 151 is produced by the following steps: the IGBT element 153 is implemented onto the substrate 152, and the IGBT element 153 and the electrode 154 are connected through the wire 155 (electrically connected by wire bonding). In this state where the IGBT element 153 and the electrode 154 are connected through the wire 155, a melted resin mixture 156 is injected into the mold while the mold is heated. In this operation as well, the resin mixture 156 is injected into the whole mold in vacuum so as not to form space (so as not to leave air bubbles). Then, the resin mixture 156 is cured by cooling and then taken out of the mold, together with the IGBT element 153, etc. In this case, it is also preferred that the AlN whiskers used should have a length having no chance to cut the wire 155, preferably, a length of for example, several to 100 μm. Then, a radiation fin 158 having many blades 157 is jointed to the resin mixture 156.

Heretofore, an IGBT element having copper-plated surface has been mounted on a substrate, and the IGBT element and an electrode have been connected by wire bonding and fixed with an epoxy resin. In this respect, the epoxy resin has been prevented from remaining on the copper-plated surface; silicone grease having a high thermal conductivity (thermal conductivity: approximately 1 to 3 W/mk) has been applied to the copper-plated surface; ceramic plate (thermal conductivity: approximately 30 to 36 W/mk) and silicon nitride plate (thermal conductivity: approximately 30 to 80 W/mk) materials have been attached thereon; silicone grease has been further applied thereto; and an aluminum heat exchanger has been attached thereto. By contrast, the approach of the present invention can eliminate the need of silicone grease, a ceramic plate, a silicon nitride plate, copper plating, etc., and can simplify the structure. When a resin mixture 156 containing the AlN whiskers and having a thermal conductivity of, for example, 20 W/mk is used at a thickness of 0.3 to 0.5 mm, the heat discharge is equivalent to or higher than that of the configuration using a silicon nitride plate. In the electronic component 151 shown in FIG. 83(a), the radiation fin 158 is jointed on only one side (on the lower side in FIG. 83). The radiation fin 158 may be jointed on both sides (on the lower and upper sides in FIG. 83), as in an electronic component 161 shown in FIG. 83(b).

Figure 84A:
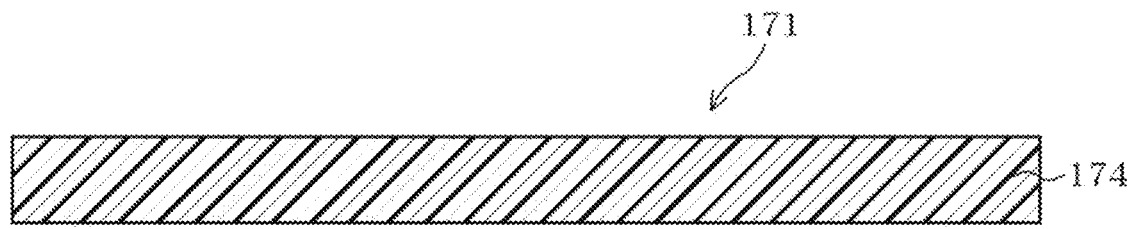
FIGS. 84A, 84B, and 84C are diagrams showing the cross sections of three embodiments of a printed circuit board (part 1) with differing constructions.
Figure 84B:
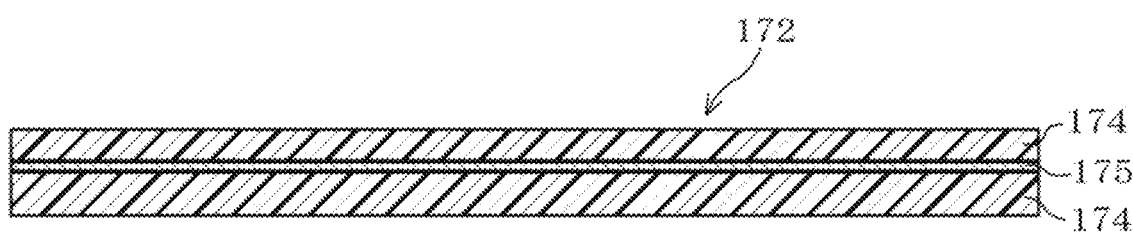
Figure 84C:
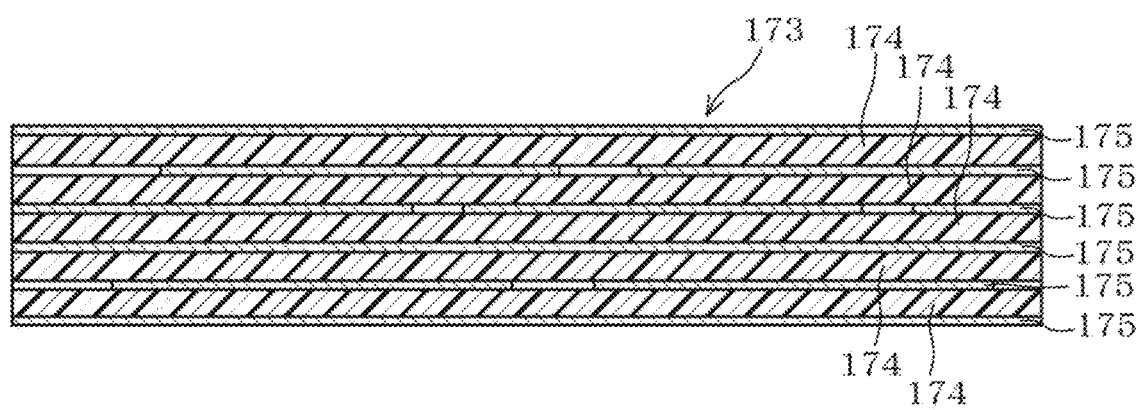

FIG. 84 shows an aspect in which the resin mixture containing the AlN whiskers is used as a member for a printed circuit board. A printed circuit board 171 shown in FIG. 84(a) is composed of a resin mixture 174 containing the AlN whiskers as a simple substance. A printed circuit board 172 shown in FIG. 84(b) is configured such that a resin mixture 174 is jointed to a conductor part 175 made of copper foil or aluminum foil. A printed circuit board (multilayer substrate) 173 shown in FIG. 84(*c*) is configured such that resin mixtures 174 are jointed to multiple layers of conductor parts 175.

Figure 85:
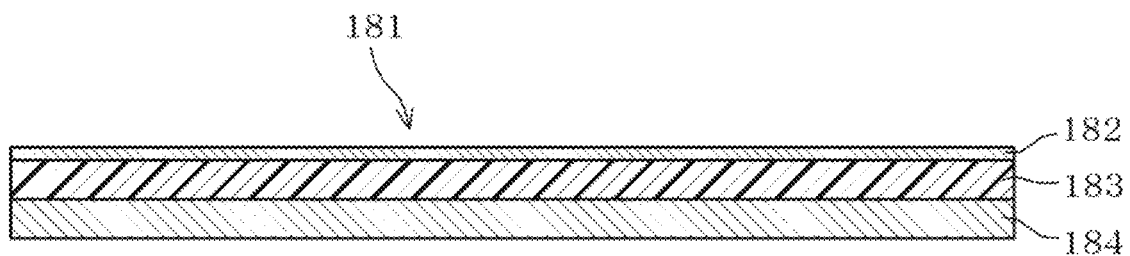
FIG. 85 is a diagram showing the cross section of a printed circuit board (part 2).

Heretofore, a printed circuit board has been formed by mixing glass fibers into an epoxy resin. In this case, heat dissipation is hardly taken into consideration and is approximately 0.01 to 0.1 W/mk in terms of a thermal conductivity, though insulation is secured. By contrast, in the present invention, the resin mixture 174 containing the AlN whiskers can be used to produce a printed circuit board having a thermal conductivity of, for example, 20 W/mk. Since many holes are opened in the printed circuit boards 171 to 173, it is preferred to fill relatively short AlN whiskers therein. Such filling of the relatively short AlN whiskers can prevent reduction in thermal conductivity while facilitating opening holes. The printed circuit board 173, which is a multilayer substrate, is produced by the following steps: the AlN whiskers are introduced into an epoxy resin, which is then prepared into a preliminary molded article in a thin sheet form or plate form. Copper foil or a copper plate (or aluminum foil or an aluminum plate) is jointed onto the preliminary molded article, and unnecessary portions on the copper foil or the copper plate are removed. A plurality of such layers are stacked, then cured by pressing under heating at a predetermined temperature, and cooled. A printed circuit board 181 shown in FIG. 85 is configured such that aluminum foil 182, a resin mixture 183 containing the AlN whiskers and a copper plate 184 are jointed.

Figure 86:
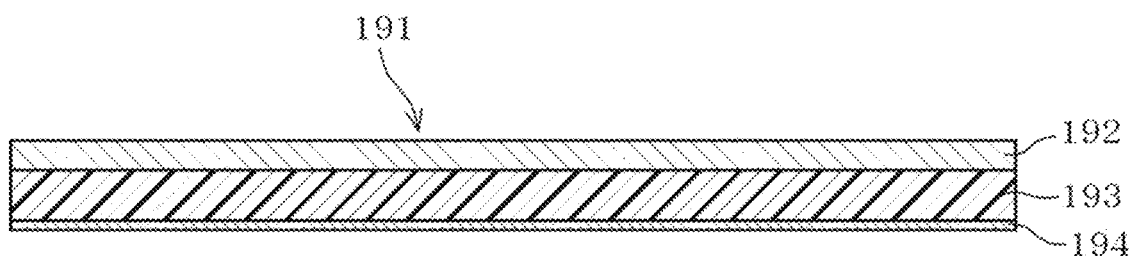
FIG. 86 is a diagram showing the cross section of a sheet.

FIG. 86 shows an aspect in which the resin mixture containing the AlN whiskers is used as a member for a sheet. A sheet 191 is configured such that a thermally conductive acrylic sheet 192, a resin mixture 193 containing the AlN whiskers and a film liner are jointed. Heretofore, a thermally conductive low-hardness acrylic layer has been jointed below a thermally conductive acrylic resin (non-viscous), and a film filler has been further jointed therebelow. By contrast, in the present invention, a thermally conductive low-hardness acrylic resin is used, and the AlN whiskers are mixed into the thermally conductive low-hardness acrylic resin. The length of the AlN whiskers is preferably several to 100 μm, and the amount of the AlN whiskers added is preferably, for example, approximately 40 wt % or lower. AlN whiskers added in an amount larger than necessary significantly reduce viscosity.

Figure 87:
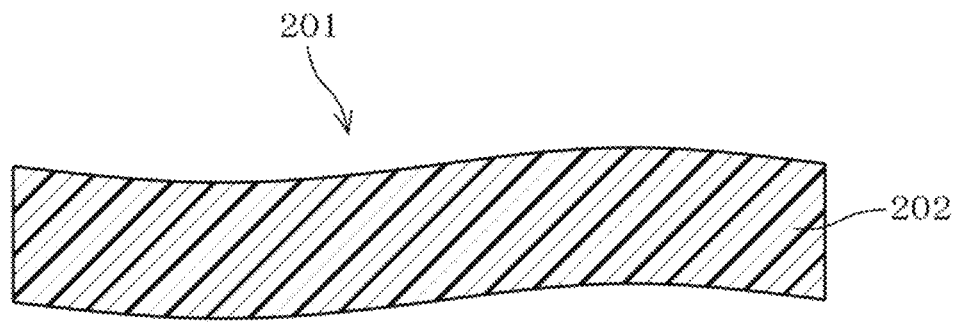
FIG. 87 is a diagram showing grease.

FIG. 87 shows an aspect in which the AlN whiskers are contained in a fat and oil mixture (organic compound). Grease 201 (fat and oil mixture) is a silicone resin 202 in which the AlN whiskers are mixed. The length of the AlN whiskers to be mixed into the silicone resin is preferably several to several tens of μm. Longer AlN whiskers are unsuitable because these AlN whiskers increase a coating thickness when applied thereto. Since the mixing of the AlN whiskers enhances viscosity, it is difficult to mix the AlN whiskers in a large amount. Approximately 40 wt % of the AlN whiskers can achieve a thermal conductivity of approximately 10 W/mk.

Figure 88:
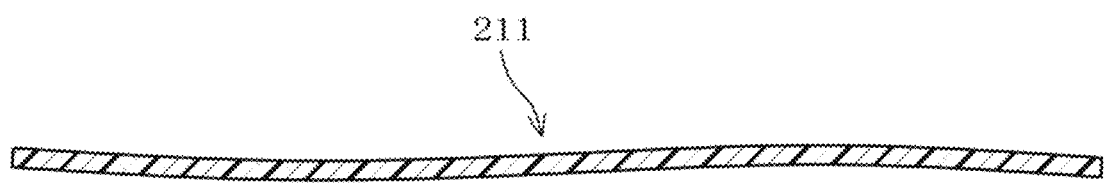
FIG. 88 is a diagram showing the cross section of paper.

FIG. 88 shows an aspect in which the AlN whiskers are mixed in paper. Such paper is produced by steps given below. First, cellulose fibers serving as a raw material for paper 211 are dissolved in water. Then, the surface of the AlN whiskers is coated with a film that prevents reaction with water. Then, the AlN whiskers are added at approximately several to 50% (vol %) with respect to the amount of the cellulose fibers in the solution containing the cellulose fibers dissolved in water, and an organic paste (paste material such as methylcellulose) serving as a binder is added thereto at approximately several to 5% (which is a ratio to the total amount of the cellulose fibers and the AlN whiskers). Then, the solution is uniformly mixed by stirring and strained through a net-like filter to decrease the water content as much as possible. In this case, the paper 211 is thickened with increase in the number of runs to strain the solution. Therefore, the desired thickness is achieved by adjusting the number of runs to strain the solution. Then, the material is taken out of the filter, made into paper, dried and then rewound in a roll form. The paper 211 in which the AlN whiskers are mixed is used for purposes that require insulation and require thermal conductivity. The paper 211 is used for a purpose, for example, capacitor paper for condensers. Also, the paper 211 is used for a purpose as flame-retardant paper.

Figure 89:
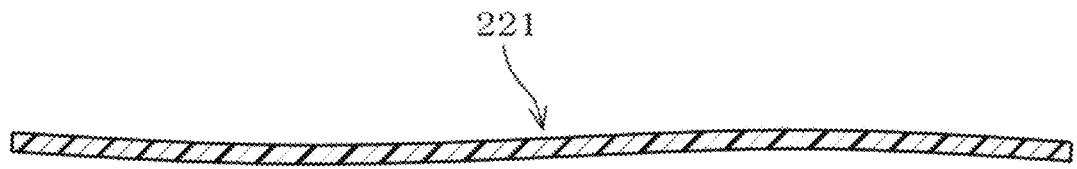
FIG. 89 is a diagram showing the cross section of a nonwoven fabric.

FIG. 89 shows an aspect in which the AlN whiskers are mixed in a fiber. Such a fiber is produced by steps given below. First, a material serving as a raw material for a fiber (e.g., an organic chemical fiber) 221 is dissolved in water or an organic solvent. Then, the surface of the AlN whiskers is coated with a film that prevents reaction with water. Then, the AlN whiskers are added at approximately several to 50% (vol %) with respect to the amount of the material serving as a raw material for the fiber in the solution containing the material dissolved in water or an organic solvent, and an organic paste (paste material such as methylcellulose) serving as a binder is added thereto at approximately several to 5% (which is a ratio to the total amount of the material and the AlN whiskers). Then, the solution is uniformly mixed by stirring and strained through a net-like filter to decrease the water content as much as possible. In this case as well, the fiber 221 is thickened with increase in the number of runs to strain the solution. Therefore, the desired thickness is achieved by adjusting the number of runs to strain the solution. The material is taken out of the filter, made into cloth, dried and then rewound in a roll form. The fiber 221 in which the AlN whiskers are mixed is used for purposes that require flame retardance and heat dissipation, for example, curtain materials, by bonding or intertwining fibers 221 by mechanical or scientific action and forming a nonwoven fabric.

Figure 90:
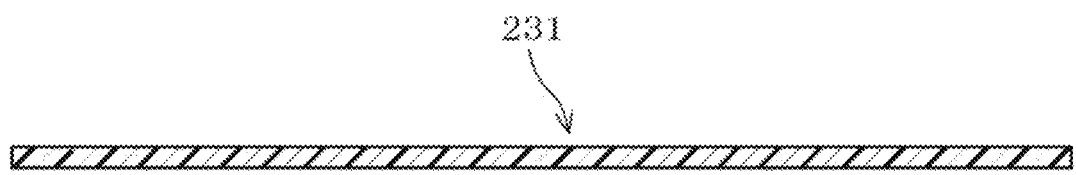
FIG. 90 is a diagram showing the cross section of thread.
Figure 91:
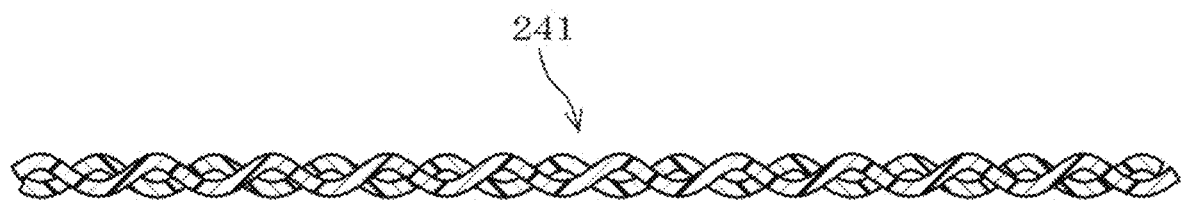
FIG. 91 is a diagram showing the cross section of twisted thread.

FIG. 90 shows another aspect in which the AlN whiskers are mixed in a fiber. Such a fiber is produced by steps given below. First, an organic material serving as a raw material for a fiber 231 is dissolved in an organic solvent. Then, the surface of the AlN whiskers is coated with a film that prevents reaction with water. Then, the AlN whiskers are added at approximately several to 50% (vol %) with respect to the amount of the organic material for the fiber 231 in the solution containing the organic material dissolved in an organic solvent, followed by spinning from the solution. In this way, the AlN whiskers are mixed in the organic material. Then, the fiber 231 obtained by spinning is dried and then rewound. The fiber 231 in which the AlN whiskers are mixed is used for purposes such as clothes having good thermal conduction by weaving spun thread into cloth. The fiber 231 can also be used in curtains, carpets, and the like to thereby produce flame retardance and thermal conductivity. Also, the fiber 231 is used in electric heater carpet materials. The resulting materials are excellent in insulation and thermal conductivity and can permit uniform heating, leading to saving in electricity cost. Alternatively, the fiber 231 may be used in gloves having thermal conductivity and heat resistance, or may be used in protective covers (tubes) for thermocouples because of exerting heat resistance, insulation and thermal conductivity when mixed with an inorganic fiber (alumina fiber, mullite fiber or silica fiber). As shown in FIG. 91, several fibers 241 may be bundled and twisted to form twisted thread, which can in turn be used in, for example, clothes having good thermal conductivity or rope or code having good dissipation of frictional heat.

The AlN whiskers can also be applied to the purpose of enhancing cooling effects. For example, cooling water (thermal conductivity of water: 0.569 W/mk at 0° C. and 0.685 W/mk at 100° C.) is used in the cooling of vehicle engines. AlN whiskers surface-treated to be waterproof can be added into cooling water to thereby enhance the thermal conductivity of the cooling water. In this case, the amount of the AlN whiskers added is preferably an amount that does not impair flowability, and is preferably, for example, 60% or smaller by volume. It is also preferred to add AlN whiskers having a diameter of approximately 0.1 to 1 μm and a length of approximately 0.5 to 100 μm so as not to separate the AlN whiskers from the water.

The addition of the AlN whiskers into a cooling solvent for organic materials is also effective. For example, the AlN whiskers can be added into a lubricating oil (thermal conductivity: 0.148 W/mk at 0° C. and 0.135 W/mk at 120° C.) to thereby enhance the thermal conductivity of the lubricating oil. In this case as well, the amount of the AlN whiskers added is preferably an amount that does not impair flowability, and is preferably, for example, 60% or smaller by volume. It is also preferred to add AlN whiskers having a diameter of approximately 0.1 to 1 μm and a length of approximately 0.5 to 100 μm so as not to separate the AlN whiskers from the lubricating oil. Also, the AlN whiskers may be added into silicone oil (thermal conductivity: 0.134 W/mk at 25° C.) or spindle oil (thermal conductivity: 0.144 W/mk at 20° C. and 0.138 W/mk at 120° C.).

The mixing of the AlN whiskers described above for the resin mixture or the fat and oil mixture is not limited to the mixing of only the AlN whiskers with no surface irregularities obtained by the present invention. The AlN whiskers with no surface irregularities and conventional AlN whiskers with surface irregularities may be used in combination for the mixing. A resin mixture containing 20 vol % of the AlN whiskers with no surface irregularities and 20 vol % of the AlN whiskers with surface irregularities was confirmed to produce better thermal conductivity than that of a resin mixture containing 40 vol % of the AlN whiskers with surface irregularities. Also, a resin mixture containing 20 vol % of the AlN whiskers with no surface irregularities, 10 vol % of the AlN whiskers with surface irregularities and 10 vol % of particulate AlN was confirmed to produce thermal conductivity nearly equal to that of the resin mixture containing 40 vol % of the AlN whiskers with surface irregularities. Furthermore, a resin mixture containing 30 vol % of the AlN whiskers with no surface irregularities and 10 vol % of particulate AlN was also confirmed to produce thermal conductivity nearly equal to that of the resin mixture containing 40 vol % of the AlN whiskers with surface irregularities.

As described above, according to the present embodiment, an element that satisfies the condition under which the element forms a compound with neither Al nor nitrogen gas or the condition under which the element forms a compound with any of Al and nitrogen gas provided that the standard free energy of formation of the compound is larger than that of AlN (the compound is thermodynamically more unstable than AlN) is used as the element that constitutes the composition with Al. As a result, the element that constitutes the composition with Al for the AlN whisker production is not limited to Si and Ti, and the AlN whiskers can be produced using an element other than Si and Ti. In the present embodiment, it was confirmed that AlN whiskers are produced by using Fe, Co, Cu, Ge or Sn as the element that constitutes the composition with Al. The AlN whiskers can also presumably be produced by using Li, Mg, V, Cr, Mn, Ga or Sr, which satisfies the condition (i).

The element used satisfies the condition under which the interaction energy with Al becomes negative and also satisfies the condition under which the absolute value of this interaction energy is larger than the interaction energy between Al and Ge. As a result, AlN whiskers having flat surface (surface with very few irregularities) in the axial direction can be produced. In the present embodiment, it was confirmed that the surface in the axial direction is flat by using Fe, Co or Cu as the element that constitutes the composition with Al. The surface in the axial direction is also presumably flat by using Cr or Sr, which satisfies the condition (ii).

In the case of mixing the AlN whiskers having no irregularities on the surface in the axial direction into a resin or into fat and oil, the AlN whiskers easily come in surface contact with each other without coming in point contact and can thus provide a resin mixture or a fat and oil mixture excellent in thermal conductivity and insulation. The resin mixture or the fat and oil mixture containing the AlN whiskers can be used in a portion that requires thermal conductivity and insulation in a product, for example, an electric wire, a light bulb, a motor, an electronic component, a sheet, paper or a fiber to thereby enhance the quality of the product.

The present invention is not intended to be limited by the embodiments described above and can be modified or expanded as mentioned below.

The present invention is not limited by the method for producing AlN whiskers and can also be applied to a method for producing a thin film or a bulk of AlN.

The present invention is not limited by the method for producing AlN whiskers by using a binary composition such as Al—Fe or Al—Cu and can also be applied to a method for producing AlN whiskers by using a ternary or higher-order composition, for example, an Al—Fe—Cu ternary composition.

The product obtained using the resin mixture containing the AlN crystals may be a product other than an electric wire, a light bulb, a motor, an electronic component, a sheet, paper and a fiber. Specifically, the resin mixture containing the AlN crystals can be applied to a portion that requires thermal conductivity and insulation and thereby applied to any product.

What is claimed is:

1. A method for producing AlN crystals, comprising:
using an alloy comprising Al and an element, excluding Si, that satisfies a condition under which the element forms a compound with neither Al nor N or a condition under which the element forms a compound with either of Al and N provided that the standard free energy of formation of the compound is larger than that of AlN;
melting the alloy;
introducing nitrogen gas to establish an atmosphere of nitrogen gas;
reacting the Al with the nitrogen gas at a predetermined temperature and at a predetermined pressure to produce AlN crystals, wherein the AlN crystals comprise AlN whiskers,
wherein a first interaction energy between Al and the element becomes negative, and an absolute value of the first interaction energy is larger than a second interaction energy between Al and Ge.

2. The method for producing AlN crystals according to claim 1, wherein the element is any of Li, Cr, Fe, Co, Ni, Cu, and Sr.

3. The method for producing AlN crystals according to claim 1, further comprising:
peeling the AlN whiskers from the alloy.

4. The method for producing AlN crystals according to claim 1, wherein:
reacting the Al with the nitrogen gas comprises reacting Al vapor with the nitrogen gas.

5. The method for producing AlN crystals according to claim 1, wherein:
the predetermined temperature is 1450-1800° C.

6. The method for producing AlN crystals according to claim 5, wherein:
the predetermined pressure is from several mm Hg to atmospheric pressure.

7. The method for producing AlN crystals according to claim 5, wherein:
the predetermined pressure is greater than atmospheric pressure.

8. A method for producing AlN crystals, comprising:
using an alloy consisting of Al and Fe, excluding Si;
melting the alloy;
introducing nitrogen gas to establish an atmosphere of nitrogen gas;
reacting the Al with nitrogen gas at a predetermined temperature and at a predetermined pressure to produce AlN crystals, wherein the AlN crystals comprise AlN whiskers,
wherein a first interaction energy between Al and Fe becomes negative, and
wherein an absolute value of the first interaction energy is larger than a second interaction energy between Al and Ge.

9. The method for producing AlN crystals according to claim 8, further comprising:
peeling the AlN whiskers from the alloy.

10. The method for producing AlN crystals according to claim 8, wherein:
the predetermined temperature is 1450-1800° C.

11. The method for producing AlN crystals according to claim 8, wherein:
the predetermined pressure is several mm Hg to atmospheric pressure.

12. The method for producing AlN crystals according to claim 8, wherein:
the predetermined pressure is greater than atmospheric pressure.

13. The method for producing AlN crystals according to claim 8, wherein:
a ratio of Al to Fe is from 10:90 to 30:70.

14. The method for producing AlN crystals according to claim 8, wherein:
the AlN whiskers have a diameter of about 0.1 to 1 μm and a length of about 10 to 50 μm.

15. The method for producing AlN crystals according to claim 8, wherein:
the AlN whiskers have a diameter of about 0.5 to 1.5 μm and a length of about 50 μm to 1 mm.

16. The method for producing AlN crystals according to claim 8, wherein:
the AlN whiskers have a diameter of about 1 to 2 μm and a length of greater than 1 mm.

* * * * *